(12) United States Patent
Inoue et al.

(10) Patent No.: US 8,853,666 B2
(45) Date of Patent: Oct. 7, 2014

(54) FIELD EFFECT TRANSISTOR, AND MULTILAYERED EPITAXIAL FILM FOR USE IN PREPARATION OF FIELD EFFECT TRANSISTOR

(75) Inventors: Takashi Inoue, Tokyo (JP); Tatsuo Nakayama, Tokyo (JP); Yuji Ando, Tokyo (JP); Yasuhiro Murase, Tokyo (JP); Kazuki Ota, Tokyo (JP); Hironobu Miyamoto, Tokyo (JP); Katsumi Yamanoguchi, Tokyo (JP); Naotaka Kuroda, Tokyo (JP); Akio Wakejima, Tokyo (JP); Yasuhiro Okamoto, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1464 days.

(21) Appl. No.: 12/159,599

(22) PCT Filed: Oct. 25, 2006

(86) PCT No.: PCT/JP2006/321275
§ 371 (c)(1),
(2), (4) Date: Jun. 27, 2008

(87) PCT Pub. No.: WO2007/077666
PCT Pub. Date: Jul. 12, 2007

(65) Prior Publication Data
US 2009/0045438 A1    Feb. 19, 2009

(30) Foreign Application Priority Data

Dec. 28, 2005   (JP) .................. 2005-380137
Apr. 25, 2006   (JP) .................. 2006-121042

(51) Int. Cl.
*H01L 29/06*   (2006.01)
*H01L 29/15*   (2006.01)
*H01L 29/778*  (2006.01)
*H01L 29/423*  (2006.01)
*H01L 29/20*   (2006.01)

(52) U.S. Cl.
CPC .......... *H01L 29/7787* (2013.01); *H01L 29/155* (2013.01); *H01L 29/2003* (2013.01); *H01L 29/7783* (2013.01); *H01L 29/42316* (2013.01)
USPC .............................................. 257/12; 257/27

(58) Field of Classification Search
USPC ..................................................... 257/12, 27
See application file for complete search history.

(56) References Cited

U.S. PATENT DOCUMENTS

2004/0119067 A1*   6/2004   Weeks et al. .............. 257/40

FOREIGN PATENT DOCUMENTS

| JP | 05-021471 | 1/1993 |
|---|---|---|
| JP | 09-064062 | 3/1997 |
| JP | 09-321061 | 12/1997 |
| JP | 10-223901 | 8/1998 |
| JP | 11-274474 | 10/1999 |
| JP | 2001-196575 | 7/2001 |
| JP | 2002-359255 | 12/2002 |
| JP | 2003-045899 | 2/2003 |
| JP | 2003-109973 | 4/2003 |
| JP | 2004-289005 | 10/2004 |
| JP | 2004-327882 | 11/2004 |
| JP | 2004-363563 | 12/2004 |
| JP | 2005-086102 | 3/2005 |
| JP | 2005-512327 | 4/2005 |
| JP | 2005-167275 | 6/2005 |
| WO | WO-03/049193 A1 | 6/2003 |

OTHER PUBLICATIONS

Endoh, A., Yamashita, Y., Ikeda, K., Higashiwaki, M., Hikosaka, K., Matsui, T., Hiyamizu, S. and Mimural, T. (2003), Fabrication of sub-50-nm-gate i-AlGaN/GaN HEMTs on sapphire. physica status solidi (c), 0: 2368-2371. doi: 10.1002/pssc.200303335.*

B. Moran, M. Hansen, M. D. Craven, J. S. Speck, S. P. DenBaars, Growth and characterization of graded AlGaN conducting buffer layers on n+ SiC substrates, Journal of Crystal Growth, vol. 221, Issues 1-4, Dec. 2000, pp. 301-304.*

Raghavan et al., Journal of Applied Physics, vol. 98, pp. 023515-1-023515-8 (2005).

Able et al., Journal of Crystal Growth, vol. 276, pp. 415-418 (2005).
Venugopal et al., Journal of Electronic Materials, vol. 32, pp. 371-374 (2003).
Kim et al., Applied Physics Letters, vol. 79, pp. 2713-2715 (2001).
Marchand et al., Journal of Applied Physics, vol. 89, pp. 7846-7851 (2001).
Krost et al., Heteroepitaxy of GaN on Si(111), International Conference on Semiconducting & Insulating Materials, IEEE, pp. 41-47 (Jun. 30, 2002-Jul. 5, 2002).
Wu et al., Journal of Crystal Growth, vol. 279, pp. 335-340 (2005).

* cited by examiner

*Primary Examiner* — Mark Tornow
(74) *Attorney, Agent, or Firm* — Dickstein Shapiro LLP

(57) ABSTRACT

In a group III nitride-type field effect transistor, the present invention reduces a leak current component by conduction of residual carriers in a buffer layer, and achieves improvement in a break-down voltage, and enhances a carrier confinement effect (carrier confinement) of a channel to improve pinch-off characteristics (to suppress a short channel effect). For example, when applying the present invention to a GaN-type field effect transistor, besides GaN of a channel layer, a composition-modulated (composition-gradient) AlGaN layer in which aluminum composition reduces toward a top gradually or stepwise is used as a buffer layer (hetero buffer). To gate length Lg of a FET to be prepared, a sum a of layer thicknesses of an electron supply layer and a channel layer is selected so as to fulfill $Lg/a \geq 5$, and in such a case, the layer thickness of the channel layer is selected in a range of not exceeding 5 times (about 500 Å) as long as a de Broglie wavelength of two-dimensional electron gas accumulated in the channel layer in room temperature.

21 Claims, 12 Drawing Sheets

FIELD EFFECT TRANSISTOR, AND MULTILAYERED EPITAXIAL FILM FOR USE IN PREPARATION OF FIELD EFFECT TRANSISTOR

TECHNICAL FIELD

The present invention relates to a GaN-type field effect transistor (FET), and in particular, to a high frequency GaN-type FET, and especially, to a GaN-type FET fit for millimeter wave band or for sub-millimeter wave band. In particular, the present invention relates to a heterojunction FET (HJFET) with use of two-dimensional electron gas being formed in so-called HEMT structure. Furthermore, the present invention relates to construction of a multilayered epitaxial film used for preparation of the GaN-type field effect transistor (FET).

BACKGROUND ART

In a GaN-type FET, and in particular, a high frequency GaN-type FET, and especially, a GaN-type FET fit for millimeter wave band or for submillimeter wave band, in order to achieve a high frequency performance, structure of an HJFET with use of two-dimensional electron gas is used widely. Specifically, construction that an AlGaN/GaN heterojunction is provided under a gate electrode and electrons supplied from the AlGaN which functions as an electron supply layer are stored at this heterojunction interface to form two-dimensional electron gas is generally adopted. In such a case, as substrate 1, a sapphire substrate, a SiC substrate, a Si substrate, and the like are used, an extremely thin nucleation layer, which functions as a growth nucleus of epitaxial growth, is formed on its surface, and a GaN-type epitaxial layer is grown on this nucleation layer. Conventionally, an AlN nucleation layer is selected as a nucleation layer, a GaN layer is subsequently formed as a buffer layer, and also a GaN layer is continuously grown up as a channel layer. By growing up AlGaN electron supply layer 5 on a surface of GaN layer 4 that is continuously formed as the buffer layer and channel layer, band gap difference $\Delta E_c$ in a conduction band therebetween is use to achieve confinement of two-dimensional electron gas at a heterojunction interface between the GaN layer of the channel layer and AlGaN electron supply layer 5. FIG. 4 illustrates the construction of a multilayered epitaxial film for preparation of an AlGaN/GaN HJFET in which a GaN layer is adopted as this buffer layer and a GaN layer of the channel layer is continuously formed by epitaxial growth, and, FIG. 5 illustrates an example of device structure of the AlGaN/GaN HJFET prepared using a multilayered epitaxial film with said construction.

DISCLOSURE OF THE INVENTION

Problems to be Solved by the Invention

However, in the structure of HJFET that is illustrated in FIG. 5, which is prepared using the multilayered epitaxial film with such a construction employing a GaN layer as a buffer layer as shown in FIG. 4, since the GaN layer itself used for the buffer layer is originally an n⁻-GaN layer whose residual carrier concentration is such a level of n=$10^{15}$ to $10^{16}$ cm$^{-3}$ and its film thickness is set about 1000 nm, it has the following problems.

In order to apply the GaN-type HJFET with the structure illustrated in FIG. 5 to a FET for submillimeter wave or millimeter wave band particularly, it is necessary to perform miniaturization of a gate, that is, further shortening gate length Lg. Although a short channel effect arises in connection with this shortening of gate length Lg, in the AlGaAs/GaAs-type HJFET, the short channel effect has been suppressed effectively by taking a measure of setting aspect ratio Lg/a of gate length Lg to active layer thickness (a gate-to-channel distance: here, a distance from a gate electrode to a bottom face of a channel layer) a at 10 or more, in the past. As for the GaN-type HJFET with such construction as illustrated in FIG. 5, in the case of setting the gate length Lg in such size which is adapted for a FET used in millimeter wave or sub-millimeter wave band, an extent of an effect on reducing the short channel effect, which is attained by the approach of setting aspect ratio Lg/a of gate length Lg to active layer thickness (gate-to-channel distance) a at 10 or more, is extremely small.

When a band diagram under a gate electrode is schematically illustrated regarding the GaN-type HJFET with the construction illustrated in FIG. 5, it shows such a shape as illustrated in FIG. 6. Attention is centered on GaN layer 4 used as the buffer layer/channel layer thereof, which is formed on AlN nucleation layer 2 that is formed on substrate 1. As AlN nucleation layer 2 is an insulating layer, Fermi level $E_f$ is located in a center of its band gap at an interface between AlN nucleation layer 2 and GaN used for the buffer layer. A position of a conduction band edge of GaN for the buffer layer relative to Fermi level $E_f$ is determined by a difference $\Delta E_c$ (AlN/GaN) between conduction band energies $E_c$ of AlN and GaN at this interface. On the other hand, a Schottky junction is formed at an interface between AlGaN electron supply layer 5 and gate electrode 8, and a level of a conduction band edge of AlGaN electron supply layer 5 relative to Fermi level $E_f$ is determined in a height of the Schottky junction. AlGaN electron supply layer 5 supplies electrons and is depleted, and therefore, at the interface between AlGaN electron supply layer 5 and GaN of the channel layer, a position of the conduction band edge of AlGaN electron supply layer 5 relative to Fermi level $E_f$ is determined by a thickness of this AlGaN electron supply layer 5, and an amount of fixed electric charges generated by depletion.

In such a case when whole AlGaN electron supply layer 5 is depleted, as shown in FIG. 6, at the interface between AlGaN electron supply layer 5 and GaN of the channel layer, a position of the conduction band edge of AlGaN electron supply layer 5 to Fermi level $E_f$ becomes higher a little than the Fermi level $E_f$. When taking account of state density $N_C$ of the conduction band in AlGaN electron supply layer 5, residual donor density $N_D$ which generate residual carriers and so on, at the interface between AlGaN electron supply layer 5 and GaN of the channel layer, a position of the conduction band edge of AlGaN electron supply layer 5 positions at a higher level by, for example, about 3 kT (k denotes a Boltzmann's constant and T denotes about 300K of temperature) than the Fermi level $E_f$. On the other hand, at the interface, a position of a conduction band edge of a channel layer GaN is pinned at a level which is lower than the position of the conduction band edge of AlGaN electron supply layer 5, by energy being corresponding to a difference $\Delta E_c$ (AlGaN/GaN) between conduction band energies $E_c$ of AlGaN and GaN. Hence, since the position of the conduction band edge of the channel layer GaN is set greatly lower than Fermi level $E_f$ at this interface, electrons are locally accumulated in a high concentration to composes two-dimensional electron gas thereof. In addition, the elecreons of two-dimensional electron gas to be accumulated at this interface are supplied from AlGaN electron supply layer 5, which includes contribution of electrons supplied from a shallow donor level which exists in AlGaN electron supply layer 5, and contribution by polarized charges of the AlGaN itself.

That is, at the interface between AlN nucleation layer 2 and the GaN for a buffer layer, the position of the conduction band edge of the GaN used for the buffer layer is set high by $\{½×E_g(AlN)−ΔE_c(AlN/GaN)\}$ in comparison with Fermi level $E_f$. On the other hand, at the interface between AlGaN electron supply layer 5 and the GaN used for the channel layer, the position of the conduction band edge of the GaN for the channel layer is set at a low position by approximately $\{ΔE_c(AlGaN/GaN)−3\ kT\}$ (k denotes a Boltzmann's constant and T denotes about 300K of temperature) relative to Fermi level $E_f$. On the other hand, when the GaN layer is an $n^−$-GaN layer whose residual carrier concentration is at such level of $n=10^{15}$ to $10^{16}$ cm$^{-3}$ or so, the position of the conduction band edge of the GaN layer is at a higher position by about 3 kT (k denotes a Boltzmann's constant and T denotes about 300K of temperature) than Fermi level $E_f$. That is, when the GaN layer itself used for the buffer layer is originally an $n^−$-GaN layer whose residual carrier concentration is as low as $n=10^{15}$ to $10^{16}$ cm$^{-3}$ or so and its film thickness is also as thin as about 1000 nm, near the interface between AlN nucleation layer 2 and the GaN for the buffer layer, the position of the conduction band edge of the GaN for the buffer layer composes such band structure, in which its position is lowered in the concave form relative to Fermi level $E_f$. In contrast, near the interface between AlGaN electron supply layer 5 and the GaN used for the channel layer, the position of the conduction band edge of the GaN for the channel layer rises rapidly in a convex form, and intersects Fermi level $E_f$. The two-dimensional electron gas formed at the interface between AlGaN electron supply layer 5 and the GaN for the channel layer is kept in a state of being confined within a narrow region until the position of the conduction band edge of the GaN used for the channel layer intersecting Fermi level $E_f$. However, since the GaN layer itself used for the buffer layer is originally an $n^−$-GaN layer whose residual carrier concentration is as low as $n=10^{15}$ to $10^{16}$ cm$^{-3}$ or so and its film thickness is also as thin as about 1000 nm, the position of the conduction band edge of the GaN used for the buffer layer is held in a state of being high by only about 3 kT (k denotes a Boltzmann's constant and T denotes about 300K of temperature) from Fermi level $E_f$ in a region close to the GaN for the channel layer. That is, in the region close to the GaN for the channel layer, since the position of the conduction band edge of the GaN used for the buffer layer is close to Fermi level $E_f$, electrons can be easily injected into the GaN used for the buffer layer. Electrons injected into this GaN used for the buffer layer will be a factor causing the lowering of breakdown voltage and failure of pinch-off. In particular, in the GaN-type HJFET with the construction illustrated in FIG. 5, when gate length Lg is shortened so as to be adapted for a FET used in millimeter wave or submillimeter wave band, it is considered to become, for instance, a factor which causes such a device performance degradation that is exemplified in FIG. 7, which results from the short channel effect.

As the buffer layer, when AlGaN with a low aluminum content ratio is employed instead of GaN, usually, this AlGaN with a low aluminum content ratio itself is an $n^−$ layer where a residual carrier concentration is as low as $n=10^{14}$ to $10^{15}$ cm$^{-3}$ or so. In addition, when the whole buffer layer is formed of such $n^−$-type AlGaN with a low aluminum content ratio, its band structure becomes what is obtained by shifting the band structure in the case of employing the GaN buffer layer as exemplified in FIG. 4 by energy corresponding to a difference $ΔE_c$ (AlGaN/GaN) between conduction band energies $E_c$ of the AlGaN and GaN. Hence, in the case that the difference $ΔE_c$ (AlGaN/GaN) between the conduction band energies $E_c$ of the AlGaN and GaN does not exceed 2 kT (k denotes a Boltzmann's constant and T denotes about 300K of temperature), an influence that electrons are injected from the GaN of the channel layer to the AlGaN of the buffer layer with exceeding this slight step cannot be fully excluded.

The present invention is to solve the above-mentioned problems, and objects of the present invention are to provide structure of an HJFET which can avoid device performance degradation caused by a short channel effect in the case of shortening gate length Lg that is fit to a FET for millimeter wave or submillimeter wave band, so as to suppress effectively an influence of electron injection from the channel layer to the buffer layer, and a multilayered epitaxial film used for preparation of the HJFET. In particular, in an AlGaN/GaN/-type HJFET or an AlGaInN/GaInN-type HJFET, the object is to provide structure of an HJFET which can avoid device performance degradation caused by a short channel effect in the case of shortening gate length Lg that is fit to a FET for millimeter wave or submillimeter wave band, so as to suppress effectively an influence of electron injection from the channel layer to the buffer layer, and a multilayered epitaxial film used for preparation of the HJFET.

Means for Solving the Problems

First of all, the inventors of the present invention analyzed technical features of conventional methods which can suppress electron injection from GaN of the channel layer to AlGaN of the buffer layer, and can achieve a carrier (electron) confinement effect into the GaN channel layer in the case where the AlGaN is employed as the buffer layer, as mentioned above.

In the case when a group III nitride semiconductor containing Al is provided on a substrate as an underlying layer of the channel layer (electron travelling layer) and the GaN channel layer and the AlGaN electron supply layer are formed on its upper face, such a structure that the composition of the underlying layer changes continuously or step-wise from a substrate side to the GaN channel layer are proposed as means of suppressing a phenomenon that a distortion stress is accumulated in the underlying layer formed on the above-mentioned substrate, and thereby a crack generates (see JP 2004-289005 A, JP 2002-359255 A, JP 2003-45899 A, JP 2004-327882 A, JP 2005-167275 A, and the like). For example, it is suggested that it is possible to achieve an effect of suppressing crack generation in the underlying layer by using such a structure in which nitriding treatment is carried out on a surface of a sapphire substrate to form a surface nitrided layer thereon, and thereafter, the composition of the underlying layer is set AlN at a substrate side and $Al_{0.5}Ga_{0.5}N$ at a GaN channel layer side. Specifically, since there is a difference between a lattice constant of the sapphire substrate, and a lattice constant of the AlN, a tensile stress due to this lattice mismatching is applied to the AlN layer with a short lattice constant, and hence, as a film thickness of the AlN layer increases, crack generation is induced. When its composition is changed to increase the lattice constant while the film thickness increases, an increase in the tensile stress is suppressed as the whole underlying layer; whereby, an effect of avoiding the stress reaching a threshold value which causes the crack generation is obtained. When forming the whole underlying layer with AlN, a barrier corresponding to a difference $ΔE_c$(AlN/GaN) between both conduction band edge energies thereof is generated at the interface between the GaN channel layer and AlN underlying layer; but, on the other hand, when the composition of the underlying layer is changed so as to be $Al_{0.5}Ga_{0.5}N$ at the GaN channel layer side, a barrier corresponding to a difference $\Delta E_c(Al_{0.5}Ga_{0.5}N/GaN)$ between both conduction band edge energies thereof is generated at the interface between the GaN channel layer and underlying layer. It is also suggested that, as $\Delta E_c(AlN/GaN) > \Delta E_c(Al_{0.5}Ga_{0.5}N/GaN)$, the barrier height at the interface is reduced, but it is possible to obtain enough the carrier (electron) confinement effect into the GaN channel layer also in the case of the barrier height of $\Delta E_c(Al_{0.5}Ga_{0.5}N/GaN)$. It is suggested that, also when the composition of the underlying layer is set AlN at the substrate side and $Al_{0.5}Ga_{0.5}N$ at the GaN channel layer side instead of the AlN underlying layer, an effect to enhancement in sheet carrier density in the GaN channel layer will be no inferiority.

In the above-described method, at the step of forming the AlN underlying layer on the sapphire substrate, a very thin film thickness of surface nitrided layer or a low-temperature growth AlN layer is provided on the sapphire substrate surface, and hence, distortion stresses, resulting from lattice mismatching, is concentrated in the very thin film thickness of layer provided at the interface to generate misfit dislocations in a high density therein, which relieve a considerable part of the tensile stress applied to the AlN underlying layer. However, the AlN epitaxial film which contacts this interface is still left in such a state that the lattice constant in an inplane direction is widened by the residual tensile stress. In addition, when successively growing the AlN epitaxial film thereon, such a state that the lattice constant in the inplane direction is widen is also maintained, and, as a whole, the tensile stress is further accumulated as the film thickness increases. On the other hand, when the composition is gradually changed from AlN to $Al_{0.5}Ga_{0.5}N$ in the epitaxial film which is grown succeedingly, since a lattice constant of the AlGaN itself in an inplane direction is larger than the lattice constant of the AlN in the inplane direction, the increase in the tensile stress to be accumulated therein with the increase in the film thickness is reduced as a result. It is also suggested that this effect becomes more remarkable when the composition change to the $Al_{0.5}Ga_{0.5}N$ from the AlN is made at comparatively high rate, and it is preferable to select, for example, a ratio (reduction percentage) that a variation $\Delta Al$ of Al composition per 0.05 μm of increase $\Delta t$ of film thickness t is −0.05, i.e. such a large rate of composition change as $\Delta Al/\Delta t = -1$ $(\mu m^{-1})$.

That is, the method mentioned above is effective in suppression of crack generation, which is generated when selecting the sapphire substrate, which has a lattice constant significantly larger than the lattice constant of AlN, as a substrate, in the case that AlN that can be originally insulated is used as the buffer layer; however, the method does not by any means have a function for improving degradation of crystalline property which is essentially caused by lattice mismatching, for example, in the case when a substrate which has a lattice constant smaller than the lattice constant of the AlN, or a substrate which has an almost equal lattice constant (for instance, a SiC substrate or the like) is used.

On the other hand, the present inventors found that the following technical features were exerted when gradually reducing Al composition of AlGaN, which constructs an AlGaN buffer layer, from a substrate side to a GaN channel layer when using a substrate which has a lattice constant smaller than or almost equal to the lattice constant of AlN:

Effectiveness of suppressing an influence that electrons are injected from GaN used as the channel layer to AlGaN used as the buffer layer This suppressing effect is remarkable when comparatively thickening a film thickness of the AlGaN buffer layer, and in particular, even if it is a case that Al composition of the AlGaN at an interface between the GaN channel layer and the AlGaN buffer layer is set as low as 0.05, a carrier (electron) confinement effect into the GaN channel layer is obtained enough, and the present inventors revealed the characteristic principle of operation thereof. The present inventors came to complete the present invention on the basis of the above-mentioned findings.

That is, as means of solving the above-mentioned problems, the present invention employs a buffer layer which is made up of semiconductor alloy material which is given "composition modulation", forms a heterojunction which comprises an electron supply layer/a channel layer on the buffer layer, and constructs a heterojunction FET using two-dimensional electron gas, as explained below. In particular, as construction of a multilayered epitaxial film which is used for preparation of the heterojunction FET using two-dimensional electron gas according to the present invention, for example, also when using a substrate which has a lattice constant smaller than the lattice constant of AlN, the carrier (electron) confinement effect into the channel layer is improved by an principle of operation, which is completely different from those of the conventional methods mentioned above, by selecting such construction that employs the buffer layer which is made up of semiconductor alloy material which is given "composition modulation", and forms a heterojunction which comprises the electron supply layer/channel layer on the buffer layer.

That is, the multilayered epitaxial film according to the present invention is a multilayered epitaxial film epitaxial grown on a substrate, which is usable in fabrication of a field-effect transistor, characterized in that the multilayered epitaxial film is formed out of compound semiconductors which exhibit spontaneous polarization and piezo polarization effects, or semiconductor alloys thereof, and comprises layered structure in which a heterojunction which is made up of an electron supply layer/a channel layer is formed on a buffer layer;

the buffer layer comprises a region made up of a semiconductor material whose composition monotonically changes along a direction from a substrate surface to the channel layer, wherein the composition of the semiconductor material is selected so that energy of a conduction band edge of the semiconductor material in the region reduces monotonically;

composition of the semiconductor material in the region is selected so that energy of the conduction band edge of the semiconductor material in the region is higher in comparison with the energy of the conduction band edge of the semiconductor material which makes up of the channel layer at an interface between the region and the channel layer; and the energy of the conduction band edge in the region exhibits a shape convex toward a side where electronic energy is higher, along a direction from the substrate surface to the channel layer.

In such a case, it is preferable to adopt such structure that the multilayered epitaxial film is formed of group III nitride-type compound semiconductors or semiconductor alloys thereof, the channel layer is formed of GaN, InGaN, or $(In_vAl_{1-v})_wGa_{1-w}N$ (where, $1 \geq v \geq 0$ and $1 \geq w \geq 0$), the electron supply layer is formed of AlGaN, InAlN, or $In_yAl_xGa_{1-x-y}N$ (where, x and y are 0 or positive values, and $1 \geq x+y \geq 0$), the buffer layer is formed of AlGaN, InAlN, or $In_yAl_xGa_{1-x-y}N$ (where, x and y are 0 or positive values, and $1 \geq x+y \geq 0$), and a composition change of semiconductor material in the region is set such that Al composition is monotonically reduced or In composition is monotonically increased along a direction from the substrate surface to the channel layer.

Furthermore, the multilayered epitaxial film can be constructed in such a form that the film comprises a barrier layer between the channel layer and the buffer layer, wherein the barrier layer is formed of InAlGaN, or $(In_vAl_{1-v})_wGa_{1-w}N$ (where, $1 \geq v \geq 0$ and $1 \geq w \geq 0$), and energy of a conduction band edge of the group III nitride-type semiconductor material which forms the barrier layer is higher than energy of a conduction band edge of the III group nitride-type semiconductor material which forms the channel layer in contact with the barrier layer, and higher than energy of a conduction band edge of the group III nitride-type semiconductor material which forms the buffer layer at an interface between the buffer layer and the barrier layer.

For example, it is preferable that the buffer layer is formed of $Al_xGa_{1-x}N$ (where, x is $1 \geq x \geq 0$), and Al composition x is monotonically reduced along a direction from the substrate surface to the channel layer, and a rate of change: $|\partial x(z)/\partial z|$ of the Al composition x in a direction from the substrate surface to the channel layer (Z direction) is selected within a range of $0.30 \, \mu m^{-1} \geq |\partial x(z)/\partial z| \, 0.05 \, \mu m^{-1}$.

In addition, in the multilayered epitaxial film according to the present invention, It is desirable to have such a form in which a composition change of the semiconductor material in the region is formed in such a shape that the composition changes continuously or changes step-wise.

In the multilayered epitaxial film according to the present invention mentioned above, it is desirable to fulfill such a condition that a total amount of positive space charges generated in the electron supply layer is equal to or more than a total amount of negative space charges generated in the buffer layer and at an interface between the buffer layer and the channel layer.

On the other hand, a field-effect transistor according to the present invention is a field-effect transistor fabricated using a multilayered epitaxial film epitaxial grown on a substrate, characterized in that the multilayered epitaxial film is formed out of compound semiconductors which exhibit spontaneous polarization and piezo polarization effects, or semiconductor alloys thereof, and comprises layered structure in which a heterojunction which is made up of an electron supply layer/a channel layer is formed on a buffer layer;

the buffer layer comprises a region made up of a semiconductor material whose composition monotonically changes along a direction from a substrate surface to the channel layer, wherein the composition of the semiconductor material is selected so that energy of a conduction band edge of the semiconductor material in the region reduces monotonically;

composition of the semiconductor material in the region is selected so that energy of the conduction band edge of the semiconductor material in the region is higher in comparison with the energy of the conduction band edge of the semiconductor material which makes up of the channel layer at an interface between the region and the channel layer; and the energy of the conduction band edge in the region exhibits a shape convex toward a side where electronic energy is higher, along a direction from the substrate surface to the channel layer.

In such a case, it is preferable to select such structure that a gate electrode is provided on the electron supply layer, and an aspect ratio Lg/a of an active layer thickness a, which is defined as a total of a film thickness of the electron supply layer and a film thickness of the channel layer under the gate electrode, to a gate length Lg fulfills Lg/a≥5. In particular, in the field-effect transistor according to the present invention, it is preferable to have such construction that the multilayered epitaxial film is formed out of group III nitride-type compound semiconductors or semiconductor alloys thereof, the channel layer is formed of GaN, InGaN, or $(In_vAl_{1-v})_wGa_{1-w}N$ (where, $1 \geq v \geq 0$ and $1 \geq w \geq 0$), the electron supply layer is formed of AlGaN, InAlN, or $In_yAl_xGa_{1-x-y}N$ (where, x and y are 0 or positive values, and $1 \geq x+y \geq 0$), the buffer layer is formed of AlGaN, InAlN, or $In_yAl_xGa_{1-x-y}N$ (where, x and y are 0 or positive values, and $1 \geq x+y \geq 0$), and a composition change of semiconductor material in the region is set such that Al composition is monotonically reduced or In composition is monotonically increased along a direction from the substrate surface to the channel layer.

Furthermore, it is desirable to be constructed so that the multilayered epitaxial film comprises a barrier layer between the channel layer and the buffer layer, wherein the barrier layer is formed of InAlGaN, or $(In_vAl_{1-v})_wGa_{1-w}N$ (where, $1 \geq v \geq 0$ and $1 \geq w \geq 0$), and energy of a conduction band edge of the group III nitride-type semiconductor material which forms the barrier layer is higher than energy of a conduction band edge of the III group nitride-type semiconductor material which forms the channel layer in contact with the barrier layer, and higher than energy of a conduction band edge of the group III nitride-type semiconductor material which forms the buffer layer at an interface between the buffer layer and the barrier layer.

For example, it is further preferable that the buffer layer is formed of $Al_xGa_{1-x}N$ (where, x is $1 \geq x \geq 0$), and its Al composition x is monotonically reduced along a direction from the substrate surface to the channel layer, and a rate of change: $|\partial x(z)/\partial z|$ of the Al composition x in a direction from the substrate surface to the channel layer (Z direction) is selected within a range of $0.30 \, \mu m^{-1} \geq |\partial x(z)/\partial z| \geq 0.05 \, \mu m^{-1}$.

Effect of invention

In the structure of HJFET according to the present invention, electron injection from a channel layer to a buffer layer is suppressed effectively, and hence, when the gate length Lg is shortened as to be fitted to a FET adapted for submillimeter wave or millimeter wave band, degradation of device performance which is caused by a short channel effect is avoided. In addition, factors leading to a break-down voltage defect and a pinch-off defect are also excluded therein, and thus, the structure of HJFET according to the present invention also achieves large improvement in comparison with conventional structure regarding a gain obtained in high frequency operation (RF gain) as well as a gain obtained in DC operation (DC gain) in the case of high voltage operation where bias $V_D$ which is applied between a source and a drain is set high. Furthermore, the structure of the multilayered epitaxial film according to the present invention is set in such a c instruction designed to be suitable for preparation of the above-mentioned HJFET according to the present invention.

BEST MODE FOR CARRYING OUT THE INVENTION

Figure 1:
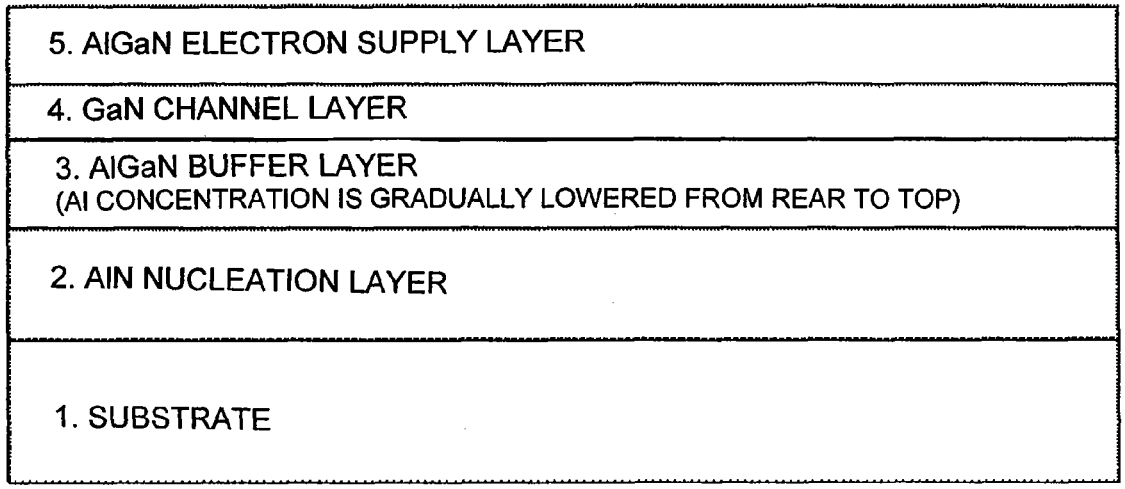
FIG. 1 is a sectional view illustrating schematically an example of structure of a multilayered epitaxial film according to the first exemplary embodiment of the present invention.

Preferable embodiments of the present invention will be described below.

First, the multilayered epitaxial film according to the preferable embodiment of the present invention is a multilayered epitaxial film epitaxial grown on a substrate, which is usable in fabrication of a field-effect transistor, characterized in that the multilayered epitaxial film is formed out of compound semiconductors which exhibit spontaneous polarization and piezo polarization effects, or semiconductor alloys thereof;

the spontaneous polarization and piezo polarization effects exhibited in the compound semiconductors or the semiconductor alloy thereof continuously changes in magnitude with composition change of the semiconductor material;

the multilayered epitaxial film comprises layered structure in which a heterojunction which is made up of an electron supply layer/a channel layer is formed on a buffer layer, and electrons are accumulated two-dimensionally at a heterojunction interface of the electron supply layer/channel layer;

the buffer layer is made up of semiconductor material whose composition monotonically changes from a substrate surface along a direction from the substrate surface to the channel layer;

in the semiconductor material whose composition monotonically changes, which forms the buffer layer, the composition change is set such that it changes continuously or changes step-wise by fine film thickness steps;

in the semiconductor material whose composition monotonically changes, which forms the buffer layer, its composition at an interface between the buffer layer and the channel layer is selected so that energy of a conduction band edge of the semiconductor material having said composition is higher in comparison with energy of a conduction band edge of the semiconductor material which forms the channel layer;

in the semiconductor material whose composition monotonically changes, which forms the buffer layer, its composition change along a direction from the substrate surface to the channel layer is selected so that energy of a conduction band edge of the semiconductor material whose composition monotonically changes is monotonically reduced along a direction from the substrate surface to the channel layer;

as a result of the selected composition change along the direction from the substrate surface to the channel layer, polarization obtained by totaling spontaneous polarization and piezo polarization exhibited in the semiconductor material whose composition monotonically changes, which forms the buffer layer, monotonically changes along a direction from the substrate surface to the channel layer, and the resulted change of the polarization causes negative polarized charges to be generated in the semiconductor material whose composition monotonically changes, which forms the buffer layer;

as a result of the generated negative polarized charges, in the semiconductor material whose composition monotonically changes, which forms the buffer layer, energy of a conduction band edge of such region monotonically reduces while exhibiting a shape convex toward a side where electronic energy is higher, along a direction from the substrate surface to the channel layer; and a film thickness of the channel layer is selected to be five or less times of a de Broglie wavelength of electrons accumulated two-dimensionally in the channel layer.

In such a case, when such a structure fit to the operation in a depletion mode (normally on) is selected for the field-effect transistor to be fabricated, it is preferable to adopt such a structure in which said buffer layer is formed on a nucleation layer that is formed on the above-mentioned substrate surface, and in the field-effect transistor fabricated therewith, at least a total amount of "positive" space charges, which are generated in the electron supply layer, directly under a gate electrode is set to be equal to or more than a total amount of "negative" space charges which are generated in the buffer layer, at the interface between the buffer layer and channel layer, and at an interface between said buffer layer and the nucleation layer.

In addition, in the multilayered epitaxial film according to the preferable embodiment of the present invention, it is desirable to select such construction in which residual carriers of the semiconductor material whose composition monotonically changes, which constructs said buffer layer, are electrons, and density of negative polarized charges which are generated in the semiconductor material which constructs said buffer layer is set at such density higher than density of the ionized impurity levels from which the residual carriers generate in the semiconductor material whose composition monotonically changes, which constructs said buffer layer.

One of more preferable embodiments as for the multilayered epitaxial film according to the above-mentioned preferable embodiment of the present invention is such an exemplary embodiment wherein the compound semiconductors which exhibit spontaneous polarization and piezo polarization effects, or semiconductor alloys thereof, which is used to form the multilayered epitaxial film, are group III nitride-type compound semiconductors or semiconductor alloys thereof. In the multilayered epitaxial film according to the first mode of more preferable exemplary embodiments of the present invention, selected is such a structure in which the compound semiconductors which exhibit spontaneous polarization and piezo polarization effects, or semiconductor alloys thereof, which are used to form the multilayered epitaxial film, are group III nitride-type compound semiconductors or semiconductor alloys thereof;

in the multilayered epitaxial film, as to the heterojunction which is made up of the electron supply layer/a channel layer, the channel layer is formed of GaN, InGaN, or a group III nitride-type semiconductor material expressed in $(In_v Al_{1-v})_w Ga_{1-w}N$ (where, $1 \geq v \geq 0$ and $1 \geq w \geq 0$), and the electron supply layer is made up of AlGaN, an InAlN layer, or a group III nitride-type semiconductor material expressed as $In_y Al_x Ga_{1-x-y}N$ (where, x and y are 0 or positive values, and are $1 \geq x+y \geq 0$), and is selected so that energy of a conduction band edge of the group III nitride-type semiconductor material which forms the electron supply layer is higher than energy of a conduction band edge of the group III nitride-type semiconductor material which forms the channel layer, at an interface between the buffer layer and the channel layer, to form the heterojunction which has an energy barrier resulting from difference in the energy of the conduction band edge at the interface;

the buffer layer is formed of AlGaN, InAlN, or a group III nitride-type semiconductor material expressed as $In_y Al_x Ga_{1-x-y}N$ (where, x and y are 0 or positive values, and $1 \geq x+y \geq 0$), and, at an interface between the buffer layer and the channel layer, composition of the group III nitride-type semiconductor material which forms the buffer layer is selected so that energy of a conduction band edge of the group III nitride-type semiconductor material of the composition is higher than energy of a conduction band edge of the group III nitride-type semiconductor material which forms the channel layer, to form a heterojunction which has an energy barrier resulting from difference in the energy of the conduction band edge at the interface; and in the group III nitride-type semiconductor material whose composition monotonically changes, which forms the buffer layer, its composition change along a direction from the substrate surface to the channel layer is provided by any of a composition change of Al composition being monotonically reduced along the direction from the substrate surface to the channel layer, and a composition change of In composition being monotonically increased along the direction from the substrate surface to the channel layer.

In such a case, in the multilayered epitaxial film according to a first embodiment of the present invention, it is desirable to select such construction in which residual carriers of the semiconductor material whose composition monotonically changes, which constructs said buffer layer, are electrons, and density of negative polarized charges which are generated in the semiconductor material which constructs said buffer layer is set at such density higher than density of the ionized impurity levels from which the residual carriers generate in the semiconductor material whose composition monotonically changes, which constructs said buffer layer.

In the multilayered epitaxial film according to the first mode of the mod of the more preferable embodiment of the present invention, it is preferable that, for example, the group III nitride-type semiconductor material whose composition monotonically changes, which forms the buffer layer, is formed of a group III nitride-type semiconductor material expressed as $Al_x Ga_{1-x}N$ (where, x is $1 \geq x \geq 0$);

the composition change along the direction from the substrate surface to the channel layer exhibited in the group III nitride-type semiconductor material, whose composition monotonically changes, is provided by a composition change of Al composition x being monotonically reduced along the direction from the substrate surface to the channel layer, and a rate of change: $|\partial x(z)/\partial z|$ of the Al composition x in a direction from the substrate surface to the channel layer (Z direction) is selected within a range of $0.30 \ \mu m^{-1} \geq |\partial x(z)/\partial z| \geq 0.05 \ \mu m^{-1}$.

In addition, another one of more preferable embodiments as for the multilayered epitaxial film according to the preferable embodiment of the present invention is such an exemplary embodiment wherein the compound semiconductors which exhibit spontaneous polarization and piezo polarization effects, or semiconductor alloys thereof, which is used to form said multilayered epitaxial film, are group III nitride-type compound semiconductors or semiconductor alloys thereof. In the multilayered epitaxial film according to the second mode of more preferable embodiments of the present invention, selected is such a structure in which the compound semiconductors which exhibit spontaneous polarization and piezo polarization effects, or semiconductor alloys thereof, which are used to form said multilayered epitaxial film, are group III nitride-type compound semiconductors or semiconductor alloys thereof;

the multilayered epitaxial film comprises layered structure in which a heterojunction, which is made up of an electron supply layer/a channel layer, is formed on the buffer layer with a barrier layer intervening therebeween, and electrons are accumulated two-dimensionally at the heterojunction interface of the electron supply layer/channel layer;

in the multilayered epitaxial film, as to the heterojunction which is made up of the electron supply layer/channel layer, the channel layer is formed of GaN, InGaN, or a group III nitride-type semiconductor material expressed in $(In_vAl_{1-v})_wGa_{1-w}N$ (where, $1 \geq v \geq 0$ and $1 \geq w \geq 0$), and the electron supply layer is made up of AlGaN, an InAlN layer, or a group III nitride-type semiconductor material expressed as $In_yAl_xGa_{1-x-y}N$ (where, x and y are 0 or positive values, and are $1 \geq x+y \geq 0$), and is selected so that energy of a conduction band edge of the group III nitride-type semiconductor material which forms the electron supply layer is higher than energy of a conduction band edge of the group III nitride-type semiconductor material which forms the channel layer, at an interface between the buffer layer and the channel layer, to form the heterojunction which has an energy barrier resulting from difference in the energy of the conduction band edge at the interface;

the barrier layer intervenes between the channel layer and buffer layer, and is formed of InAlGaN, or a group III nitride-type semiconductor material expressed by $(In_vAl_{1-v})_wGa_{1-w}N$ (where, $1 \geq v \geq 0$ and $1 \geq w \geq 0$), and is selected so that energy of a conduction band edge of the group III nitride-type semiconductor material which forms the barrier layer is higher than energy of a conduction band edge of the group III nitride-type semiconductor material which forms the channel layer in contact with the barrier layer, and energy of a conduction band edge of the group III nitride-type semiconductor material which forms the barrier layer is higher than energy of a conduction band edge of the group III nitride-type semiconductor material which forms the buffer layer at an interface between the buffer layer and the barrier layer, to form a heterojunction which has an energy barrier resulting from difference in the energy of the conduction band edge at the interface;

the buffer layer is formed of AlGaN, InAlN, or a group III nitride-type semiconductor material expressed as $In_yAl_xGa_{1-x-y}N$ (where, x and y are 0 or positive values, and $1 \geq x+y \geq 0$), and, at an interface between the buffer layer and the channel layer, composition of the group III nitride-type semiconductor material which forms the buffer layer is selected so that energy of a conduction band edge of the group III nitride-type semiconductor material of the composition is higher than energy of a conduction band edge of the group III nitride-type semiconductor material which forms the channel layer; and in the group III nitride-type semiconductor material whose composition monotonically changes, which forms the buffer layer, its composition change along a direction from the substrate surface to the channel layer is provided by any of a composition change of Al composition being monotonically reduced along the direction from the substrate surface to the channel layer, and a composition change of In composition being monotonically increased along the direction from the substrate surface to the channel layer.

In such a case, in the multilayered epitaxial film according to the second mode of more preferable embodiment of the present invention, it is desirable to select such construction in which residual carriers of the semiconductor material whose composition monotonically changes, which constructs said buffer layer, are electrons, and density of negative polarized charges which are generated in the semiconductor material which constructs said buffer layer is set at such density higher than density of the ionized impurity levels from which the residual carriers generate in the semiconductor material whose composition monotonically changes, which constructs said buffer layer.

In the multilayered epitaxial film according to the second embodiment of the present invention, it is preferable that, for example, the group III nitride-type semiconductor material whose composition monotonically changes, which forms the buffer layer, is formed of a group III nitride-type semiconductor material expressed as $Al_xGa_{1-x}N$ (where, x is $1 \geq x \geq 0$), the composition change along the direction from the substrate surface to the channel layer exhibited in the group III nitride-type semiconductor material, whose composition monotonically changes, is provided by a composition change of Al composition x being monotonically reduced along the direction from the substrate surface to the channel layer, and a rate of change: $|\partial x(z)/\partial z|$ of the Al composition x in a direction from the substrate surface to the channel layer (Z direction) is selected within a range of $0.30 \, \mu m^{-1} \geq |\partial x(z)/\partial z| \geq 0.05 \, \mu m^{-1}$.

In addition, the present invention also provides an invention of a field-effect transistor which is producible by using the above-mentioned multilayered epitaxial film according to the preferable embodiment of the present invention:

that is, the field-effect transistor according to the preferable embodiment of the present invention is a field-effect transistor fabricated using a multilayered epitaxial film epitaxial grown on a substrate, characterized in that the multilayered epitaxial film is formed out of compound semiconductors which exhibit spontaneous polarization and piezo polarization effects, or semiconductor alloys thereof, the spontaneous polarization and piezo polarization effects exhibited in the compound semiconductors or semiconductor alloys thereof continuously change in magnitude with composition change of the semiconductor material, the multilayered epitaxial film comprises layered structure in which a heterojunction which is made up of an electron supply layer/a channel layer is formed on the buffer layer, and thereby electrons are accumulated two-dimensionally at a heterojunction interface of the electron supply layer/channel layer;

the buffer layer is made up of semiconductor material whose composition monotonically changes from a substrate surface along a direction from the substrate surface to the channel layer;

in the semiconductor material whose composition monotonically changes, which forms the buffer layer, the composition change is set such that it changes continuously or changes step-wise by fine film thickness steps;

in the semiconductor material whose composition monotonically changes, which forms the buffer layer, the composition at an interface between the buffer layer and the channel layer is selected so that energy of a conduction band edge of the semiconductor material which comprises the composition is higher in comparison with energy of a conduction band edge of the semiconductor material which forms the channel layer;

in the semiconductor material whose composition monotonically changes, which forms the buffer layer, its composition change along a direction from the substrate surface to the channel layer is selected so that energy of a conduction band edge of the semiconductor material whose composition monotonically changes is monotonically reduced along a direction from the substrate surface to the channel layer;

as a result of the selected composition change along the direction from the substrate surface to the channel layer, polarization obtained by totaling spontaneous polarization and piezo polarization exhibited in the semiconductor material, which forms the buffer layer and whose composition monotonically changes, monotonically changes along a direction from the substrate surface to the channel layer, the change of the polarization causes negative polarized charges to be generated in the semiconductor material which forms the buffer layer and whose composition monotonically changes;

as a result of the generated negative polarized charges, in the semiconductor material whose composition monotonically changes, which forms the buffer layer, energy of a conduction band edge of such region monotonically reduces while exhibiting a shape convex toward a side where electronic energy is higher, along a direction from the substrate surface to the channel layer;

a gate electrode of the field-effect transistor is provided on the electron supply layer, and an aspect ratio Lg/a of an active layer thickness "a" which is defined as a total of a film thickness of the electron supply layer and a film thickness of the channel layer under the gate electrode, to a gate length Lg fulfills Lg/a≥5; and a film thickness of the channel layer is selected to be five or less times of a de Broglie wavelength of electrons accumulated two-dimensionally in the channel layer.

In such a case, when such a structure fit to the operation in a depletion mode (normally on) is selected for the field-effect transistor to be fabricated, it is preferable to adopt such a structure in which said buffer layer is formed on a nucleation layer that is formed on the above-mentioned substrate surface, and in the field-effect transistor fabricated therewith, at least a total amount of "positive" space charges, which are generated in the electron supply layer, directly under a gate electrode is set to be equal to or more than a total amount of "negative" space charges which are generated in the buffer layer, at the interface between the buffer layer and channel layer, and at an interface between said buffer layer and the nucleation layer.

In addition, in the field effect transistor according to the preferable embodiment of the present invention, it is desirable to select such construction in which residual carriers of the semiconductor material whose composition monotonically changes, which constructs said buffer layer, are electrons, and density of negative polarized charges which are generated in the semiconductor material which constructs said buffer layer is set at such density higher than density of the ionized impurity levels from which the residual carriers generate in the semiconductor material whose composition monotonically changes, which constructs said buffer layer.

In the above-mentioned field effect transistor according to the preferable embodiment of the present invention, one of more preferable modes thereof is an exemplary embodiment wherein the compound semiconductors used to form the multilayered epitaxial film and which exhibit spontaneous polarization and piezo polarization effects, or semiconductor alloys thereof, are group III nitride-type compound semiconductors or semiconductor alloys thereof. In the field effect transistor according to the first mode of more preferable embodiments of the present invention, selected is such a structure in which the compound semiconductors used to form the multilayered epitaxial film and which exhibit spontaneous polarization and piezo polarization effects, or semiconductor alloys thereof, are group III nitride-type compound semiconductors or semiconductor alloys thereof;

in the multilayered epitaxial film, as to the heterojunction which is made up of the electron supply layer/channel layer, the channel layer is formed of GaN, InGaN, or a group III nitride-type semiconductor material expressed in $(In_v Al_{1-v})_w Ga_{1-w} N$ (where, 1≥v≥0 and 1≥w≥0), and the electron supply layer is made up of AlGaN, an InAlN layer, or a group III nitride-type semiconductor material expressed as $In_y Al_x Ga_{1-x-y} N$ (where, x and y are 0 or positive values, and are 1≥x+y≥0), and is selected so that energy of a conduction band edge of the group III nitride-type semiconductor material which forms the electron supply layer is higher than energy of a conduction band edge of the group III nitride-type semiconductor material which forms the channel layer, at an interface with the channel layer, to form the heterojunction which has an energy barrier resulting from difference in the energy of the conduction band edge at the interface;

the buffer layer is formed of AlGaN, InAlN, or a group III nitride-type semiconductor material expressed as $In_y Al_x Ga_{1-x-y} N$ (where, x and y are 0 or positive values, and 1≥x+y≥0), and, at an interface between the buffer layer and the channel layer, composition of the group III nitride-type semiconductor material which forms the buffer layer is selected so that energy of a conduction band edge of the group III nitride-type semiconductor material of the composition is higher than energy of a conduction band edge of the group III nitride-type semiconductor material which forms the channel layer, to form a heterojunction which has an energy barrier resulting from difference in the energy of the conduction band edge at the interface; and in the group III nitride-type semiconductor material whose composition monotonically changes, which forms the buffer layer, its composition change along a direction from the substrate surface to the channel layer is provided by any of a composition change of Al composition being monotonically reduced along the direction from the substrate surface to the channel layer, and a composition change of In composition being monotonically increased along the direction from the substrate surface to the channel layer.

In such a case, in the field effect transistor according to the first mode of more preferable embodiments of the present invention, it is desirable to select such construction in which residual carriers of the semiconductor material whose composition monotonically changes, which constructs said buffer layer, are electrons, and density of negative polarized charges which are generated in the semiconductor material which constructs said buffer layer is set at such density higher than density of the ionized impurity levels from which the residual carriers generate in the semiconductor material whose composition monotonically changes, which constructs said buffer layer.

In the field-effect transistor according to the first embodiment of the present invention, it is preferable that, for example, the group III nitride-type semiconductor material whose composition monotonically changes, which forms the buffer layer, is formed of a group III nitride-type semiconductor material expressed as $Al_xGa_{1-x}N$ (where, x is $1 \geq x \geq 0$), the composition change along the direction from the substrate surface to the channel layer exhibited in the group III nitride-type semiconductor material, whose composition monotonically changes, is provided by a composition change of Al composition x being monotonically reduced along the direction from the substrate surface to the channel layer, and a rate of change: $|\partial x(z)/\partial z|$ of the Al composition x in a direction from the substrate surface to the channel layer (Z direction) is selected within a range of $0.30 \ \mu m^{-1} \geq |\partial x(z)/\partial z| \geq 0.05 \ \mu m^{-1}$.

In addition, in the above-mentioned field effect transistor according to the preferable embodiment of the present invention, another one of more preferable modes thereof is an exemplary embodiment wherein the compound semiconductors used to form the multilayered epitaxial film and which exhibit spontaneous polarization and piezo polarization effects, or semiconductor alloys thereof, are group III nitride-type compound semiconductors or semiconductor alloys thereof. In the field effect transistor according to the second embodiment of the present invention, selected is such a structure in which the compound semiconductors which exhibit spontaneous polarization and piezo polarization effects, or semiconductor alloys thereof, which are used to form the multilayered epitaxial film, are group III nitride-type compound semiconductors or semiconductor alloys thereof;

the multilayered epitaxial film comprises layered structure in which a heterojunction which is made up of the electron supply layer/channel layer formed on the buffer layer with a barrier layer intervening therebetween, and thereby electrons are accumulated two-dimensionally at a heterojunction interface of the electron supply layer/channel layer;

in the multilayered epitaxial film, as to the heterojunction which is made up of the electron supply layer/channel layer, the channel layer is formed of GaN, InGaN, or a group III nitride-type semiconductor material expressed in $(In_vAl_{1-v})_wGa_{1-w}N$ (where, $1 \geq v \geq 0$ and $1 \geq w \geq 0$), and the electron supply layer is made up of AlGaN, an InAlN layer, or a group III nitride-type semiconductor material expressed as $In_yAl_xGa_{1-x-y}N$ (where, x and y are 0 or positive values, and are $1 \geq x+y \geq 0$), and is selected so that energy of a conduction band edge of the group III nitride-type semiconductor material which forms the electron supply layer is higher than energy of a conduction band edge of the group III nitride-type semiconductor material which forms the channel layer, at an interface with the channel layer, to form the heterojunction which has an energy barrier resulting from difference in the energy of the conduction band edge at the interface;

the barrier layer intervenes between the channel layer and buffer layer, and is formed of In AlGaN, or a group III nitride-type semiconductor material expressed by $(In_vAl_{1-v})_wGa_{1-w}N$ (where, $1 \geq v \geq 0$ and $1 \geq w \geq 0$), and is selected so that energy of a conduction band edge of the group III nitride-type semiconductor material which forms the barrier layer is higher than energy of a conduction band edge of the group III nitride-type semiconductor material which forms the channel layer in contact with the barrier layer, and energy of a conduction band edge of the group III nitride-type semiconductor material which forms the barrier layer is higher than energy of a conduction band edge of the group III nitride-type semiconductor material which forms the buffer layer at an interface with the barrier layer, to form a heterojunction which has an energy barrier resulting from difference in the energy of the conduction band edge at the interface;

the buffer layer is formed of AlGaN, InAlN, or a group III nitride-type semiconductor material expressed as $In_yAl_xGa_{1-x-y}N$ (where, x and y are 0 or positive values, and $1 \geq x+y \geq 0$), and, at an interface with the barrier layer, composition of the group III nitride-type semiconductor material which forms the buffer layer is selected so that energy of a conduction band edge of the group III nitride-type semiconductor material of the composition is higher than energy of a conduction band edge of the group III nitride-type semiconductor material which forms the channel layer; and in the group III nitride-type semiconductor material whose composition monotonically changes, which forms the buffer layer, its composition change along a direction from the substrate surface to the channel layer is provided by any of a composition change of Al composition being monotonically reduced along the direction from the substrate surface to the channel layer, and a composition change of In composition being monotonically increased along the direction from the substrate surface to the channel layer.

In such a case, in the field effect transistor according to the second mode of more preferable embodiments of the present invention, it is desirable to select such construction in which residual carriers of the semiconductor material whose composition monotonically changes, which constructs said buffer layer, are electrons, and density of negative polarized charges which are generated in the semiconductor material which constructs said buffer layer is set at such density higher than density of the ionized impurity levels from which the residual carriers generate in the semiconductor material whose composition monotonically changes, which constructs said buffer layer.

In the field-effect transistor according to the second mode of more preferable embodiments of the present invention, it is preferable that, for example, the group III nitride-type semiconductor material whose composition monotonically changes, which forms the buffer layer, is formed of a group III nitride-type semiconductor material expressed as $Al_xGa_{1-x}N$ (where, x is $1 \geq x \geq 0$), the composition change along the direction from the substrate surface to the channel layer exhibited in the group III nitride-type semiconductor material, whose composition monotonically changes, is provided by a composition change of Al composition x being monotonically reduced along the direction from the substrate surface to the channel layer, and a rate of change: $|\partial x(z)/\partial z|$ of the Al composition x in a direction from the substrate surface to the channel layer (Z direction) is selected within a range of $0.30 \ \mu m^{-1} \geq |\partial x(z)/\partial z| \geq 0.05 \ \mu m^{-1}$.

Moreover, preferable constructions in the present invention and a guide line for selecting the preferable constructions will be explained below.

In the present invention, multi-layered structure, including an electron supply layer/a channel layer/a buffer layer formed on a substrate is employed as structure of a multilayer epitaxial layer used when preparing a heterojunction FET (HJFET); and the following structure is used as technique for suppressing carrier injection to the buffer layer from the channel layer to improve a confinement effect (carrier confinement) on carriers which are two-dimensionally accumulated at the interface between the electron supply layer/channel layer, in which structure, compound semiconductors which have spontaneous polarization and piezo polarization effects caused by anisotropy in a direction of a crystal axis, and semiconductor alloys thereof are used as semiconductor materials which compose the electron supply layer/channel layer/buffer layer, and in the multilayer epitaxial layers comprising such a structure that the channel layer and electron supply layer are stacked up on the substrate with the above-mentioned buffer layer intervening therebetween, composition of a semiconductor material, which forms the buffer layer, is monotonically changed, along a growth direction from the substrate surface to the channel layer, and as a result of the change in the composition, polarization, which is a sum total with the spontaneous polarization and piezo polarization, which the semiconductor material exhibits, is also changed along the growth direction to generates polarized charges in the buffer layer. In such a case, residual carriers in the semiconductor material itself which forms the buffer layer are chosen to be the same type with that of said carriers accumulated at the interface of the electron supply layer/channel layer, and thereby such a state that space charges having a polarity contrary to the residual carriers are fixed in the semiconductor material results from generation of the residual carriers. In the situation, said polarized charges generated in the buffer layer are set to be charges having the same polarity as the residual carriers, and density of these polarized charges are set higher than density of the space charges fixed in the semiconductor material to compensate, whereby such a state that the buffer layer contains effectually fixed charges with the same polarity as that of the polarized charges as a whole is attained. In such a case, it can lead to such a phenomenon in which, among the bands of the semiconductor material which forms the buffer layer, the edge of the band on which said carriers can be present is varied in energy along a direction from the upper surface of the substrate to the channel layer in such a manner that the shape of the edge shows a convex form in a direction where energy of the carriers rises. The present invention utilizes said phenomenon.

That is, in the process in which carriers are injected into the buffer layer from the channel layer, it becomes necessary for the injected carriers to climb the band edge showing the convex form in the direction in which the energy of the carriers rises, and thus the number of carriers which can climb this energy gradient are reduced. In other words, an effect that carrier injection into the buffer layer from the channel layer is suppressed is achieved. Of course, since there is a band edge, which shows the convex form in the direction in which the energy of the carriers rises, in the buffer layer region, there are present no residual carriers in the buffer layer, whereby, in the HJFET according to the present invention, a leak current through the buffer layer is also reduced, and thus a so-called buffer layer break-down voltage becomes excellent level.

In the HJFET according to the present invention, as semiconductor material which form the electron supply layer/channel layer/buffer layer, compound semiconductors, which have spontaneous polarization and piezo polarization effects caused by anisotropy in a direction of a crystal axis, and semiconductor alloys thereof are used. As an example of compound semiconductor materials which conform this feature, group III nitride-type semiconductors which have spontaneous polarization and piezo polarization effects in connection with their structure with hexagonal crystal system (wurtzite type structure) can be exemplified. A part of structural constants and constants for physical property of group III nitride-type semiconductors: AlN, GaN, and InN which have a hexagonal crystal system are summarized in Table 1.

TABLE 1

Structural constants and constants for physical property (wurtzite type crystal)

|  | AlN | GaN | InN |
|---|---|---|---|
| Lattice constant a (Å) | 3.112 | 3.189 | 3.540 |
| c (Å) | 4.982 | 5.185 | 5.760 |
| Coefficient of linear thermal expansion ($10^{-5}$/K) | a//5.27 c//4.15 | a//5.59 c//3.17 | a//5.7 c//3.7 |
| Spontaneous polarization $P_{sp}$ [C/m$^2$] | −0.081 | −0.029 | −0.032 |
| Piezoelectric constant $e_{31}$ [C/m$^2$] | −0.60 | −0.49 | −0.57 |
| Piezoelectric constant $e_{33}$ [C/m$^2$] | 1.46 | 0.73 | 0.97 |
| Elastic constant $C_{13}$ [GPa] | 120 | 70 | 121 |
| Elastic constant $C_{33}$ [GPa] | 395 | 379 | 182 |

As an example of applying the present invention to an HJFET, which constructs an electron supply layer/a channel layer/a buffer layer, using group III nitride-type semiconductors which have the hexagonal crystal system, and semiconductor alloys thereof, it is possible to adopt construction of an AlGaN/GaN-type HJFET as explained below.

Generally, as a substrate available to epitaxial growth of a group III nitride-type semiconductor, what is shown in the following Table 2 is known.

TABLE 2

Crystal structure parameter of substrate material for epitaxial growth of group III nitride-type semiconductor

| Substrate material | Crystal system | Lattice constant (Å) | Coefficient of linear thermal expansion (K$^{-1}$) |
|---|---|---|---|
| 6H—SiC | Hexagonal | a = 3.08 c = 15.12 | a//4.2 × 10$^{-6}$ c//4.8 × 10$^{-6}$ |
| 4H—SiC | Hexagonal | a = 3.09 c = 10.08 | a//4.2 × 10$^{-6}$ c//4.7 × 10$^{-6}$ |
| 3C—SiC | Cubic | a = 4.36 | a//4.7 × 10$^{-6}$ |
| α-Al$_2$O$_3$ | Hexagonal | a = 4.758 c = 12.991 | a//7.5 × 10$^{-6}$ c//8.5 × 10$^{-6}$ |
| Si | Diamond structure | a = 5.431 | a//4.08 × 10$^{-6}$ |
| ZnO | Hexagonal | a = 3.240 c = 5.195 | a//2.9 × 10$^{-5}$ c//4.75 × 10$^{-5}$ |
| AlN | Hexagonal | a = 3.112 c = 4.982 | a//2.9 × 10$^{-6}$ c//3.4 × 10$^{-6}$ |

TABLE 3

Thermal and electrical properties of substrate material for epitaxial growth of group III nitride-type semiconductor

| Substrate material | Thermal conductivity (W/mK) | Dielectric constants $\epsilon_r$ | Resistibility (Ω · cm) |
|---|---|---|---|
| 6H—SiC | 4.9 × 10$^{-2}$ | c// 10.2 c⊥ 9.7 | Semiconductor: 10$^6$ Order |
| 4H—SiC | 4.9 × 10$^{-2}$ | c// 10.2 c⊥ 9.7 | Semiconductor: 10$^6$ Order |
| 3C—SiC | 4.9 × 10$^{-2}$ | 9.72 | Semiconductor: 10$^6$ Order |
| α-Al$_2$O$_3$ | 0.2 × 10$^{-2}$ | c// 9.34 a// 11.54 | Insulator: >10$^{14}$ |
| Si | 1.5 × 10$^{-2}$ | 3.75(100) | Semiconductor: ≤2.3 × 10$^5$ |
| ZnO | 0.234 × 10$^{-2}$ | 8.5 | Semiconductor: 10$^6$ Order |
| AlN | 2.2 × 10$^{-2}$ | 10.7 | Insulator: 10$^{10}$ Order |

When an AlN substrate is used among the above-mentioned substrate materials, it becomes unnecessary to prepare the above-mentioned AlN layer on a surface of a different kind of substrate as a nucleation layer. However, since it is not easy to obtain a large-diameter AlN substrate up to the date, usually, such a mode in which an AlN layer, which is given C-axis growth on a surface of a different kind of substrate, is used as a nucleation layer is preferable. Similarly, since it is not easy to obtain a large-diameter substrate up to the date also regarding a ZnO substrate, usually, a thin film layer of ZnO is formed on a surface of a different kind of substrate, and this ZnO thin film layer can be used as an underlying layer. In addition, under a hot ambient atmosphere, ZnO tends to cause thermal decomposition, and since both of metal Zn and $O_2$ generated in such a case transpire easily, there is a limit in utilization to an underlying layer for high temperature growth.

Since a SiC substrate is preferable as a base substrate for high temperature growth and a large-diameter substrate is easily available, it is one of the most preferable substrates when preparing a multilayered epitaxial film for the above-mentioned AlGaN/GaN-type HJFET. Although crystalline polytypes belonging to different crystal systems are known in the SiC, it is more preferable to use 6H—SiC and 4H—SiC belonging to a hexagonal crystal system among those. In the multilayered epitaxial film for the AlGaN/GaN-type HJFET, a base substrate needs to have high resistance and a high dielectric breakdown electric field, and, SiC substrates including a 6H—SiC substrate and a 4H—SiC substrate fulfill these requirements. Furthermore, the SiC itself is a material of showing good thermal conductivity, and, for example, it exhibits a large contribution in diffusion of heat generated in an operating range of the AlGaN/GaN-type HJFET. In consideration of contribution to this thermal diffusion, when preparing an AlGaN/GaN-type HJFET aiming at a high electric power operation in particular, it is preferable to use a 6H—SiC substrate and a 4H—SiC substrate as its base substrate.

Although Si, GaAs, and sapphire have also advantages of easily obtaining large-diameter substrates, in 6H—SiC and 4H—SiC, dielectric breakdown electric fields are about 10 times of those of Si and GaAs, and, thermal conductivity is about 3 times of that of Si, and about 20 times of that of sapphire, and is considered to be more preferable substrate materials in these two points. In addition, when growing up an AlN layer as a nucleation layer on a C surface ((0001) plane) of a 6H—SiC or 4H—SiC substrate, those lattice constants a approximately coincide, and further, in consideration of coefficients of thermal expansion, under a high temperature growth condition, their difference between the lattice constants a becomes smaller. Hence, the AlN layer is grown in the given C axis on the C plane ((0001) plane) of the 6H—SiC or 4H—SiC substrate, and the multilayered epitaxial film which is grown epitaxially by using this AlN layer as a nucleation layer becomes a film which exhibits high crystal quality.

In addition, when C axis growth of the AlN layer is performed on a plane (111) of 3C—SiC, since the plane functions as a plane which has an effectual lattice constant $a_h$=3.082 (Å), it becomes equal to a case of performing C axis growth of an AlN layer on a C plane ((0001) plane) of a 6H—SiC or 4H—SiC substrate.

In addition, it is reported that, when growing up the AlN layer for a nucleation layer on various base surfaces, relationship of both crystal orientations as shown in the following Table 4 is to be obtained.

TABLE 4

Relationship between crystal orientations of hexagonal AlN which is given C plane growth on various base surfaces and substrate surface

| Surface orientation of substrate | Crystal orientation of hexagonal AlN//crystal orientation of substrate |
|---|---|
| SiCc(0001) | (0001)[2$\bar{1}\bar{1}$0]//(0001)[2$\bar{1}\bar{1}$0] |
| α-Al$_2$O$_3$c(0001) | (0001)[1$\bar{1}$00]//(0001)[2$\bar{1}\bar{1}$0] |
| α-Al$_2$O$_3$r(01$\bar{1}$2) | (2$\bar{1}\bar{1}$0)[0001]//(01$\bar{1}$2)[0$\bar{1}$11] |
| α-Al$_2$O$_3$a(2$\bar{1}\bar{1}$0) | (0001)[1$\bar{1}$00]//(2$\bar{1}\bar{1}$0)[0001] |
| Si o(111) | (0001)[2$\bar{1}\bar{1}$0]//(111)[1$\bar{1}$0] |
| Si a(100) | (0001)[2$\bar{1}\bar{1}$0]//(100)[011] |

As shown in Table 4, it is possible to perform C axis growth of the AlN layer for a nucleation layer on several substrate surfaces besides the C plane ((0001) plane) of SiC.

For example, since a high-quality large-diameter Si substrate is inexpensively available, there is a high possibility that it will be used widely as a substrate from now on when forming a multilayered epitaxial film of a group III nitride-type semiconductor with a large area. A hexagonal AlN film is grown epitaxially on a surface of a Si substrate with diamond structure, and then each of layers including a buffer layer is grown up by using the AlN layer, which is given C axis growth, as a nucleation layer by applying a high temperature growth method (growth temperature: about 1,100° C.). As very slight deviation is between these atomic placement on the substrate surface and atomic placement of AlN, lattice spacings of the AlN layer show strain in an early stage of growth, but this strain is relaxed gradually as growth advances. Specifically, when a film thickness of an AlN layer which is grown as a nucleation layer reaches at least 40 nm, an upper face of the AlN layer has a lattice constant almost equal to the original lattice constant (a=3.112 Å) of AlN.

In addition, the above-mentioned AlN layer which is grown up on a substrate surface has high resistance, and functions as an insulating layer. Hence, each of layers including the buffer layer is stacked in series on the substrate with the insulating AlN layer intervening therebetween to form a multilayered epitaxial film. However, it is not necessary to thicken a film thickness of the AlN layer used excessively as a nucleation layer, but, usually, it is preferable to select it in a range of 40 nm or more and 100 nm or less.

As described previously, since what is given C plane ((0001) plane) growth is used as the AlGaN electron supply layer/GaN channel layer in the above-mentioned AlGaN/GaN-type HJFET, generally, it is preferable to form a multi-layer epitaxial film, including an electron supply layer/channel layer/buffer layer, on a C plane ((0001) plane) surface of a 6H—SiC substrate or a 4H—SiC substrate. In such a case, it is preferable to grow epitaxially the structure of an electron supply layer/channel layer/buffer layer by setting the AlN layer as a seed after forming the AlN layer which has a lattice constant a, which approximately coincides with the lattice constant a on a C plane, as a nucleation layer for forming a growth nucleus on a C plane ((0001) plane) surface of a 6H—SiC substrate or a 4H—SiC substrate.

Usually, in the prepared AlGaN/GaN-type HJFET, backside polishing treatment is performed for a thickness of a base substrate to be thinned and for thermal diffusion efficiency from the backside side to be maintained. In the case of epi-taxial growth, after performing backside polishing treatment to various kinds of substrates used as base substrates, generally, the AlGaN/GaN-type HJFET is operated with this substrate backside being grounded.

Hence, there is an influence, which is caused by a base substrate material used, to a device performance which the AlGaN/GaN-type HJFET for a high frequency exhibits, and in particular, to a high frequency characteristic. When resistibility of the used base substrate is not high enough when an operating frequency is in a higher frequency band, such as a 10-GHz or higher microwave, a submillimeter wave band, and a millimeter wave band, it becomes a factor of dielectric loss and results in becoming a factor of lowering performance of RF gain or Noise Figure. Specifically, as for Si (or GaAs), in consideration of its bandgap $E_g$ and state density of a conduction band edge, since its resistibility is estimated to be a maximum of $2.3 \times 10^5$ Ω·cm in room temperature, a highly resistive substrate cannot be obtained, and when using a Si substrate, it is not suitable for an application where an operating frequency is 10 GHz or higher. On the other hand, as for SiC, since its bandgap $E_g$ is farther larger than Si (or GaAs), it is possible to use a substrate whose resistibility arrives at an order of $10^6$ Ω·cm in room temperature. That is, a SiC substrate can be suitably used for an application where an operating frequency is 10-GHz or higher. On the other hand, when the operating frequency is a microwave frequency band from near 1 GHz to 10 GHz, even if Si substrate is used, the influence of the dielectric loss mentioned above becomes in a permissible enough range. In consideration of a respect of being able to obtain a large-diameter substrate relatively inexpensively, a Si substrate can be used suitably similarly to a SiC substrate for an application where an operating frequency is in a microwave frequency band from near 1 GHz to 10 GHz.

Next, a device performance which an AlGaN/GaN-type HJFET for a high frequency exhibits, and in particular, efficiency of thermal diffusion through a substrate backside in the case of aiming at high output operation has a large influence on device efficiency. Hence, when at least aiming at the high output operation where an output power density is not less than 5 W/mm (e.g., large output operation for a base station of a cellular phone), it is preferable to use a SiC substrate with high thermal conductivity. On the other hand, in a range of an output power density being 5 W/mm or less, even if a Si substrate in which thermal conductivity is a little inferior is used, it is possible to fully achieve the aimed performance. Furthermore, for an application where an output power density is considerably lower than 5 W/mm but an operating frequency is 10 GHz or higher, it is possible to use suitably also a sapphire substrate whose thermal conductivity is fairly inferior but whose resistibility arrives at an order of $10^{10}$ Ω·cm. More specifically, in an AlGaN/GaN-type HJFET for a cellular phone terminal, since an output power density is greatly lower than 5 W/mm, it is possible to use a sapphire substrate whose thermal conductivity is fairly inferior. In addition, since utilization of a sapphire substrate has a low manufacturing cost and there are also many board sizes when aiming at an AlGaN/GaN-type HJFET for a cellular telephone, it contributes also to reduction of manufacturing cost of a whole device.

As a buffer layer, a group III nitride-type semiconductor with different composition from GaN of the channel layer is used. Specifically, a group III nitride-type semiconductor alloy layer where composition of the group III nitride-type semiconductor which forms this buffer layer is changed monotonically from the AlN nucleation layer to the GaN channel layer is used. In such a case, it is preferable that a lattice constant of the group III nitride-type semiconductor alloy where this composition monotonically changes, that is, so-called "composition modulation" is given is approximately equal to the lattice constant of the AlN layer, which is a lower layer, and the lattice constant of the GaN layer which is an upper layer, and in particular, has an intermediate value between them. In addition, in the AlGaN/GaN-type HJFET, since carriers two-dimensionally accumulated at an interface of the AlGaN electron supply layer/GaN channel layer are electrons, what becomes high energy as energy $E_C$ of a conduction band edge of the group III nitride-type semiconductor alloy which is given the "composition modulation" at least in comparison with the energy $E_C$ of the conduction band edge of GaN is selected. AlGaN can be cited as an example of the group III nitride-type semiconductor alloy which fulfills these two conditions. In addition, generally, what fulfills the above-mentioned two conditions among the group III nitride-type semiconductor alloys written as $In_yAl_xGa_{1-x-y}N$ is used suitably.

For example, when using an AlGaN buffer layer which is given "composition modulation" as shown in FIG. 1 as the buffer layer which is made up of a group III nitride-type semiconductor alloy which is given the "composition modulation", it is preferable to use a composition modulated (composition gradient) AlGaN layer where Al composition is made gradually or step-wise low from the substrate surface to the GaN channel layer In the AlGaN buffer layer which is given "Al composition modulation" as mentioned above, negative polarized charges are generated by both of spontaneous polarization and piezo polarization effects, and a conduction band has an upward convex (p-like) characteristic. For this reason, it becomes hard that electrons are injected into the "Al composition-modulated" AlGaN buffer layer also in the case of a reverse bias application. Hence, improvement in a buffer layer break-down voltage can be expected. Furthermore, since an AlGaN layer has smaller electron affinity and higher conduction band potential than those of a GaN layer, a band barrier is formed also in a back side of a channel layer in band structure, and improvement also in respect of a carrier confinement effect of a channel can be achieved, and improvement in a pinch-off characteristic and suppression of a short channel effect can be achieved.

Figure 11:
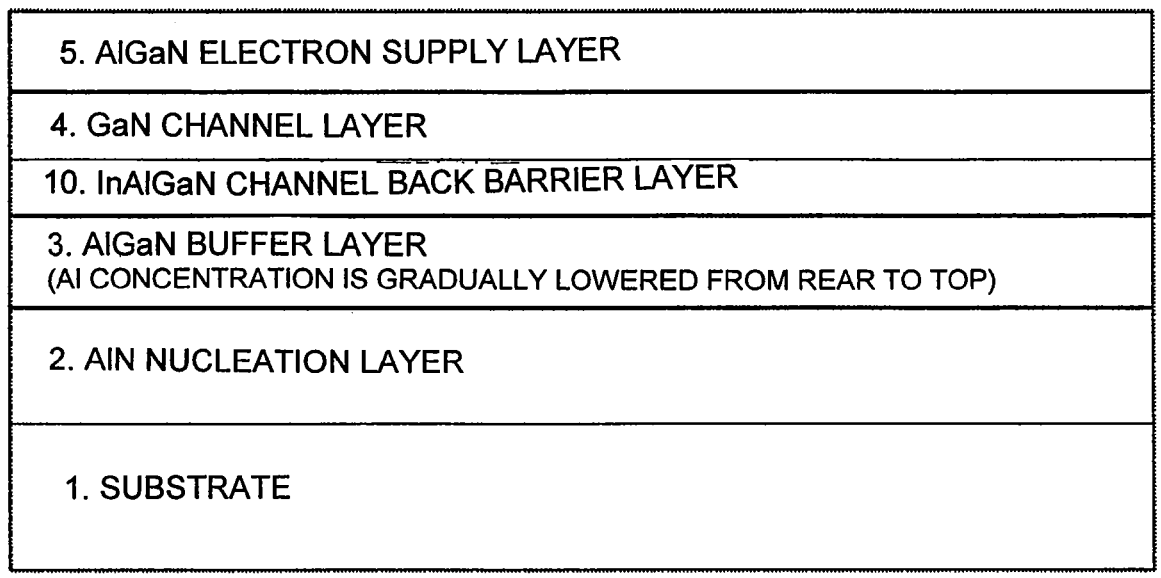
FIG. 11 is a sectional view illustrating schematically an example of structure of a multilayered epitaxial film for an AlGaN/GaN-type HJFET according to the third exemplary embodiment of the present invention.
Figure 12:
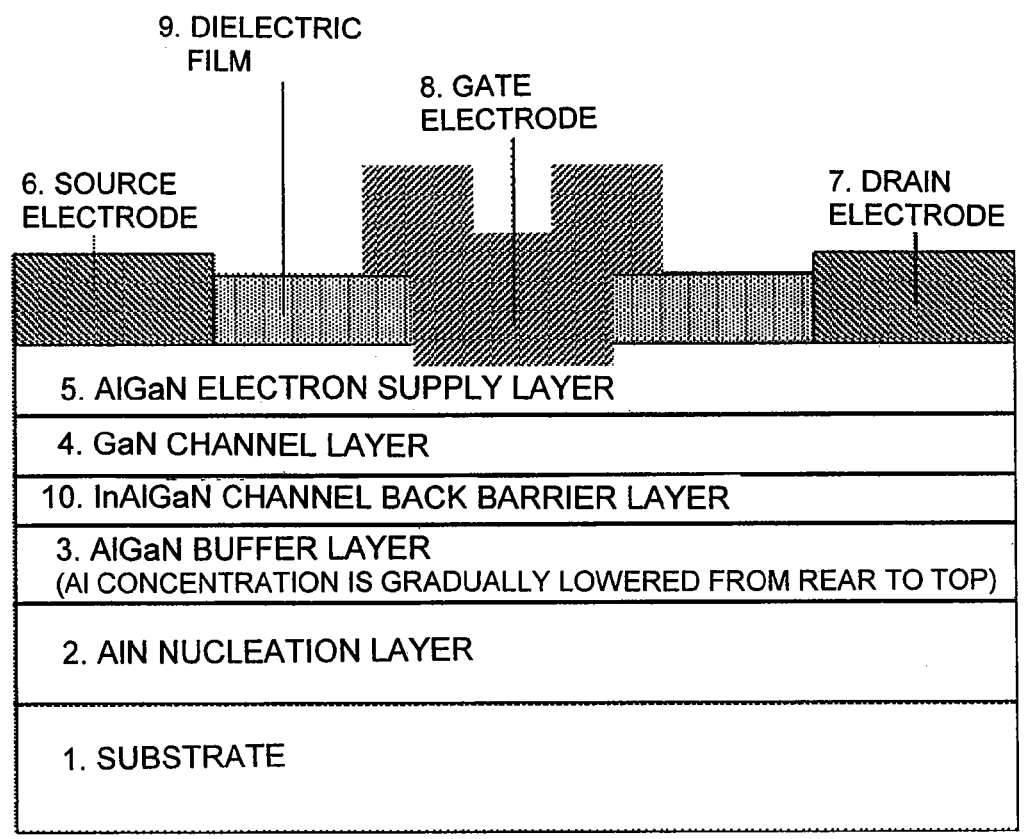
FIG. 12 is a sectional view illustrating schematically an example of a structure for an AlGaN/GaN-type HJFET according to the third exemplary embodiment of the present invention.

In addition, when a material which forms the channel layer, for example, an InAlGaN layer which has electron affinity smaller (conduction band potential is high) than that of GaN is inserted as a barrier layer which contacts a back of the channel layer for improvement in the carrier confinement effect of a channel layer, this generates an HJFET which is prepared using a multilayered epitaxial film with construction shown in FIG. 11 and has construction exemplified in FIG. 12. In the structure, since a band diagram of the electron supply layer, a channel layer, a barrier layer, and "composition-modulated" buffer layer becomes a form exemplified in FIG. 13, it is more effective for suppression of the electron injection from the channel layer to the "composition-modulated" buffer layer.

As described above, in the HJFET according to the present invention, and in particular, an AlGaN/GaN-type HJFET, a composition-modulated (composition gradient) AlGaN layer, where Al composition is lowered gradually or step-wise from a substrate side to the GaN channel layer, is used as a buffer layer, besides GaN of the channel layer. In such AlGaN buffer layer which has "Al composition modulation", negative polarized charges are generated by both of spontaneous polarization and piezo polarization effects, and thereby its conduction band has an upward convex (p-like) feature. For this reason, it becomes hard that electrons are injected into the buffer layer also in the case of a reverse bias application. Hence, improvement in a buffer layer break-down voltage can be expected. Furthermore, at an interface between the channel layer and buffer layer which is given "composition modulation", since the group III nitride-type semiconductor alloys (AlGaN etc.) of the buffer layer which is given "composition modulation", or the group III nitride-type semiconductor alloys (InAlGaN etc.) of the barrier layer provided at this interface has smaller electron affinity and higher conduction band potential than those of the GaN layer, a band barrier is formed also in the back side of the channel layer in band structure, and hence, improvement can be achieved also in respect of the carrier confinement effect of the channel, and improvement in a pinch-off characteristic and suppression of a short channel effect can be achieved. Because of the above-mentioned effects, the field-effect transistor according to the present invention can achieve large improvement also in respect of a DC gain or an RF gain in the case of high voltage operation.

In this way, the present invention places extremely greatly contributes to development of a GaN-type transistor, and in particular, to a performance increase and reliability improvement of an FET for a millimeter wave and a submillimeter wave band, where a short channel effect is generated severely, in device structure using a conventional buffer layer which has uniform composition.

The present invention will be explained below in further detail with citing specific examples. Although exemplary embodiments in these specific examples are examples of exemplary embodiments according to the present invention, the present invention is not limited to these embodiments.

Exemplary Embodiment 1

First, a specific example is shown and described about a method of designing construction of a multilayer epitaxial layer according to the present invention. In addition, in the following description, it is assumed that, in each layer which forms a multilayer epitaxial layer, relaxation of strain stress, resulting from difference (lattice mismatching) in the lattice constant between the materials which form the layer, by a change of an effectual lattice constant in an inplane direction of a whole multilayer epitaxial layer does not occur. Specifically, in the following examples, it is approximated that, in each layer which forms the construction of the multilayer epitaxial layer, since the effectual inplane lattice constant coincides with the inplane lattice constant in AlN without strain and it is in a state that a lattice constant in a depth direction changes because of difference of lattice constant (lattice mismatching), there is no influence of the distortion relaxation that strain stress is partially relaxed because the whole multilayer epitaxial layer curves, or a dislocation is generated internally and strain stress is relaxed partially.

In this example, in the multilayer epitaxial layer, an AlN layer is grown at a 100-nm thickness on its surface as a nucleation layer using a C plane ((0001) plane) of SiC as a substrate, and a first AlGaN layer is grown as a buffer layer. This is made into construction that, on this buffer layer, a GaN layer is epitaxially grown as a channel layer and a second AlGaN layer is grown as an electron supply layer in a top layer. In addition, each of the first AlGaN layer, GaN layer, and second AlGaN layer is grown epitaxially so that a normal line direction of a grown plane may become a C-axis <0001> axial direction. Finally, construction of an HJFET is adopted, a gate electrode is provided on a surface of the second AlGaN layer, and the gate electrode and second AlGaN layer are made into a form in which they form a Schottky junction. Although the C plane (0001) surface of SiC is used as the substrate in this example, besides this, it is also possible to use a substrate which can grow epitaxially so that a normal line direction of a grown plane of an epitaxial growth layer, such as an A plane of a SiC substrate, and the C plane and A plane of sapphire substrate, may become a C axis <0001> axial direction.

A method of designing a buffer layer of a GaN-type heterojunction FET will be specifically described below with utilizing positively polarized charges resulting from spontaneous polarization and piezo polarization of a group III nitride-type semiconductor material. With facing this design, it is possible to refer to related art disclosed in references, for example, O. Ambacher, B. Foutz, J. Smart, J. R. Shealy, N. G. Weimann, K. Chu, M. Murphy, A. J. Sierakowski, W. J. Schaff, and L. F. Eastman, "Two dimensional electron gases induced by spontaneous and piezoelectric polarization in undoped and doped AlGaN/GaN heterostructures", J. Appl. Phys. Vol. 87, No. 1, p. 334 (2000), and the like, and to use the results partially.

A first AlGaN layer which is a buffer layer is in a state that strain stress resulting from lattice mismatching exists. In addition, a group III nitride-type semiconductor material exhibits spontaneous polarization $P_{sp}$, and when strain stress resulting from lattice mismatching exists, it exhibits piezo polarization $P_{pe}$ caused by a piezoelectric effect. Hence, total polarization P which exists in the first AlGaN layer which has strain stress resulting from lattice mismatching is expressed by a vector sum of the spontaneous polarization $P_{sp}$ and the piezo polarization $P_{pe}$.

$$P = P_{sp} + P_{pe} \ (C/m^2)$$

In such a case, polarized charges σ(P) are generated because of the polarization P which exists in the first AlGaN layer. The polarized charges σ(P) generated because of the polarization P are expressed as follows.

$$\sigma(P) = -\nabla \cdot P \ (\nabla: \text{nabra operator})$$

Here, since it is approximated that the first AlGaN layer has constant composition in an inplane direction, but has a composition change only in a depth direction, and strain stress does not exist in an inplane direction but strain stress caused by lattice mismatching exists only in a depth direction, the polarized charges σ(P) are expressed approximately as follows. That is, when defining a normal line direction from a substrate to a surface of a multilayer epitaxial layer as a Z axial direction, the polarized charges σ(P) are expressed approximately as follows.

$$\begin{aligned}\sigma(P) &= -\partial P / \partial z \\ &= -\partial \{P_{sp} + P_{pe}\} / \partial z \\ &= \{-\partial P_{sp}/\partial z\} + \{-\partial P_{pe}/\partial z\} \\ &= \sigma(P_{sp}) + \sigma(P_{pe}) \ (C/m^3)\end{aligned}$$

Where, $\sigma(P_{sp}) = -\partial P_{sp}/\partial z$ and $\sigma(P_{pe}) = -\partial P_{pe}/\partial z$ As for an AlGaN mixed crystal, when setting its composition at $Al_xGa_{1-x}N$ (0<x<1), its spontaneous polarization $P_{sp}$ is written as $P_{sp}(x)$, as a function of Al composition x. Regarding this $P_{sp}(x)$, the following approximation is performed as a linear approximation here.

$$P_{sp}(x) \approx x \cdot P_{sp}(AlN) + (1-x) \cdot P_{sp}(GaN)$$

With substituting values of spontaneous polarization of GaN: $P_{sp}(GaN)$ and spontaneous polarization of AlN: $P_{sp}(AlN)$ which are shown in Table 1, it is described as follows.

$$P_{sp}(x) \approx P_{sp}(GaN) - x \cdot \{P_{sp}(GaN) - P_{sp}(AlN)\}$$
$$\approx -0.029 - 0.052 \times (C/m^2)$$

When composition is made $Al_xGa_{1-x}N$ (0<x<1) as for the AlGaN mixed crystal, its lattice constant $a(Al_xGa_{1-x}N)$ is written as $a_0(x)$, as a function of Al composition x. The following approximation is performed as a linear approximation here regarding this $a_0(x)$.

$$a_0(x) \approx x \cdot a(AlN) \pm (1-x) \cdot a(GaN)$$

With substituting values of lattice constant of GaN: a(GaN) and lattice constant of AlN: a(AlN) which are shown in Table 1, it is described as follows.

$$a_0(x) \approx a(GaN) - x \cdot \{a(GaN) - a(AlN)\}$$
$$\approx 3.189 - 0.077x (\text{Å})$$

In addition, as for an AlGaN mixed crystal, when making its composition into $Al_xGa_{1-x}N$ (0<x<1), piezoelectric constants $e_{31}(Al_xGa_{1-x}N)$ and $e_{33}(Al_xGa_{1-x}N)$, and elastic constants $C_{13}(Al_xGa_{1-x}N)$, and $C_{33}(Al_xGa_{1-x}N)$ are written as $e_{31}(x)$, $e_{33}(x)$, $C_{31}(x)$, and $C_{33}(x)$ respectively, as a function of Al composition x. The following approximations are performed as linear approximations here also regarding these $e_{31}(x)$, $e_{33}(x)$, $C_{31}(x)$, and $C_{33}(x)$.

$$e_{31}(x) \approx x \cdot e_{31}(AlN) + (1-x) \cdot e_{31}(GaN)$$

$$e_{33}(x) \approx x \cdot e_{33}(AlN) + (1-x) \cdot e_{33}(GaN)$$

$$C_{31}(x) \approx x \cdot C_{31}(AlN) + (1-x) \cdot C_{31}(GaN)$$

$$C_{33}(x) \approx x \cdot C_{33}(AlN) + (1-x) \cdot C_{33}(GaN)$$

When substituting values of the piezoelectric constants $e_{31}(GaN)$ and $e_{33}(GaN)$, and the elastic constants $C_{13}(GaN)$ and $C_{33}(GaN)$ of GaN, and the piezoelectric constants $e_{31}(AlN)$ and $e_{33}(AlN)$ and elastic constants $C_{13}(AlN)$ and $C_{33}(AlN)$ of AlN which are shown in Table 1, they are described respectively as follows.

$$e_{31}(x) \approx e_{31}(GaN) - x \cdot \{e_{31}(GaN) - e_{31}(AlN)\}$$
$$\approx -0.49 - 0.11x$$

$$e_{33}(x) \approx e_{33}(GaN) - x \cdot \{e_{33}(GaN) - e_{33}(AlN)\}$$
$$\approx 0.73 + 0.73x$$

$$C_{31}(x) \approx C_{31}(GaN) - x \cdot \{C_{31}(GaN) - C_{31}(AlN)\}$$
$$\approx 70 + 50x$$

$$C_{33}(x) \approx x \cdot C_{33}(AlN) + (1-x) \cdot C_{33}(GaN)$$
$$\approx 379 + 16x$$

When a normal line direction from a substrate to a surface of a multilayer epitaxial layer is defined as a Z axial direction and composition of AlGaN is made into $Al_xGa_{1-x}N$ (0<x<1), piezo polarization $P_{pe}$ in the first AlGaN layer which has the above-mentioned strain stress can be expressed as follows.

Here, since it is approximated that an in-plane lattice constant coincides with a lattice constant of AlN used for a nucleation layer, and strain resulting from lattice mismatching (difference between lattice constants) causes only a transition of a lattice spacing in a depth direction (Z axial direction), the strain becomes $e_{ZZ}(Al_xGa_{1-x}N)$. In the above-mentioned approximation, since the in-plane lattice constant $a(Al_xGa_{1-x}N)$ in a distortionless state is equal to the lattice constant a(AlN) of AlN in a distorted state, strain: $e_{ZZ}(Al_xGa_{1-x}N)$ is written as follows.

$$e_{ZZ}(Al_xGa_{1-x}N) = \{a(AlN) - a(Al_xGa_{1-x}N)\}/a(Al_xGa_{1-x}N)$$

When strain: $e_{ZZ}(Al_xGa_{1-x}N)$ is written as $e_{ZZ}(x)$, as a function of Al composition x, it can be described as follows.

$$e_{ZZ}(x) = \{a - a_0(x)\}/a_0(x)$$

where $a \equiv a(AlN)$.

When a value of the above-mentioned approximate expression is introduced into $a_0(x)$, it is approximated as follows.

$$e_{ZZ}(x) \approx \{3.112 - (3.189 - 0.077x)\}/(3.189 - 0.077x)$$
$$\approx (0.077x - 0.077)/(3.189 - 0.077x)$$

When a normal line direction from a substrate to a surface of a multilayer epitaxial layer, is defined as a Z axial direction and composition of AlGaN is made into $Al_xGa_{1-x}N$ (0<x<1), piezo polarization $P_{pe}$ in the first AlGaN layer can be described as follows when $P_{pe}(Al_xGa_{1-x}N)$ is written as $P_{pe}(x)$, as a function of Al composition x.

$$P_{pe}(x) = 2e_{ZZ}(x)[e_{31}(x) - e_{33}(x) \cdot \{C_{31}(x)/C_{33}(x)\}]$$

When the values of the above-mentioned approximate expression are introduced into the strain: $e_{ZZ}(x)$, piezoelectric constants $e_{31}(x)$ and $e_{33}(x)$, and elastic constants $C_{31}(x)$ and $C_{33}(x)$, they are approximated as follows, respectively.

$$P_{pe}(x) \approx 2\{(0.077x - 0.077)/(3.189 - 0.077x)\} \cdot \{(-0.49 - 0.11x) - (0.73 + 0.73x) \cdot (70 + 50x)/(379 + 16x)\}$$

On the other hand, in construction of a GaN channel layer/a first AlGaN layer (buffer layer)/an AlN nucleation layer/a substrate, composition of the first AlGaN layer; $Al_xGa_{1-x}N$ is written as Al composition xb at an interface with the AlN nucleation layer, Al composition xt at an interface with the GaN channel layer, and Al composition x(z) as a function of a thickness (z) in a depth direction (Z axial direction) between them. In such a case, xb>xt holds, and it is assumed that Al composition x(z) reduces monotonically with an increase of the thickness (z) in a range of xb≥x(z)≥xt. That is, it is assumed that the Al composition x(z) of $Al_xGa_{1-x}N$ which forms the first AlGaN layer (buffer layer) monotonically decreases from the interface with the AlN nucleation layer toward an interface with the GaN channel layer to an interface with the GaN channel layer. In addition, with letting a film thickness of the whole first AlGaN layer (buffer layer) be $t_{buffer}$, the thickness (z) becomes $t_{buffer} \geq z \geq 0$.

In that case, the polarized charges σ(P(z)) in a position z among the first AlGaN layer (buffer layer) is expressed as a sum of the spontaneous polarization charges $\sigma(P_{sp}(z))$, and piezo polarized charges $\sigma(P_{pe}(z))$ at the position z.

$$\sigma(P(z)) = \sigma(P_{sp}(z)) + \sigma(P_{pe}(z)) \ (C/m^3)$$

$$\sigma(P_{sp}(z)) \equiv -\partial\{P_{sp}(z)\}/\partial z$$
$$= -\partial\{P_{sp}(x(z))\}/\partial z$$

$$\sigma(P_{pe}(z)) \equiv -\partial\{P_{pe}(z)\}/\partial z$$
$$= -\partial\{P_{pe}(x(z))\}/\partial z$$

In a range of $t_{buffer} \geq z \geq 0$ in the first AlGaN layer (buffer layer), the spontaneous polarization $P_{sp}(x(z))$ at the position z can be described in the following approximate expression:

$$P_{sp}(x(z)) \approx -0.029 - 0.052 \cdot x(z) \ (C/m^2)$$

hence, the spontaneous polarization charges $\sigma(P_{sp}(z))$ at the position z can be described in the following approximate expression.

$$\sigma(P_{sp}(z)) = -\partial\{P_{sp}(x(z))\}/\partial z$$
$$\approx 0.052 \cdot \partial x(z)/\partial z \ (C/m^3)$$

In addition, in z=0 (interface with the AlN nucleation layer), the spontaneous polarization $P_{sp}(AlN)$ in an AlN nucleation layer side is:

$$P_{sp}(AlN) = -0.081 \ (C/m^2)$$

spontaneous polarization $P_{sp}(xb)$ of Al composition xb of AlGaN at this interface is:

$$P_{sp}(xb) \approx -0.029 - 0.052 \cdot xb \ (C/m^2)$$

Although spontaneous polarization charges $\sigma(P_{sp}(0))$ at this interface is defined in:

$$\sigma(P_{pe}(0)) = -\nabla \cdot P_{pe}(0) \ (\nabla: \text{nabra operator})$$

since $P_{sp}(z)$ is discontinued, it is approximated as follows.

$$\sigma(P_{sp}(0)) = P_{sp}(AlN) - P_{sp}(xb)$$
$$\approx -0.081 - (-0.029 - 0.052 \cdot xb)$$
$$\approx -0.052 + 0.052 \cdot xb \ (C/m^2)$$

In addition, at $z=t_{buffer}$ (interface with the GaN channel layer), the spontaneous polarization $P_{sp}(GaN)$ in a GaN channel layer side is:

$$P_{sp}(GaN) = -0.029 \ (C/m^2)$$

Spontaneous polarization $P_{sp}(xt)$ of Al composition xt of AlGaN at this interface is:

$$P_{sp}(xb) \approx -0.029 - 0.052 \cdot xb \ (C/m^2)$$

Although spontaneous polarization charges $\sigma(P_{sp}(t_{buffer}))$ at this interface is defined in:

$$\sigma(P_{sp}(t_{buffer})) = -\nabla \cdot P_{sp}(t_{buffer}) \ (\nabla: \text{nabra operator})$$

since $P_{sp}(z)$ is discontinued, it is approximated as follows.

$$\sigma(P_{sp}(t_{buffer})) = P_{sp}(xt) - P_{sp}(GaN)$$
$$\approx (-0.029 - 0.052 \cdot xt) - (-0.029)$$
$$\approx -0.052 \cdot xt \ (C/m^2)$$

On the other hand, in $t_{buffer} > z > 0$ in the first AlGaN layer (buffer layer), the piezo polarized charges $\sigma(P_{pe}(z))$ at the position z is expressed as follows:

$$\sigma(P_{pe}(z)) \equiv -\partial\{P_{pe}(z)\}/\partial z$$
$$= -\partial\{P_{pe}(x(z))\}/\partial z$$

Using the piezo polarization $P_{pe}(x(z))$ expressed in the above-described approximate expression, it is possible to find its approximation value in the following form.

$$\sigma(P_{pe}(z)) \approx -\partial\{P_{pe}(x)\}/\partial x \cdot \partial x(z)/\partial z \ (C/m^3)$$

In addition, since the piezo polarization $P_{pe}(AlN)$ in an AlN nucleation layer side does not have lattice mismatching in z=0 (interface with the AlN nucleation layer), $$P_{pe}(AlN) = 0 \ (C/m^2)$$

Although piezo polarized charges $\sigma(P_{pe}(0))$ at this interface is defined in:

$$\sigma(P_{pe}(0)) = -\nabla \cdot P_{pe}(0) \ (\nabla: \text{nabra operator})$$

since $P_{sp}(z)$ is discontinued, it is approximated as follows.

$$\sigma(P_{pe}(0)) = P_{pe}(AlN) - P_{pe}(xb)$$
$$= 0 - P_{pe}(xb)$$
$$= -P_{pe}(xb) \ (C/m^3)$$

In addition, at $z=t_{buffer}$ (interface with the GaN channel layer), piezo polarization $P_{pe}(GaN)$ in a GaN channel layer side is:

$$P_{pe}(GaN) = -0.0306 \ (C/m^2)$$

Although piezo polarized charges (P at this interface is defined)) in:

$$\sigma(P_{pe}(t_{buffer})) = -\nabla \cdot P_{pe}(t_{buffer}) \ (\nabla: \text{nabra operator})$$

since $P_{pe}(z)$ is discontinued, it is approximated as follows.

$$\sigma(P_{pe}(t_{buffer})) \approx P_{pe}(xt) - P_{pe}(GaN)$$
$$\approx P_{pe}(xt) + 0.0306 \ (C/m^3)$$

When summarizing the above results, in $t_{buffer} > z > 0$ in the first AlGaN layer (buffer layer), the polarized charges $\sigma(P(z))$ at the position z is approximately expressed as follows:

$$\sigma(P(z)) = \sigma(P_{sp}(z)) + \sigma(P_{pe}(z))$$
$$\approx \{0.052 \cdot \partial x(z)/\partial z\} + \{-\partial\{P_{pe}(x)\}/\partial x \cdot \partial(z)/\partial z\} \ (C/m^3)$$

In addition, in z=0 (interface with the AlN nucleation layer), the following approximation can be applied thereto:

$$\sigma(P(0)) = \sigma(P_{sp}(0)) + \sigma(P_{pe}(0))$$
$$\approx -0.052 + 0.052 \cdot xb - P_{pe}(xb) \ (C/m^2)$$

In addition, in $z=t_{buffer}$ (interface with the GaN channel layer), the following approximation can be applied thereto:

$$\sigma(P(t_{buffer})) = \sigma(P_{sp}(t_{buffer})) + \sigma(P_{pe}(t_{buffer}))$$
$$\approx -0.052 \cdot xt + P_{pe}(xt) + 0.0306 \ (C/m^2)$$

Hereinafter, an example that, in the case of having construction of a GaN channel layer/a first AlGaN layer (buffer layer)/an AlN nucleation layer/a substrate, a thickness $t_{buffer}$ of the first AlGaN layer (buffer layer) is 1 μm (1000 nm), and the Al composition x(z) of $Al_xGa_{1-x}N$ which forms the first AlGaN layer linearly decreases from the interface with the AlN nucleation layer to an interface with the GaN channel layer. That is, an example that, it is Al composition xb at the interface with the AlN nucleation layer and Al composition xt at the interface with the GaN channel layer, and Al composition x(z) is expressed as follows, as a function of a thickness (z/μm) in a depth direction (Z axial direction) between them will be considered.

$$x(z)=xt \cdot z+xb \cdot (1-z)$$

Al composition xt at an interface with the GaN channel layer, Al composition xb at an interface with an AlN nucleation layer is variously selected from within 0.40≥xb≥0.05, thereafter, the polarized charge density σ(P) induced in the first AlGaN layer (buffer layer) is calculated (estimated) under the above-mentioned approximation. In such a case, at the interface with the GaN channel layer, and the interface with the AlN nucleation layer, the spontaneous polarization $P_{sp}$ and piezo polarization $P_{pe}$ become discontinuous, and the polarized charges σ(P) which are generated in these two hetero interfaces are calculated on the basis of discrete variations of the spontaneous polarization $P_{sp}$ and piezo polarization $P_{pe}$ as mentioned above.

Figure 8:
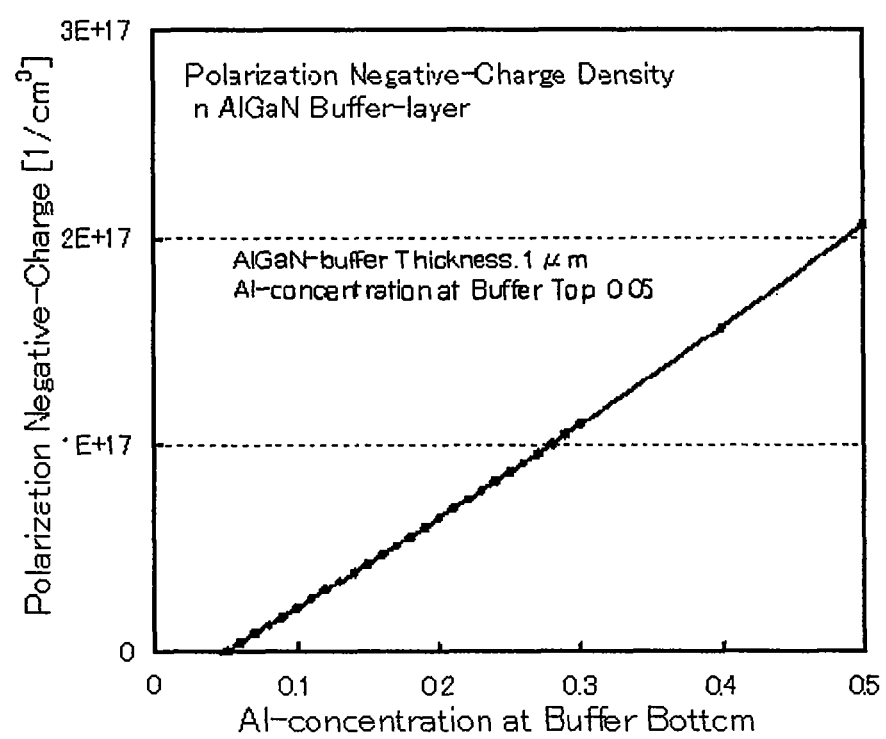
FIG. 8 is a graph illustrating a result of performing forecasting calculation of a negative polarized charge density generated in an AlGaN buffer layer which is given "Al composition modulation" theoretically with changing variously Al composition xb at an interface with an AlN nucleation layer of the other side on the condition of 1 μm of film thickness of the AlGaN buffer layer, and Al composition xt=0.05 at an interface with a GaN channel layer.

FIG. 8 shows the results of plotting the results of calculating the polarized charge density σ(P) induced in the first AlGaN layer (buffer layer) on the basis of the above-mentioned boundary conditions in a vertical axis: polarized charge density; σ(P)/e $cm^{-3}$ (where, e denotes an amount of an electronic charge (unit charge)) induced and in a horizontal axis: Al composition xb at the interface with the AlN nucleation layer. The polarized charge density σ(P)/e induced in the first AlGaN layer (buffer layer) is negative fixed electric charges, and the density becomes in the order of $10^{16}$ $cm^{-3}$. Generally, $Al_xGa_{1-x}N$ (0.50≥xb≥0) prepared by epitaxial growth becomes an $n^-$ layer where residual carrier concentration is about n=$10^{14}$ to $10^{15}$ $cm^{-3}$ in many cases, and hence, the positive charge density fixed as an impurity level in the semiconductor layer becomes about $10^{14}$ to $10^{15}$ $cm^{-3}$.

Figure 3:
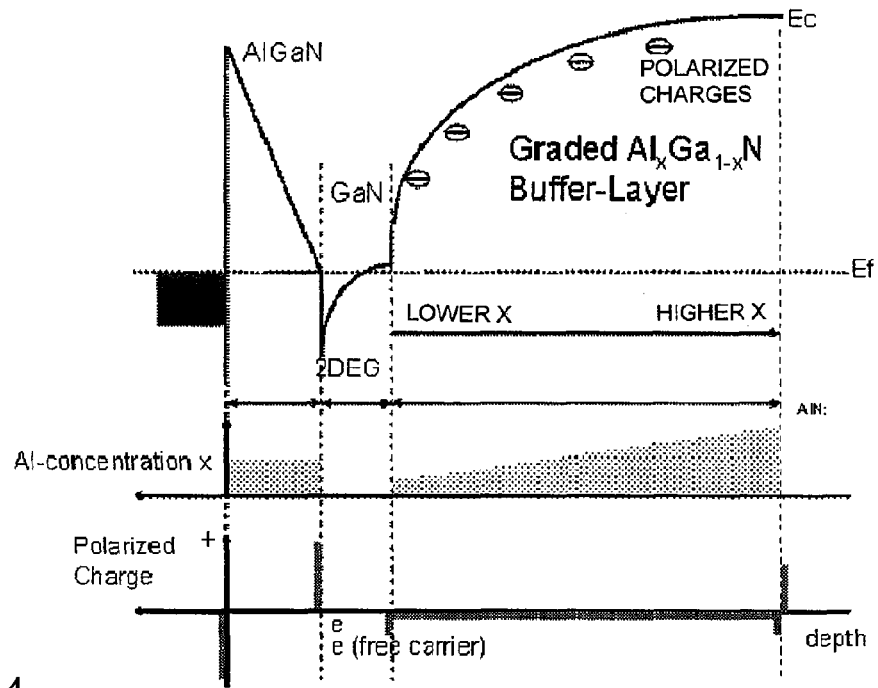
FIG. 3 is a diagram illustrating schematically a band diagram of a conduction band edge in multilayered epitaxial structure under a gate electrode of a heterojunction FET according to the second exemplary embodiment of the present invention, and in particular, an AlGaN/GaN-type HJFET. Reference symbol x illustrated in the drawing denotes Al composition in an AlGaN buffer layer which is given "Al composition modulation"
Figure 4:
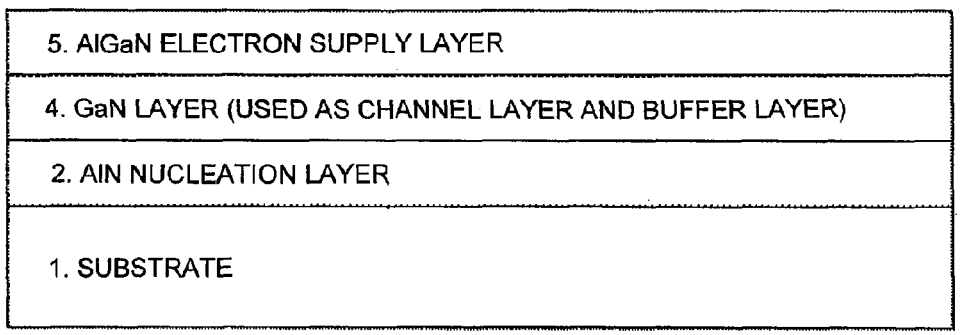
FIG. 4 is a sectional view illustrating schematically an example of structure of a multilayered epitaxial film for a conventional AlGaN/GaN-type HJFET using a GaN buffer layer.

As described above, when the Al composition x(z) of $Al_xGa_{1-x}N$ which forms the first AlGaN layer reduces linearly, the polarized charges (negative fixed electric charges) induced in the first AlGaN layer (buffer layer) "compensate" the positive fixed electric charges derived from an ionized impurity level corresponding to residual carrier concentration, and in consequence, it becomes what corresponds to a state that difference between both localizes as space charges in the first AlGaN layer (buffer layer). That is, polarized charge density σ(P)/e induced in the first AlGaN layer (buffer layer) is a negative fixed electric charge in the order of $10^{16}$ $cm^{-3}$, and it exceeds positive fixed electric charge density which is about $10^{14}$ to $10^{15}$ $cm^{-3}$ and is derived from the ionized impurity level, and as a result, it becomes in a state that "negative space charges" localize effectually in the first AlGaN layer (buffer layer). In other words, as described above, when the Al composition x(z) of $Al_xGa_{1-x}N$ which forms the first AlGaN layer reduces linearly, in consideration of a band diagram of construction of the GaN channel layer/first AlGaN layer (buffer layer)/AlN nucleation layer/substrate, the first AlGaN layer exhibits a function equivalent to a $p^-$ layer where residual carrier concentration is about p=$10^{15}$ to $10^{16}$ $cm^{-3}$. Hence, as shown in FIG. 3, in the band diagram, an energy position of a conduction band edge of the first AlGaN layer (buffer layer) decreases monotonically with showing a convex form from the interface with the AlN nucleation layer to the interface with the GaN channel layer.

In addition, at the interface with the AlN nucleation layer, and the interface with the GaN channel layer, polarized charges which are generated exist in the shape of sheet charges, and their sheet densities are to about $10^{12}$ (/$cm^2$) respectively. In such extent, an influence to a band form near the interfaces and channel carrier density stored in the GaN channel layer is not so great. It is because carriers by a two-dimensional electron gas induced by the AlGaN/GaN heterojunction in the normal AlGaN/GaN carrier HJFET (Al composition 0.2 etc.) have sheet charge concentration in the order of $10^{13}$ (/$cm^2$), which is about one-digit larger.

Figure 6:
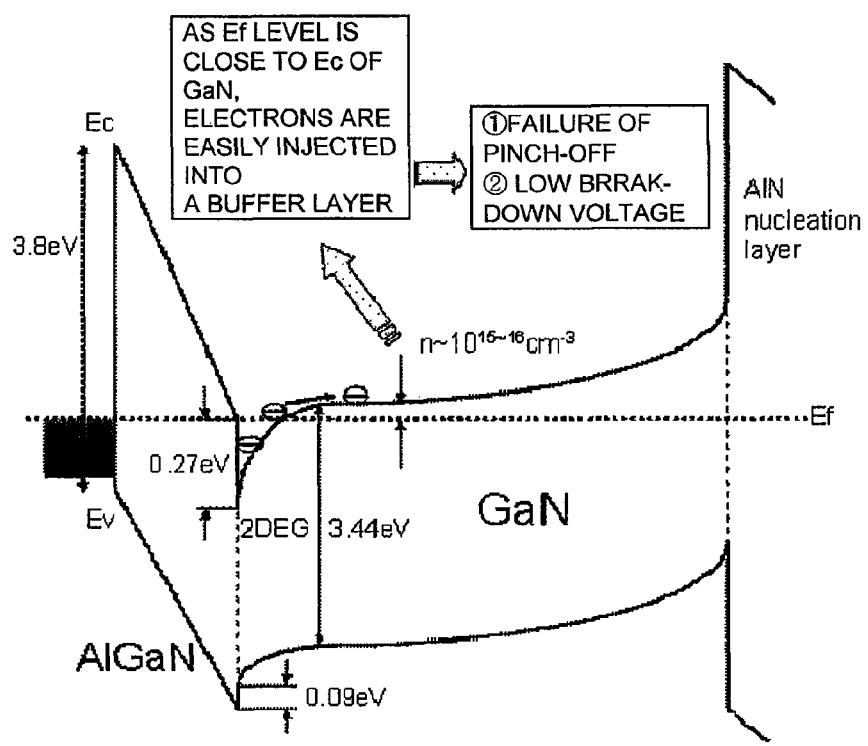
FIG. 6 is a diagram illustrating schematically a band diagram of a conduction band edge in multilayered epitaxial structure under a gate electrode of a conventional AlGaN/GaN-type HJFET using a GaN buffer layer.

Against the structure of the present invention, in a conventional GaN buffer layer or the AlGaN buffer layer which AlGaN where Al composition is constant forms, since the polarization P in the buffer layer does not change in a depth direction (Z axial direction), polarized charges are not generated in the buffer layer. Hence, in consideration of band diagrams of the construction of the GaN channel layer/GaN layer (buffer layer)/AlN nucleation layer/substrate, or the construction of the GaN channel layer/constant-composition AlGaN layer (buffer layer)/AlN nucleation layer/substrate, the GaN layer (buffer layer) or constant-composition AlGaN layer (buffer layer) functions as an $n^-$ layer which has, for example, residual carrier concentration of n=$10^{14}$ to $10^{15}$ $cm^3$ to the extent. Hence, as shown in FIG. 6, in the band diagram, an energy position of a conduction band edge of the GaN layer buffer layer or AlGaN buffer layer decreases monotonically with showing a concave form from the interface with the AlN nucleation layer to the interface with the GaN channel layer.

In the above, although an example that the Al composition x(z) of $Al_xGa_{1-x}N$ which forms the first AlGaN layer (buffer layer) reduces linearly is described in construction of the GaN channel layer/first AlGaN layer (buffer layer)/AlN nucleation layer/substrate, when Al composition x(z) of $Al_xGa_{1-x}N$ reduces monotonically (where, 0>∂x(z)/∂z), for example, when −0.05 $μm^{-1}$≥{∂x(z)/∂z} is maintained, the polarized charge density σ(P)/e induced in the first AlGaN layer (buffer layer) becomes at least $10^{16}$ $cm^{-3}$ to the extent, and the first AlGaN layer exhibits a function equivalent to a $p^-$ layer where residual carrier concentration is about p=$10^{15}$ to $10^{16}$ $cm^{-3}$. Alternatively, Al composition x(z) of $Al_xGa_{1-x}N$ is monotonically decreased fine-step-wise, for example, regarding a ratio Δx(z)/Δz of a variation Δx(z) of Al composition x(z) at each step and a width Δz of each step, when 0.05 $μm^{-1}$≥{Δx(z)/Δz} is maintained, the polarized charge density σ(P)/e induced in the first AlGaN layer (buffer layer) becomes at least $10^{16}$ $cm^{-3}$ to the extent, and hence, it is possible to make the first AlGaN layer exhibit a function equivalent to a $p^-$ layer where residual carrier concentration is about p=$10^{15}$ to $10^{16}$ $cm^3$.

So as to perform the above description, in the construction of the GaN channel layer/first AlGaN layer (buffer layer)/AlN nucleation layer/substrate, when the Al composition x(z) of $Al_xGa_{1-x}N$ which forms the first AlGaN layer (buffer layer) is reduced monotonically, and, for example, an effective reduction percentage ∂x(z)/∂z (or Δx(z)/Δz) is made to be maintained in −0.05 $μm^{-1}$≥{∂x(z)/∂z}, the polarized charge density σ(P)/e induced in the first AlGaN layer (buffer layer) becomes at least $10^{16}$ $cm^{-3}$ to the extent, and hence, it is possible to make the first AlGaN layer exhibit a function equivalent to a $p^-$ layer where residual carrier concentration is at least p=$10^{15}$ to $10^{16}$ $cm^{-3}$. That is, as shown in FIG. 3, in the band diagram, it is possible to make an energy position of a conduction band edge of the first AlGaN layer (buffer layer) decrease monotonically with showing a convex form from the interface with the AlN nucleation layer to the interface with the GaN channel layer. In the state, as exemplified in FIG. 3, in addition to a barrier (step) corresponding to discontinuity $\Delta E_c$ of conduction band energy which exists at the interface between the GaN channel layer and first AlGaN layer (buffer layer), and following it, it becomes in a state that the energy position of the conduction band edge also exhibits a large gradient. For this reason, when a reverse bias is applied to a gate electrode, the electron injection from the GaN channel layer to the first AlGaN layer (buffer layer) is suppressed effectively. Hence, in the HJFET acquired, improvement in a buffer layer break-down voltage is expected.

Of course, a barrier (step) corresponding to discontinuity $\Delta E_c$ of the conduction band energy which exists at the interface between the GaN channel layer and first AlGaN layer (buffer layer) has a large contribution in improvement in the carrier confinement effect to a two-dimensional electron gas formed in the GaN channel layer.

Nevertheless, when a film thickness of the channel layer is thicker than a film thickness necessary for a HEMT operation, that is, when it is greatly thicker than the width of an existing region of the two-dimensional electron gas accumulated at the interface between the channel layer and electron supply layer, it become in a state that carriers (electrons) can be localized at the interface between the above-mentioned channel layer and buffer layer. Hence, carriers supplied from a shallow donor level which exists in the buffer layer become in a state of not contributing to the two-dimensional electron gas accumulated at the interface between the channel layer and electron supply layer. Alternatively, a part of carriers supplied from the electron supply layer are not accumulated at the interface between the channel layer and electron supply layer, but they may also become in a state of localizing at the interface between the channel layer and buffer layer. In this state, also even when a bias voltage is applied to a gate electrode to remove the two-dimensional electron gas accumulated at the interface between the channel layer and electron supply layer, the carriers (electrons) localized at the interface between the channel layer and buffer layer may also remain. In that case, it has an influence of parallel conduction resulting from the carriers (electrons) which are localized at the interface between the channel layer and buffer layer, and becomes a factor of a poor break-down voltage and a pinch-off defect.

Hence, it is desirable to avoid a phenomenon that carriers (electrons) are localized also at the interface between the channel layer and buffer layer besides the two-dimensional carrier gas (two-dimensional electron gas) which limits a film thickness of the channel layer and is accumulated at the interface between the channel layer and electron supply layer. A two-dimensional electron gas accumulated at the interface between the channel layer and electron supply layer in the case of providing a gate electrode on a surface of the electron supply layer to form HEMT structure is thermally distributed over a plurality of bound levels at its operating temperature, and as for this two-dimensional electron gas, a mean of translational energy in a thickness direction becomes about ½kT (k denotes a Boltzmann's constant and T denotes about 300K temperature). Hence, although a de Broglie wavelength $\lambda$ derived from thermal movement of the two-dimensional electron gas thermally distributed over a plurality of bound levels is dependent on surface density of the two-dimensional electron gas accumulated when performing forecasting calculation of a thermal distribution on the plurality of these bound levels, it is equivalent to about 10 nm to 12 nm (about 100 to 120 Å). When the film thickness of the channel layer is selected in a range of 5 times or less of de Broglie wavelength $\lambda$ of this two-dimensional electron gas, it is possible to avoid a state that a plurality of bound levels are formed independently respectively at the interface between the channel layer and electron supply layer, and the interface between the channel layer and buffer layer. That is, in the range that the film thickness of the channel layer does not exceed 5 times of de Broglie wavelength $\lambda$ of this two-dimensional electron gas, carriers (electrons) accumulated into the channel layer become in a state of being distributed in a plurality of unified bound levels which is formed in a potential well where the interface between the channel layer and electron supply layer, and the interface between the channel layer and buffer layer are barriers. In this state, there does not arise a phenomenon that, also even when a bias voltage is applied to a gate electrode to remove the two-dimensional electron gas accumulated at the interface between the channel layer and electron supply layer thereafter, the carriers (electrons) localized at the interface between the channel layer and buffer layer remain. In consequence, the influence of parallel conduction resulting from the carriers (electrons) which are localized at the interface between the channel layer and buffer layer is avoided, and it does not become a factor of a poor break-down voltage and a pinch-off defect.

With making de Broglie wavelength $\lambda$ derived from thermal movement of the two-dimensional electron gas accumulated at the interface between the channel layer and electron supply layer a standard when HEMT structure is formed, that is, the film thickness of the channel layer is selected in the range of not exceeding 5 times of de Broglie wavelength $\lambda$ of electrons forming this two-dimensional electron gas. However, since it is technically meaningless to select the film thickness of the channel layer which is far smaller than one half of de Broglie wavelength $\lambda$ of electrons which forms the two-dimensional electron gas, it is selected in the range of not being smaller than one half of de Broglie wavelength $\lambda$. Generally, when HEMT structure is formed, it is preferable to select the film thickness of the channel layer in the range of one-half to twofold inclusive of de Broglie wavelength $\lambda$ of electrons which forms two-dimensional electron gas, and it is more preferably to select it in the range of 3/2 times or less of de Broglie wavelength $\lambda$ of electrons.

In addition, when de Broglie wavelength $\lambda$ of electrons, which forms two-dimensional electron gas, is set at about 10 nm to 12 nm (about 100 to 120 Å) as mentioned above, it is desirable to select the film thickness of the channel layer at least in the range of 5 nm to 60 nm, preferably, in the range of 5 nm to 25 nm, and more preferably, in the range of 5 nm to 15 nm.

In addition, in the case of a high-frequency field-effect transistor (FET), its operating frequency is selected in the range of a microwave band of about 1 GHz and a millimeter wave frequency band even extending to a W band. In the high-frequency FET, gate length Lg is one of device structure factors which determine a lower limit of switching time when the FET can have an effective gain, that is, minimum switching time $\tau$ of the FET. In addition, when the FET is used as an amplifier, an upper limit $f_{opr}$ of a frequency at which it can operate effectively as an amplifier depends on the minimum switching time $\tau$ of the above-mentioned FET. Generally, this upper limit $f_{opr}$ of a frequency, at which it can operate effectively as an amplifier and minimum switching time $\tau$ of an FET has relationship of $f_{opr}=1/(2\pi\tau)$.

On the other hand, although the minimum switching time $\tau$ of the FET itself is dependent also on a circuit type and an operational mode of the FET, it has relationship of mostly $\tau \approx 1/(\pi f_T)$ with a current gain cut-off frequency $f_T$ of the FET. Furthermore, the current gain cut-off frequency: $f_T$ in the HJFET with HEMT structure is dependent on peak drift velocity $V_{sat}$ of channel electrons under a high electric field, and the gate length Lg, and can be usually expressed as $f_T=V_{sat}/(2\pi Lg)$. Hence, minimum switching time $\tau$ in the HJFET with HEMT structure can be expressed as $\tau \approx 1/(\pi f_T)= 2Lg/V_{sat}$.

When achieving upper limit: $f_{opr}$ of a target operating frequency in the HJFET with HEMT structure, it is necessary to make minimum switching time $\tau$ in the FET into tau$\leq 1/(2\pi f_{opr})$, that is, it is necessary to set it as $(2Lg/V_{sat})\leq 1/(2\pi f_{opr})$. Hence, in the HJFET with HEMT structure, it is necessary to select the gate length Lg so that $Lg \leq V_{sat}/(4\pi f_{opr})$ may be fulfilled.

For example, in an AlGaN/GaN heterojunction FET with HEMT structure, when it is construction that the FET is made to operate in a depletion mode (normally-on), it is possible to measure drift velocity $V_{sat}$ of channel electrons under the high electric field about the two-dimensional electron gas accumulated at the interface between the electron supply layer and channel layer in the actual FET on the condition of grounding the gate electrode. A measurement result in the actual FET becomes drift velocity $V_{sat}$ of the channel electrons measured in a state of including parasitic parameters including a fringing component. For example, in the two-dimensional electron gas with sheet carrier concentration of $9.50 \times 10^{12}$ cm$^{-2}$ and mobility of 1600 cm$^2$/Vs, the drift velocity $V_{sat}$ of channel electrons under a high electric field (in this system, electric field strength E=$2 \times 10^5$ V/cm approximately) is calculated to be $V_{sat} \approx 1.1 \times 10^7$ (cm/s) on the basis of a measurement result. Hence, when upper limit $f_{opr}$ of a target operating frequency is selected at 26.5 GHz corresponding to a Ka band of a submillimeter wave, it is necessary that gate length Lg in the AlGaN/GaN heterojunction FET with HEMT structure with the construction of making it operate in the depletion mode (normally-on) is selected in the range of Lg$\leq$0.33 μm.

Furthermore, in a GaN-type FET for millimeter wave or submillimeter wave band where the construction of making it operate in the depletion mode (normally-on) is selected, in order to relieve a short channel effect, it is preferable to perform selection so that aspect ratio Lg/a of gate length Lg and an active layer thickness a, defined as a total of a film thickness of the electron supply layer and a film thickness of the channel layer directly under the gate electrode may fulfill Lg/a$\geq$5 as mentioned above.

Temporarily, when selecting gate length Lg at Lg=0.33 μm (330 nm) in an AlGaN/GaN heterojunction FET with HEMT structure with the construction of making it operate in the depletion mode (normally-on), in order to fulfill Lg/a$\geq$5, it is necessary to select the active layer thickness a in the range of a$\leq$66 nm. Furthermore, it is desirable to select gate length Lg which is shorter than the above-mentioned upper limit, and specifically, when gate length Lg is selected in the range of 250 nm to 150 nm, it is preferable to select the active layer thickness a directly under the gate electrode in the range of 50 nm to 30 nm.

Of course, since a Schottky junction is formed at an interface between the gate electrode and electron supply layer, a depletion layer is formed because of barrier height $\Phi_B$ (eV) of this Schottky junction. For example, in an AlGaN/GaN heterojunction FET with HEMT structure with construction of making it operate in a depletion mode (normally-on state), when barrier height $\Phi_B$ (eV) of the Schottky junction is about 0.9 eV, where the gate electrode is grounded (state that a gate voltage is 0 V), the electron supply layer is depleted, but it is necessary that the channel layer is not depleted. In order to fulfill these requirements, it is preferable to select the film thickness of the electron supply layer directly under the gate electrode in the range of at least not less than 20 nm, and preferably to select it in 20 nm to 30 nm. Saying in other words, when gate length Lg is selected in the range of 250 nm to 150 nm, so as to fulfill Lg/a$\geq$5 about aspect ratio Lg/a directly under the gate electrode, it is desirable to select the film thickness of the electron supply layer directly under the gate electrode in the range of 20 nm to 30 nm, and it is preferable to select a film thickness of the film thickness of the channel layer in the range of 5 nm to 25 nm, and more preferable to select it in the range of 5 nm to 15 nm.

In addition, in an AlGaN/GaN heterojunction FET with HEMT structure with the construction of making it operate in the depletion mode (normally-on state), when the film thickness of the electron supply layer is selected in the above-mentioned range, it is usually preferable that residual carrier concentration (concentration of an ionized shallow donor level) of the electron supply layer is in the range of $5 \times 10^{15}$ cm$^{-3}$ to $1 \times 10^{17}$ cm$^{-3}$. When making it operate at least in the depletion mode (normally-on state), when the HEMT structure is formed and a film thickness of the electron supply layer is selected in the above-mentioned range, so as to make two-dimensional electron gas accumulated at the interface between the electron supply layer and channel layer, it is not desirable to make "negative" space charges, resulting from the ionized acceptor level, exist in the whole electron supply layer. Similarly, it is also not desirable to give "composition modulation" in the electron supply layer to produce a situation that "negative" polarized charges are continuously distributed. Hence, an epitaxial film with constant composition which is not given the "composition modulation" is usually used for an electron supply layer.

In addition, in an AlGaN/GaN heterojunction FET with HEMT structure with the construction of making it operate in the depletion mode (normally-on state), so as to make sheet charge density of two-dimensional electron gas, accumulated at the interface between the above-mentioned electron supply layer and channel layer, at least not less than $1 \times 10^{12}$ (cm$^{-2}$) in a state that the gate electrode is grounded (state that a gate voltage is 0 V), it is preferable to select discontinuity $\Delta E_C$ of conduction band energy at the interface between the electron supply layer and channel layer at least in the range of $\Delta E_C \geq 0.2$ eV.

In addition, in an AlGaN/GaN heterojunction FET with HEMT structure with the construction of making it operate in the depletion mode (normally-on state), the sheet charge density of two-dimensional electron gas accumulated at the interface between the above-mentioned electron supply layer and channel layer is reduced by applying a reverse voltage to the gate electrode. This gate voltage necessary for making the sheet charge density of two-dimensional electron gas into zero is equivalent to threshold voltage $V_T$ (V). Specifically, in an AlGaN/GaN heterojunction FET with the HEMT structure where AlGaN where residual carrier concentration (concentration of the ionized shallow donor level: $N_d$ is constant and Al composition is constant is adopted as the electron supply layer, the gate voltage at which a conduction band edge of the channel layer at the interface between the above-mentioned electron supply layer and channel layer coincides with Fermi level Ef is equivalent to threshold voltage $V_T$ (V). As for the state, although the electron supply layer is depleted completely, it is possible to approximately express that the channel layer becomes in a flat band state. That is, in the electron supply layer, positive polarized charges (sheet charge density: NS) which are generated at the interface between the electron supply layer and channel layer and are equivalent to polarization difference between both layers exist as space charges, and positive charges resulting from ionized shallow donors (concentration of the ionized shallow donor level: $N_d$ exist inside the electron supply layer. Hence, threshold voltage $V_T$ (V) fulfills the following relational expression.

$$\Phi_B/q - V_T = \Delta E_C/q + (q/\in_B) \cdot \{(N_S \cdot t_B) + (N_d \cdot t_B^2/2)\}$$

where, q denotes unit electric charge of an electron ($1.6 \times 10^{-19}$ C), $\Phi_B$ (eV) denotes a barrier height of a Schottky junction formed between the gate electrode and electron supply layer, $E_B$ denotes a dielectric constant of AlGaN which forms the electron supply layer, $t_B$ denotes a film thickness of the electron supply layer directly under the gate electrode, and $\Delta E_C$ (eV) denotes discontinuity of conduction band energy at the interface between the electron supply layer and channel layer. In addition, dielectric constant $E_B$ of AlGaN which forms the electron supply layer is expressed as $\in_B = \in_r \cdot \in_0$ by dielectric constant $E_r$ of this AlGaN and dielectric constant $\in_0$ ($\in_0 = 8.854 \times 10^{-12}$ Fm$^{-1}$) of vacuum.

For example, when AlGaN with Al composition of 0.20 is used for the electron supply layer, $\Delta E_C$(eV)=0.266 eV, and sheet charge density: $N_S$ of positive polarized charges which are generated at the interface between the electron supply layer and channel layer becomes $N_S = 1.073 \times 10^{13}$ cm$^{-2}$. In such a case, when barrier height: $\Phi_B$(eV) of the Schottky junction is 0.9 eV, and film thickness: $t_B$ of the electron supply layer directly under the gate electrode is 20 nm, it is estimated respectively that threshold voltage $V_T$ (V) is $V_T$(V)=−2.54 V when concentration $N_d$ of the ionized shallow donor level in the electron supply layer is $1 \times 10^{15}$ cm$^{-3}$, and threshold voltage $V_T$(V) is $V_T$(V)=−2.57 V in the case of $N_d = 1 \times 10^{17}$ cm$^{-3}$. That is, it becomes the HEMT structure having the construction of making it operate in the depletion mode (normally-on state) and having the above-described threshold voltage $V_T$ (V).

On the other hand, when AlGaN with Al composition of 0.15 is used for the electron supply layer, $\Delta E_C$ (eV)=0.1953 eV, and sheet charge density: $N_S$ of positive polarized charges which are generated at the interface between the electron supply layer and channel layer becomes $N_S = 7.95 \times 10^{12}$ cm$^{-2}$. In such a case, when barrier height: $\Phi_B$(eV) of the Schottky junction is 0.9 eV, and film thickness: $t_B$ of the electron supply layer directly under the gate electrode is 5 nm, it is estimated respectively that threshold voltage $V_T$(V) is $V_T$(V)=+0.12 V when concentration $N_d$ of the ionized shallow donor level in the electron supply layer is $1 \times 10^{15}$ cm$^{-3}$, and threshold voltage $V_T$(V) is $V_T$(V)=+0.11 V in the case of $N_d = 1 \times 10^{17}$ cm$^{-3}$. That is, it becomes the HEMT structure having the construction of making it operate in an enhancement mode (normally-off state) and having the above-described threshold voltage $V_T$(V).

As mentioned above, although threshold voltage $V_T$ (V) becomes a reverse bias in the AlGaN/GaN heterojunction FET with HEMT structure with the construction of making it operate in the depletion mode (normally-on state), when the above-mentioned reverse bias is applied to the gate electrode, it is necessary to avoid that a tunnel current which penetrates the electron supply layer flows into the channel layer from the gate electrode. In order to avoid generation of this tunnel current, it is necessary to make film thickness $t_B$ of the electron supply layer, which functions as its barrier, directly under the gate electrode be not less than 4 nm usually.

In addition, also in an AlGaN/GaN heterojunction FET with HEMT structure with the construction of making it operate in the enhancement mode (normally-off state), it is usually preferable that residual carrier concentration (concentration of an ionized shallow donor level) of the electron supply layer is in the range of $5 \times 10^{15}$ cm$^{-3}$ to $1 \times 10^{17}$ cm$^{-3}$. When making it operate at least in the enhancement mode (normally-off state), when the HEMT structure is formed and a forward bias at 0.9 V or less is applied to the gate electrode, so as to make two-dimensional electron gas accumulated at the interface between the electron supply layer and channel layer, it is not desirable to make "negative" space charges, resulting from the ionized acceptor level, exist in the whole electron supply layer. Similarly, it is also not desirable to give "composition modulation" in the electron supply layer to produce a situation that "negative" polarized charges are continuously distributed. Hence, an epitaxial film with constant composition which is not given the "composition modulation" is usually used for an electron supply layer.

Specifically, in the AlGaN/GaN heterojunction FET with HEMT structure with construction of making it operate in the enhancement mode (normally-off state), when barrier height $\Phi_B$ (eV) of the Schottky junction is about 0.9 eV, where the gate electrode is grounded (state that a gate voltage is 0 V), it is necessary to produce a state that current does not flow in essence even if a voltage is applied between a source and a drain. Hence, when barrier height $\Phi_B$ (eV) of the Schottky junction is about 0.9 eV, where the gate electrode is grounded (state that a gate voltage is 0 V), it is necessary that not only the electron supply layer is depleted but also the channel layer is depleted.

In such a case, for example, when each of residual carrier concentration (concentration of the ionized shallow donor level) of the electron supply layer and residual carrier concentration (concentration of the ionized shallow donor level) of the channel layer is at least $5 \times 10^{15}$ cm$^{-3}$, when barrier height $\Phi_B$ (eV) of the Schottky junction is about 0.9 eV, active layer thickness a defined as a total of the film thickness of the electron supply layer, and the film thickness of the channel layer directly under the gate electrode can be selected in the range of 10 nm a 30 nm. In addition, so as to generate accumulation of two-dimensional electron gas at the interface between the above-described electron supply layer and channel layer when the forward bias of 0.2V to 0.9V inclusive is applied to the gate electrode, when residual carrier concentration (concentration of the ionized shallow donor level) of the electron supply layer is $5 \times 10^{15}$ cm$^{-3}$, it is necessary to select the film thickness of the electron supply layer directly under the gate electrode in the range of 5 nm to 15 nm, Furthermore, when the residual carrier concentration (concentration of the ionized shallow donor level) of the electron supply layer is $1 \times 10^{17}$ cm$^{-3}$ and the residual carrier concentration (concentration of the ionized shallow donor level) of the channel layer is $5 \times 10^{15}$ cm$^{-3}$, when barrier height $\Phi_B$ (eV) of the Schottky junction is about 0.9 eV, active layer thickness a defined as a total of the film thickness of the electron supply layer, and the film thickness of the channel layer directly under the gate electrode can be selected in the range of 10 nm a 30 nm. In addition, so as to generate accumulation of two-dimensional electron gas at the interface between the above-described electron supply layer and channel layer when the forward bias of 0.2V to 0.9V inclusive is applied to the gate electrode, when residual carrier concentration (concentration of the ionized shallow donor level) of the electron supply layer is $1 \times 10^{17}$ cm$^{-3}$, it is necessary to select the film thickness of the electron supply layer directly under the gate electrode in the range of 5 nm to 10 nm.

In addition, also in an AlGaN/GaN heterojunction FET with HEMT structure with the construction of making it operate in the enhancement mode (normally-off state), so as to make sheet charge density of two-dimensional electron gas, accumulated at the interface between the above-mentioned electron supply layer and channel layer, at least not less than $1 \times 10^{12}$ (cm$^{-2}$) by applying a forward bias to the gate electrode as mentioned above, it is preferable to select discontinuity $\Delta E_C$ of conduction band energy at the interface between the electron supply layer and channel layer at least in the range of $\Delta E_C \geq 0.2$ eV.

When using $Al_xGa_{1-x}N$ (x is $0.1 \leq x \leq 0.3$) as the electron supply layer, as for barrier height: $\Phi_B$ (eV) of the Schottky junction formed between the gate electrode and electron supply layer, about 0.9 eV generally becomes an upper limit. Therefore, so as to fulfill a condition: $\Phi_B/q \geq \Delta E_C/q + (q/E_B) \cdot \{(N_S \cdot t_B) + (N_d \cdot t_B^2/2)\}$ for achieving the HEMT structure with the construction of making it operate in the enhancement mode (normally-off state), it is not possible to enlarge $\{(N_S \cdot t_B) + (N_d \cdot t_B^2/2)\}$. On the other hand, it is hard to make film thickness: $t_B$ of the electron supply layer thinner than a lower limit of 4 nm, and as a result, it becomes hard to enlarge the sheet charge density (nS) of two-dimensional electron gas accumulated at the interface between the electron supply layer and channel layer in an ON state of an enhancement mode operation. In order to enlarge the sheet charge density (nS) of two-dimensional electron gas accumulated at the interface between the electron supply layer and channel layer in the ON state, it is effective to make high barrier height: $\Phi_B$ (eV) of the Schottky junction formed between the gate electrode and electron supply layer. For example, when using $In_xAl_{1-x}N$ (x is $0.1 \times 0.25$) instead of $Al_xGa_{1-x}N$ (x is $0.1 \times 0.3$) as the electron supply layer and using an InAlN/GaN heterojunction FET, it is possible to make barrier height: $\Phi_B$ (eV) of the Schottky junction higher.

In the field-effect transistor according to the present invention, when selecting the construction of making it in the depletion (normally-on) mode, a substrate itself is a material which does not exhibit a polarization effect, and in a state that both of the gate electrode and substrate are grounded, polarized charges which exist in a semiconductor layer region are in a state that "negative" polarized charges (Q1) are usually distributed at the interface between the electron supply layer with constant composition and the gate electrode (metal) on a surface, and "positive" polarized charges (Q2) are usually distributed at the interface between the electron supply layer with constant composition, and the channel layer, and, when composition of an electron supply layer is not constant", "positive" or "negative" polarized charges ($\tau Q_{supplier}$) distributed in the electron supply layer according to a local composition rate of changes are distributed, "negative" polarized charges (Q3) are distributed at the interface between the channel layer and a "composition-modulated" buffer layer, "negative" polarized charges continuously distributed over a whole internal area of the "composition modulated" buffer layer ($\tau Q_{buffer}$) are distributed, "negative" polarized charges (Q4) are distributed at the interface of the "composition modulated" buffer layer with an AlN nucleation layer, and "positive" polarized charges (Q5) are distributed at the interface of the AlN nucleation layer with a substrate surface, respectively.

On the other hand, the electron supply layer itself is depleted and the "positive" space charges ($\Sigma Q_{SD1}$), resulting from the ionized donor level, exist inside this electron supply layer. In addition, the shallow donor level included in the "composition modulated" buffer layer is also ionized, and the "positive" space charges ($\Sigma Q_{SD2}$) derived from the ionized donor level also exist inside the "composition modulated" buffer layer.

In addition, a surface of the electron supply layer is covered with the gate electrode (metal) and a dielectric film as a passivation film in both sides of the gate electrode (metal). In many cases, in the surface of the electron supply layer which contacts the gate electrode (metal) and the surface of the electron supply layer which contacts the passivation film, relatively deep surface levels (deep donor levels) exist, and these deep surface levels (deep donor levels) are also ionized. In consequence, in the surface of the electron supply layer which contacts the gate electrode (metal) and the surface of the electron supply layer which contacts the passivation film, "positive" surface charges ($Q_{SS}$) derived from the ionized deep surface levels (deep donor levels) exist.

Electrical neutrality condition is fulfilled by "positive" space charges (or "negative" space charge resulting from the ionized acceptor level) resulting from these ionized donor levels and being immobilized, "positive" surface charges localized in the surface of the electron supply layer which contacts the gate electrode (metal) and the surface of the electron supply layer which contacts the passivation film, and polarized charges which exist in the semiconductor layer region, and the carriers (electrons) accumulated in the channel layer.

Usually, "negative" polarized charges (Q1) which are generated at the interface between the electron supply layer and surface gate electrode (metal) are in the state of being almost compensated by the "positive" surface charges ($Q_{SS}$) which are localized in the surface of the electron supply layer, which contacts the gate electrode (metal) (and the surface of the electron supply layer which contacts the passivation film). That is, it becomes Q1$\approx Q_{SS}$.

Furthermore, with considering that the "positive" space charges ($\Sigma Q_{SD2}$) derived from the ionized donor level which exists in the "composition modulated" buffer layer are few, the "negative" polarized charges (Q3) generated at the interface between the channel layer and "composition modulated" buffer layer, the "negative" polarized charges continuously distributed over the whole internal area of the "composition modulated" buffer layer ($\Sigma Q_{buffer}$), and the "negative" polarized charges (Q4) generated at the interface of the "composition modulated" buffer layer with an AlN nucleation layer are in a state of being almost compensated by the "positive" polarized charges (Q5) which are generated at the interface in an AlN nucleation layer side. That is, $(Q5+\Sigma Q_{SD2})=(Q3+\Sigma Q_{buffer}+Q4)$ holds.

In addition, a total amount ($\Sigma Q_C$) of the carriers (electrons) accumulated in the channel layer becomes approximately equal to an arithmetic sum $(Q2+\Sigma Q_{SD1})$ of the "positive" polarized charges (Q2) which are generated at the interface between the electron supply layer and channel layer, and the "positive" space charges ($\Sigma Q_{SD1}$) (or "negative" space charge resulting from the ionized acceptor level) resulting from ionized donor levels inside the electron supply layer. That is, $(\Sigma Q_C)=(Q2+\Sigma Q_{SD1})$ holds.

An overall electrical neutrality condition becomes $(Q5+\Sigma Q_{SD2})+(Q2+\Sigma Q_{SD1})=(Q3+\Sigma Q_{buffrt}+Q4)+(\Sigma Q_C)$. For example, when the positive polarized charges (Q5) which are generated in an underlying layer (interface in an AlN nucleation layer side) of the buffer layer are compensated with electrons, such as hot carriers injected by a certain cause and Q5 reduces, so as to maintain the above-mentioned electrical neutrality condition, the total amount ($\Sigma Q_C$) of the carriers (electrons) accumulated in the channel layer reduces. When Q5 disappears completely temporarily, the total amount ($\Sigma Q_C$) of the carriers (electrons) accumulated in the channel layer becomes $(\Sigma Q_C)=(\Sigma Q_{SD2})+(Q2+\Sigma Q_{SD1})-(Q3+\Sigma Q_{buffer}+Q4)$. In such a case, with considering that the "positive" space charges ($\Sigma Q_{SD2}$) derived from the ionized donor level which exists in the "composition modulated" buffer layer are few, the total amount ($\Sigma Q_C$) of the carriers (electrons) accumulated in the channel layer is lowered approximately to a level of $(\Sigma Q_C)=(Q2+\Sigma Q_{SD1})-(Q3+\Sigma Q_{buffer}+Q4)$. A sufficient condition that the total amount ($\Sigma Q_C$) of the carriers (electrons) accumulated in the channel layer is not drained also in this phase is expressed as $(Q2+\Sigma Q_{SD1})>(Q3+\Sigma Q_{buffer}+Q4)$. That is, as a general condition, it becomes the sufficient condition that the sum total $(Q2+\Sigma Q_{SD1})$ of the "positive" charges which are generated in the electron supply layer is more than the sum total $(Q3+\Sigma Q_{buffer}+Q4)$ of the "negative" charges which are generated inside the "composition modulated" buffer layer and at the interface with the channel layer.

When a field-effect transistor is formed, when a reverse bias is applied to a gate electrode, with following on electron injection from a GaN channel layer to a first AlGaN layer (buffer layer) being suppressed effectively, a pinch-off characteristic is improved. In addition, with using together selection of such "composition modulated" AlGaN layer (buffer layer) and a measure of setting an aspect ratio: Lg/a of gate length Lg to active layer thickness a (gate-to-channel distance; sum of a thickness of AlGaN electron supply layer 5 and a thickness of GaN channel layer 4) at 5 or more, it is possible to achieve a better pinch-off characteristic. If possible, when applying device structure of using together a measure of setting the aspect ratio: Lg/a at 10 or more, it is possible to achieve more secure suppression of the short channel effect in a GaN-type FET for millimeter-wave band or a GaN-type FET for submillimeter-wave band.

It can be explained that, because of the above-mentioned effects, the GaN-type HJFET according to the present invention can achieve large improvement also in respect of a DC gain or an RF gain in the case of high voltage operation.

The above describes the principle which brings about its effects regarding the example of the "Al composition modulated" AlGaN layer (buffer layer) in which the C plane ((0001) plane) growth is performed, and Al composition x(z) of $Al_xGa_{1-x}N$ reduces monotonically from the interface with the AlN nucleation layer to the interface with the GaN channel layer in the construction of the GaN channel layer/first AlGaN layer (buffer layer)/AlN nucleation layer/substrate.

Similarly, the same effect can be achieved also when selecting the "Al composition modulated" $Al_x(In_yGa_{1-y})_{1-x}N$ layer (buffer layer) in which the C plane ((0001) plane) growth is performed, and Al composition x(z) of $Al_x(In_yGa_{1-y})_{1-x}N$ reduces monotonically from the interface with the AlN nucleation layer toward the interface with the $In_yGa_{1-y}N$ channel layer to the interface with the $In_yGa_{1-y}N$ channel layer using the Al(InGa)N layer which is made up of $Al_x(In_yGa_{1-y})_{1-x}N$ as the buffer layer in the construction (where, $1>y\geq 0$) of the $In_yGa_{1-y}N$ channel layer/buffer layer/AlN nucleation layer/substrate. Also in this case, it is more preferable that $\Delta E_c > 2$ kT (k denotes a Boltzmann's constant and T denotes temperature of about 300K) or the like is provided as a barrier (step) corresponding to discontinuity $\Delta E_C$ of conduction band energy at the interface between the Al(InGa)N layer (buffer layer) and $In_yGa_{1-y}N$ channel layer. Hence, it is preferable to select Al composition x(z):xt of $Al_x(In_yGa_{1-y})_{1-x}N$ at the interface with the $In_yGa_{1-y}N$ channel layer so as to become in the range of discontinuity $\Delta E_C$ of the above-mentioned conduction band energy. In addition, when Al composition x(z) of $Al_x(In_yGa_{1-y})_{1-x}N$ reduces monotonically, it is preferable to maintain, for example, its effective percentage reduction $\partial x(z)/\partial z$ (or $\delta x(z)/\delta z$) in $-0.05\ \mu m^{-1} \geq \{\partial x(z)/\partial z\}$, In such a case, it is possible to adopt a method of performing a monotone decrease fine step-wise as an aspect that Al composition x(z) of $Al_x(In_yGa_{1-y})_{1-x}N$ reduces effective monotonically.

In the construction of the GaN channel layer/"Al composition modulated" AlGaN layer/AlN nucleation layer/substrate, since difference $\Delta a(GaN/Al_{xt}Ga_{1-xt}N)$ between a lattice constant of GaN: a(GaN)=3.189 (Å) and a lattice constant of $Al_{xt}Ga_{1-xt}N$ of an upmost surface (interface with the channel layer) of the buffer layer: $a(xt)\approx 3.189-0.077xt$ (Å) is $\Delta a(GaN/Al_{xt}Ga_{1-xt}N)=a(GaN)-a(xt)\approx 0.077xt$ (Å), which is a few, it is not necessary to consider an influence of lattice mismatching at the interface between the GaN channel layer and "Al composition modulated" AlGaN buffer layer.

On the other hand, at the interface between the $In_yGa_{1-y}N$ channel layer and "Al composition modulated" Al(InGa)N layer (buffer layer), an influence of difference between both lattice constants may arise. That is, since the $In_yGa_{1-y}N$ channel layer which is an upper layer keeps good crystallinity as lattice mismatching becomes large. An upper limit (critical film thickness $T_C$) of a film thickness to which epitaxial growth is possible reduces in reverse proportion. In other words, when lattice mismatching at the interface between the $In_yGa_{1-y}N$ channel layer and "Al composition modulated" Al(InGa)N layer (buffer layer) becomes large, it may become hard to grow epitaxially the $In_yGa_{1-y}N$ channel layer with a target film thickness.

For example, when a lattice constant of an upmost surface (interface with the channel layer) of the "Al composition modulated" Al(InGa)N layer (buffer layer) is made to coincide with a lattice constant: a(GaN) of GaN, critical film thickness $T_C$ in the $In_yGa_{1-y}N$ grown up on a surface of this "Al composition modulated" Al(InGa)N layer (buffer layer) becomes the same value substantially as critical film thickness $T_C$ in the $In_yGa_{1-y}N$ grown on a surface of GaN. In addition, when performing epitaxial growth on the surface of GaN, an In composition range of $In_yGa_{1-y}N$ that critical film thickness $T_C$ becomes $T_C \leq 10$ nm (100 Å) is $1 \geq y \geq 0.22$. Hence, also in construction of the $In_yGa_{1-y}N$ channel layer/buffer layer/AlN nucleation layer/substrate (where, $1>y\geq 0$), when a film thickness of the $In_yGa_{1-y}N$ channel layer is within 10 nm (100 Å) to 50 nm (500 Å) inclusive, when an In composition range of $In_yGa_{1-y}N$ is selected at least in $0.22 \geq y \geq 0$, it is possible to exclude a possibility of being affected by an influence of lattice mismatching.

Hence, as for the In composition y of the $In_yGa_{1-y}N$ channel layer, it is more preferable to select the In composition y so that mismatching: $\{(a(In_yGa_{1-y}N)-a(AlN))/a(AlN)\}$ of the lattice constant a(AlN) of AlN and the lattice constant $a(In_yGa_{1-y}N)$ of the $In_yGa_{1-y}N$ is set in the following range.

In addition, also when selecting the construction of the AlGaN electron supply layer/$In_yGa_{1-y}N$ channel layer/buffer layer/AlN nucleation layer/substrate (where, $1>y\geq 0$) where the above-mentioned "Al composition modulated" Al(InGa)N layer (buffer layer) is adopted, regarding the AlGaN electron supply layer/$In_yGa_{1-y}N$ channel layer, "various conditions" used when selecting the construction of the AlGaN electron supply layer/GaN channel layer/buffer layer/AlN nucleation layer/substrate where the "Al composition modulated" AlGaN layer (buffer layer) described previously is adopted are completely applicable in a similar manner.

Furthermore, in construction of the $In_yGa_{1-y}N$ channel layer/buffer layer/AlN nucleation layer/substrate (where, $1>y\geq 0$) where the C plane ((0001) plane) growth is performed, it is possible to achieve the same effect also when the "Ga composition modulated" Al(InGa)N layer (buffer layer) which uses the Al(InGa)N layer, which is made up of $Al_x(In_yGa_{1-y})_{1-x}N$, as the buffer layer, and in which Al composition x of $Al_x(In_yGa_{1-y})_{1-x}N$ is constant from the interface with the AlN nucleation layer to the interface with the $In_{y0}Ga_{1-y0}N$ channel layer, but Ga composition: $(1-x)\cdot(1-y(z))$ reduces monotonically is selected.

Also in this case, in $Al_x(In_yGa_{1-y})_{1-x}N$ which forms the Al(InGa)N layer (buffer layer), energy difference $\Delta E_C$ of the conduction band edge to $In_{y0}Ga_{1-y0}N$ reduces monotonically toward a depth direction (Z-axis direction). On the other hand, a lattice constant of $Al_x(In_yGa_{1-y})_{1-x}N$ increases monotonically toward the depth direction (z-axis direction). In consequence, the same effect is achieved. In addition, also in this case, it is more preferable that $\Delta E_C > 2$ kT (k denotes a Boltzmann's constant and T denotes temperature of about 300K) or the like is provided as a barrier (step) corresponding to discontinuity $\Delta E_C$ of conduction band energy at the interface between the Al(InGa)N layer (buffer layer) and $In_yGa_{1-y}N$ channel layer.

Also in the construction of this $In_yGa_{1-y}N$ channel layer/"Ga composition modulated" Al(InGa)N layer (buffer layer), when lattice mismatching at the interface between the $In_{y0}Ga_{1-y0}N$ channel layer/"Ga composition modulated" Al(InGa)N layer (buffer layer) becomes large, it may become hard to grow epitaxially the $In_yGa_{1-y}N$ channel layer with a target film thickness.

For example, when a lattice constant of an upmost surface (interface with the channel layer) of the "Ga composition modulated" Al(InGa)N layer (buffer layer) is made to coincide with a lattice constant: a(GaN) of GaN, critical film thickness $T_C$ in the $In_yGa_{1-y0}N$ grown up on a surface of this "Ga composition modulated" Al(InGa)N layer (buffer layer) becomes the same value substantially as critical film thickness $T_C$ in the $In_{y0}Ga_{1-y0}N$ grown on a surface of GaN. In addition, when performing epitaxial growth on the surface of GaN, an In composition range of $In_{y0}Ga_{1-y0}N$ that its critical film thickness $T_C$ becomes $T_C \leq 10$ nm (100 Å) is $1 \geq y_0 \geq 0.22$. Hence, also in construction of the $In_{y0}Ga_{1-y0}N$ channel layer/"Ga composition modulated" Al(InGa)N buffer layer/AlN nucleation layer/substrate (where, $1 > y_0 \geq 0$), when a film thickness of the $In_{y0}Ga_{1-y0}N$ channel layer is within 10 nm (100 Å) to 50 nm (500 Å) inclusive, when an In composition range of $In_{y0}Ga_{1-y0}N$ is selected at least in $0.22 \geq y_0 \geq 0$, it is possible to exclude a possibility of being affected by an influence of lattice mismatching.

Hence, as for the In composition $y_0$ of the $In_{y0}Ga_{1-y0}N$ channel layer, it is more preferable to select the In composition $y_0$ so that mismatching: $\{(a(In_{y0}Ga_{1-y0}N) - a(AlN))/a(AlN)\}$ of the lattice constant a(AlN) of AlN and the lattice constant $a(In_yGa_{1-y}N)$ of the $In_yGa_{1-y}N$ is set in the following range.

In addition, also when selecting the construction of the AlGaN electron supply layer/$In_yGa_{1-y}N$ channel layer/buffer layer/AlN nucleation layer/substrate (where, $1 > y \geq 0$) where the above-mentioned "Ga composition modulated" Al(InGa)N layer (buffer layer) is adopted, regarding the AlGaN electron supply layer/$In_yGa_{1-y}N$ channel layer, "various conditions" used when selecting the construction of the AlGaN electron supply layer/GaN channel layer/buffer layer/AlN nucleation layer/substrate where the "Al composition modulated" AlGaN layer (buffer layer) described previously is adopted are completely applicable in a similar manner.

Furthermore, in construction of the $In_{y0}Ga_{1-y0}N$ channel layer/buffer layer/AlN nucleation layer/substrate (where, $1 > y_0 \geq 0$) where the C plane ((0001) plane) growth is performed, the same effect is achievable also when, using the Al(InGa)N layer, which is made up of $Al_x(In_yGa_{1-y})_{1-x}N$, as the buffer layer, Al composition x(z) and Ga composition $[(1-x)(z)] \cdot (1-y(z))]$ are continuously changed so that energy difference $\Delta E_C$ of the conduction band edge of $Al_x(In_yGa_{1-y})_{1-x}N$ to the $In_{y0}Ga_{1-y0}N$ may reduce monotonically in this depth direction (z-axis direction) from the interface with the AlN nucleation layer to the interface with the $In_{y0}Ga_{1-y0}N$ channel layer, but simultaneously, the lattice constant of the $Al_x(In_yGa_{1-y})_{1-x}N$ may increase monotonically toward the depth direction (z-axis direction). In addition, also in this case, it is more preferable that $\Delta E_C > 2$ kT (k denotes a Boltzmann's constant and T denotes temperature of about 300K) or the like is provided as a barrier (step) corresponding to discontinuity $\Delta E_C$ of conduction band energy at the interface between the Al(InGa)N layer (buffer layer) and $In_yGa_{1-y}N$ channel layer.

On the other hand, also at the interface between the $In_yGa_{1-y}N$ channel layer and "Al and Ga composition modulated" Al(InGa)N layer (buffer layer), depending on selection of its composition, large difference between both lattice constants may arise. Because of lattice mismatching, distortion stress is accumulated in the $In_yGa_{1-y}N$ thin film which is grown epitaxially on a surface of the "Al and Ga composition modulated" Al(InGa)N layer (buffer layer). This distortion stress increases as a film thickness of the $In_yGa_{1-y}N$ thin film increases. When the distortion stress accumulated exceeds a threshold, crystal defects, such as a misfit dislocation, are rapidly introduced into the $In_yGa_{1-y}N$ thin film, and hence, crystallinity rapidly decreases. A film thickness (critical film thickness $T_C$) which causes this rapid reduction of crystallinity reduces in reverse proportion in size of lattice mismatching. In other words, when the lattice mismatching at the interface between the $In_{y0}Ga_{1-y0}N$ channel layer/"composition modulated" Al(InGa)N layer (buffer layer) becomes large, it may become hard to grow epitaxially the $In_{y0}Ga_{1-y0}N$ channel layer with a target film thickness.

For example, when a lattice constant of an upmost surface (interface with the channel layer) of the "composition modulated" Al(InGa)N layer (buffer layer) is made to coincide with a lattice constant: a(GaN) of GaN, critical film thickness $T_C$ in the $In_yGa_{1-y}N$ grown up on a surface of this "composition modulated" Al(InGa)N layer (buffer layer) becomes the same value substantially as critical film thickness $T_C$ in the $In_{y0}Ga_{1-y0}N$ grown on a surface of GaN. In addition, when performing epitaxial growth on the surface of GaN, an In composition range of $In_{y0}Ga_{1-y0}N$ that its critical film thickness $T_C$ becomes $T_C \leq 10$ nm (100 Å) is $1 \geq y_0 \geq 0.22$. Hence, also in construction of the $In_{y0}Ga_{1-y0}N$ channel layer/"Ga composition modulated" Al(InGa)N buffer layer/AlN nucleation layer/substrate (where, $1 > y_0 \geq 0$), when a film thickness of the $In_{y0}Ga_{1-y0}N$ channel layer is within 10 nm (100 Å) to 50 nm (500 Å) inclusive, when In composition of the $In_{y0}Ga_{1-y0}N$ is selected at least in the range of $0.22 \geq y_0 \geq 0$, it is possible to exclude a possibility of being affected by an influence of lattice mismatching.

Hence, as for the In composition $y_0$ of the $In_{y0}Ga_{1-y0}N$ channel layer, it is more preferable to select the In composition $y_0$ so that mismatching: $\{(a(In_{y0}Ga_{1-y0}N) \cdot a(AlN))/a(AlN)\}$ of the lattice constant a(AlN) of AlN and the lattice constant $a(In_yGa_{1-y}N)$ of the $In_yGa_{1-y}N$ is set in the following range.

$$(0.154/3.112) \geq \{(a(In_{y0}Ga_{1-y0}N) - a(AlN))/a(AlN)\} \geq (0.077/3.112)$$

In addition, also when selecting the construction of the AlGaN electron supply layer/$In_yGa_{1-y}N$ channel layer/buffer layer/AlN nucleation layer/substrate (where, $1 > y \geq 0$) where the above-mentioned "Al and Ga composition modulated" Al(InGa)N layer (buffer layer) is adopted, regarding the AlGaN electron supply layer/$In_yGa_{1-y}N$ channel layer, "various conditions" used when selecting the construction of the AlGaN electron supply layer/GaN channel layer/buffer layer/AlN nucleation layer/substrate where the "Al composition modulated" AlGaN layer (buffer layer) described previously is adopted are completely applicable in a similar manner.

Exemplary Embodiment 2

Figure 2:
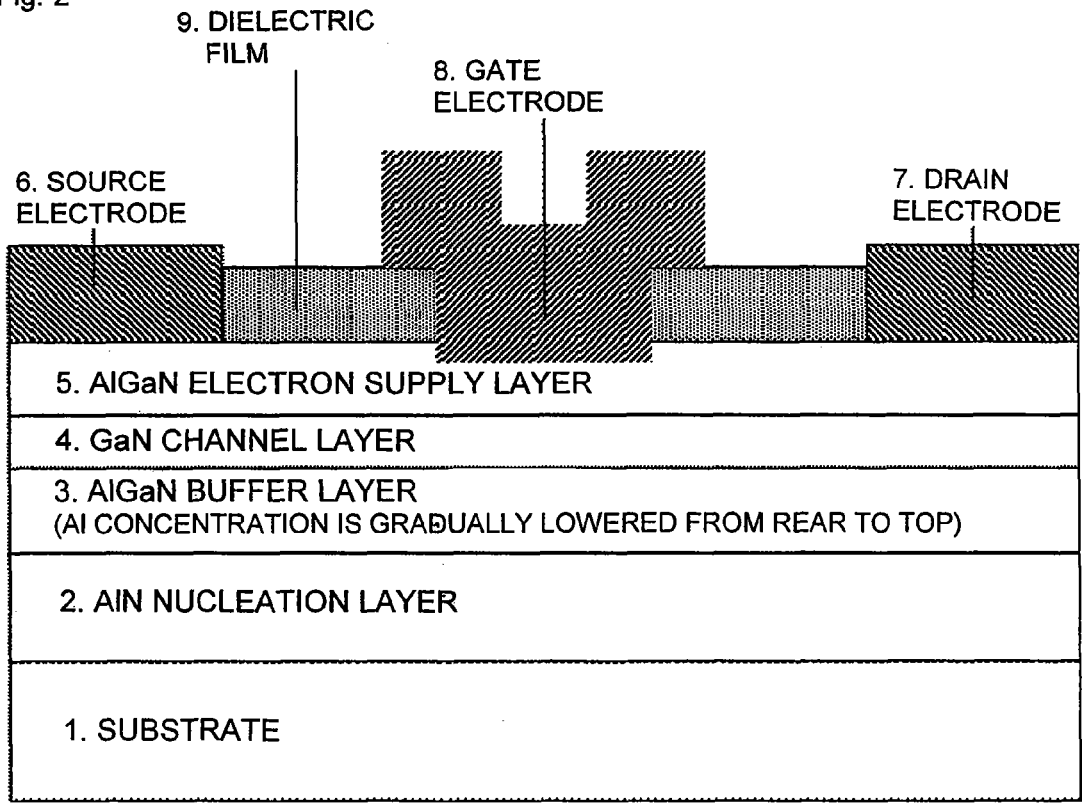
FIG. 2 is a sectional view illustrating schematically an example of structure of a heterojunction FET according to the second exemplary embodiment of the present invention.

FIG. 2 shows schematically sectional structure of group III nitride semiconductor heterojunction FET prepared using actually the construction of the second AlGaN layer/GaN layer/first AlGaN layer/AlN nucleation layer/substrate exemplified in the above-mentioned first exemplary embodiment so as to confirm actually the effect of the construction of the second AlGaN layer/GaN layer/first AlGaN layer/AlN nucleation layer/substrate exemplified in the above-mentioned first exemplary embodiment.

The multilayer epitaxial layer which has the construction of the second AlGaN layer/GaN layer/first AlGaN layer/AlN nucleation layer/substrate are prepared by using the C plane ((0001) plane) of SiC as substrate 1, and giving C plane ((0001) plane) growth of each layer on the surface by an MOCVD growth method. First of all, an undoped AlN layer at 200 nm of film thickness is formed on a low-temperature growth condition on the C plane of SiC used as substrate 1. AlN nucleation layer 2 itself which is made up of this low-temperature growth undoped AlN film functions as an insulating nucleation layer. Subsequently, undoped AlGaN buffer layer 3 at 1 μm (1000 nm) of film thickness, undoped GaN channel layer 4 at 10 nm of film thickness, and undoped AlGaN electron supply layer 5 at 45 nm of film thickness are grown epitaxially on AlN nucleation layer 2 under normal high temperature growth conditions successively.

In this second exemplary embodiment, undoped AlGaN buffer layer 3 is selected so that Al composition x(z) of the $Al_xGa_{1-x}N$ may reduce monotonically from an interface with AlN nucleation layer 2 to an interface with undoped GaN channel layer 4, that is, toward a film thickness direction (z-axis direction). In the second exemplary embodiment, Al composition x (z=1 μm)≡xt of the $Al_xGa_{1-x}N$ is selected at xt=0.05 at an interface (z=1 μm) with GaN channel layer 4, and Al composition x (z=0 μm) E xb of the $Al_xGa_{1-x}N$ is selected at xb=0.30 at an interface (z=0) with AlN nucleation layer 2, respectively. In addition, in undoped AlGaN electron supply layer 5, Al composition x is set constant and Al0.2Ga0.8N with x=0.2 is selected.

In a multilayered epitaxial film which is prepared and uses the above-described linear "Al composition modulated" AlGaN buffer layer, sheet resistance rs of the whole multilayered epitaxial film was 605Ω/□, sheet carrier concentration was $9.50 \times 10^{12}$ cm$^{-2}$, and mobility was 1600 cm$^2$/Vs. On the other hand, in a conventional multilayered epitaxial film which uses a GaN buffer layer, sheet resistance rs was 550Ω/□, sheet carrier concentration was $1.05 \times 10^{13}$ cm$^{-2}$, and mobility was 1600 cm$^2$/Vs.

Source electrode 6 and drain electrode 7 which are given ohm contact on a surface of undoped AlGaN electron supply layer 5, and gate electrode 8 is formed between them. In addition, a surface of AlGaN electron supply layer 5 between source electrode 6 and gate electrodes 8, and gate electrode 8 and drain electrode 7 is covered with dielectric film 9 by SiN, and is given surface protection. In addition, although not clearly shown in FIG. 1, a position of gate electrode 8 is selected so that an interval between gate electrode 8 and drain electrode 7 may become wider than an interval between source electrode 6 and gate electrode 8.

Specifically, the SiN film which covers the surface of AlGaN electron supply layer 5 between source electrode 6 and drain electrode 7 is formed beforehand, and an opening for formation of gate electrode 8 is formed in a predetermined position on this SiN film. A surface of AlGaN electron supply layer 5 exposed in the opening is etched, and a shallow recess section is formed. Gate electrode 8 is prepared in this shallow recess section, and construction which has a recess type gate is adopted.

A preparation process of the AlGaN/GaN-type HJFET of this exemplary embodiment shown in FIG. 2 will be described simply. In order to achieve inter-device separation between FETs after finishing a series of epitaxial growth, mesa etching which reaches GaN channel layer 4 is given around each device using a mask etching method. That is, in this region, etching removal of undoped AlGaN electron supply layer 5 is performed, and inter-device separation mesas are formed. Subsequently, for example, metals such as Ti/Au are evaporated, and are given patterning into a predetermined form using a lift-off method using a photoresist mask with matching forms of source electrode 6 and drain electrode 7 provided on the surface of AlGaN electron supply layer 5. Ohmic contact is taken by performing annealing treatment of the metal layers, such as Ti/Au (10 nm to 200 nm in thickness), which are given patterning into these predetermined forms in a flow of inert gas at 800° C. for 1 to 3 minutes.

Next, for example, the SiN film at 80 nm of film thickness is formed by applying a vapor phase depositing method, such as a plasma CVD method, so that a whole surface may be covered. Using a resist mask, selective etching is performed and an openings for formation of gate electrode 8 is formed in a predetermined position on the SiN film which covers the surface of AlGaN electron supply layer 5 between source electrode 6 and drain electrode 7. In addition, when forming the resist mask used for formation of the above-mentioned opening, in order to achieve a target width of 0.15 μm, an electron beam lithography method is adopted.

A surface of AlGaN electron supply layer 5 exposed in the opening is slightly etched, and a shallow recess section is formed. In addition, this recess depth d is selected at 25 nm in this exemplary embodiment. Hence, directly under the recess section, a thickness of AlGaN electron supply layer 5 becomes 20 nm after etching.

Subsequently, gate metals, such as Ni/Au (10 nm to 200 nm in thickness), are evaporated and lifted off on the surface of AlGaN electron supply layer 5 which is under the above-mentioned opening and is given recess formation using a resist mask, and are given patterning into a predetermined form. In such a case, gate electrode 9 patterned is used as a gate electrode which has a T-form sectional shape, and a part of which covers an SiN film surface adjacent to the opening (recess section). To an opening (recess section), dimensional accuracy of alignment of this T-form upper face shape and size is 10 nm, and an electron beam lithography method is adopted for exposure of the resist mask used for the lift-off.

When formation of gate electrode 8 is completed, the surface of AlGaN electron supply layer 5 between source electrode 6 and gate electrode 8 and between gate electrode 8 and drain electrode 7 becomes in a state of being covered with the SiN film, and this residual SiN film is used as it is as dielectric film 9.

The prepared AlGaN/GaN-type HJFET becomes a so-called HEMT-type FET using two-dimensional electron gas generated at the interface between AlGaN electron supply layer 5 and GaN channel layer 4. Its gate length Lg is equivalent to 0.15 μm in width of the recess section under the above-mentioned opening. The aspect ratio: Lg/a of gate length Lg to active layer thickness (gate-to-channel distance) a becomes Lg/a≈150/30≈5 since active layer thickness a is equivalent to a sum of the thickness of AlGaN electron supply layer 5, which is directly under the recess section and remains after etching, and the thickness of the channel layer, that is, 30 nm.

On the other hand, as for $Al_xGa_{1-x}N$ (0.30≥x≥0.05) which forms AlGaN buffer layer 3 of the above-mentioned carrier p which is given "Al composition modulation", when undoped $Al_xGa_{1-x}N$ layer having corresponding uniform Al composition is prepared temporarily, residual carriers are electrons, the residual carrier concentration n is dependent on growth conditions and Al composition, and dispersion becomes generally in the order of $10^{14}$ to $10^{15}$ $cm^{-3}$ of carriers to some extent. In addition, in this second exemplary embodiment, it is set that Al composition x(z) of $Al_xGa_{1-x}N$ which forms undoped AlGaN layer 3 linearly reduces from an interface (z=0) with AlN nucleation layer 2 to an interface (z=1 μm) with GaN channel layer 4. That is, a film thickness $t_{buffer}$ of whole AlGaN buffer layer 3 is 1 μm, and Al composition x(z) is expressed as follows, as a function of a thickness (z/μm) in a depth direction (Z axial direction).

$$x(z) = xt \cdot z + xb \cdot (1-z)$$
$$= 0.05z + 0.30(1-z)$$

In the construction of the above-mentioned multilayered epitaxial film, polarized charge density; $\sigma(P)/e$ $cm^{-3}$ (where, e denotes electronic charge (unit charge) of an electron) which is generated in undoped AlGaN buffer layer 3 which is given this linear "Al composition modulation" is negative polarized charges with $\sigma(P)/e \approx 1.1 \times 10^{17}$ $cm^{-3}$ to the extent when referring to an estimated result shown in FIG. 8. That is, density $\sigma(P)/e \approx 1.1 \times 10^{17}$ $cm^{-3}$ of the negative polarized charge which is induced in undoped AlGaN buffer layer 3 which is given "Al composition modulation" exceeds estimated residual carrier concentration n in the order of $10^{14}$ to $10^{15}$ $cm^{-3}$. Hence, it is possible for this induced negative polarized charge to compensate completely positive space charges corresponding to the above-mentioned residual carrier (electron) density n and resulting from an ionized impurity level (or intentionally doped donor level with comparatively low concentration) which exists in undoped AlGaN buffer layer 3. In consequence, it becomes in a state that the negative space charges in the order of $10^{16}$ $cm^{-3}$ exists by the residual negative polarized charges in undoped AlGaN buffer layer 3 which is given "Al composition modulation". Effectually, undoped AlGaN buffer layer 3 which is given "Al composition modulation" plays the function equivalent to the p– layer in which negative space charges in the order of $10^{16}$ $cm^{-3}$ exist.

Figure 9:
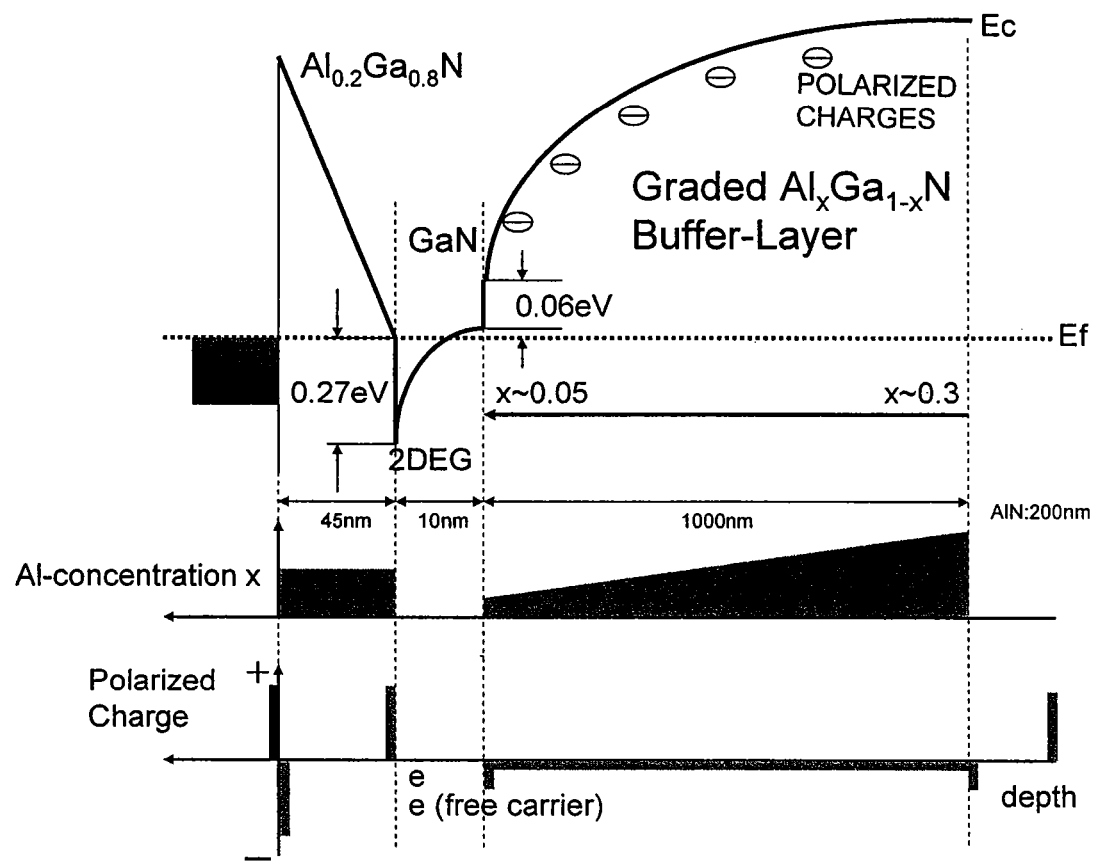
FIG. 9 is a diagram illustrating schematically a band diagram of a conduction band edge in multilayer epitaxial structure for an AlGaN/GaN-type HJFET according to the second exemplary embodiment of the present invention, in which the multilayer epitaxial structure specifically shown in the drawing is selected. Reference symbol x illustrated in the drawing denotes Al composition in an AlGaN buffer layer which is given "Al composition modulation"

FIG. 9 illustrates schematically a band diagram of the multilayered epitaxial film directly under gate electrode 9 of the above-described AlGaN/GaN-type HJFET. Since undoped AlGaN buffer layer 3 which is given "Al composition modulation" plays the function equivalent to the p– layer in which negative space charges in the order of $10^{16}$ $cm^{-3}$ exist effectually, an energy position of a conduction band edge of this region decreases with keeping a convex shape from the interface (z=0) with AlN nucleation layer 2 to the interface (z=1 μm) with GaN channel layer 4. Hence, at the interface (z=1 μm) between undoped AlGaN buffer layer 3 and GaN channel layer 4, because of an energy gradient of the conduction band edge, which shows the convex shape, in addition to a barrier (step) corresponding to discontinuity $\Delta E_Q$ of conduction band energy, electron injection into undoped AlGaN buffer layer 3 over the above-mentioned barrier (step) is suppressed.

The above-described AlGaN/GaN-type HJFET has the construction that, in the $Al_xGa_{1-x}N$ which forms undoped AlGaN layer 3 which is given "Al composition modulation", Al composition x(z) continuously reduces from the interface (z=0) with AlN nucleation layer 2 toward the interface (z=1 μm) with InAlGaN channel-back barrier layer 10. When construction that Al composition x(z) stepwise reduces at a narrow thickness step Δz instead of the above-described $Al_xGa_{1-x}N$ whose composition changes continuously is selected, it becomes in a state that polarized charge $\sigma(P)=\{P(x(z))-P(x(z+\delta z))\}$ occurs in a sheet at an interface formed every thickness step δz. In such a case, effectual polarized charge density becomes $\sigma(P)/\delta z=\{P(x(z))-P(x(z+\delta z))\}/\delta z=-[\{P(x(z+\delta z))-P(x(z))\}/\delta x(z) \cdot \delta x(z)/\delta z$, and when thickness step δz is small enough, it becomes substantially within difference from a value in the above-mentioned differentiation notation.

In addition, at the interface (z=1 μm) between undoped AlGaN buffer layer 3 and GaN channel layer 4, because of difference of polarization P between $Al_xGa_{1-x}N$ with Al composition x=0.05 and GaN, it is estimated that negative polarized charges are generated in maximum sheet charge density of nearly $2 \times 10^{12}$ $(/cm^2)$. In such extent, influences to a band form near the interfaces and channel carrier density stored in the GaN channel layer are not so great. It is because carriers by two-dimensional electron gas induced by the AlGaN/GaN heterojunction in the normal AlGaN/GaN heterojunction HJFET (Al composition of 0.2 etc.) have sheet charge concentration in the order of $10^{13}$ $(/cm^2)$, which is about one-digit larger. Furthermore, in this exemplary embodiment, the film thickness of GaN channel layer 4 is selected at 10 nm, and an effect that negative polarized charges induced at the interface (z=1 μm) between such undoped AlGaN buffer layer 3 and GaN channel layer 4 reduces a total amount of two-dimensional electron gas generated at the interface between AlGaN electron supply layer 5 and GaN channel layer 4 is limited.

Also in the field-effect transistor according to this exemplary embodiment, when selecting construction of making it operate in a depletion mode (normally-on state), in a state that a substrate itself is a material which does not exhibit a polarization effect and both of a gate electrode and a substrate are grounded, polarized charges which exist in a semiconductor layer region become in a state that "negative" polarized charges (Q1) are usually distributed at the interface between the electron supply layer with constant composition and the gate electrode (metal) on a surface, "positive" polarized charges (Q2) are usually distributed at the interface between the electron supply layer with constant composition, and the channel layer, and, when composition of an electron supply layer is not constant, "positive" or "negative" polarized charges ($\Sigma Q_{supplier}$) distributed in the electron supply layer according to a local composition rate of changes are distributed, "negative" polarized charges (Q3) are distributed at the interface between the channel layer and a "composition modulated" buffer layer, "negative" polarized charges continuously distributed over a whole internal area of the "composition modulated" buffer layer ($\Sigma Q_{buffer}$) are distributed, "negative" polarized charges (Q4) are distributed at the interface of the "composition modulated" buffer layer with the AlN nucleation layer, and "positive" polarized charges (Q5) are distributed at the interface of the AlN nucleation layer with a substrate surface, respectively.

On the other hand, the electron supply layer itself is depleted and the "positive" space charges ($\Sigma Q_{SD1}$), resulting from the ionized donor level, exist inside this electron supply layer. In addition, the shallow donor level included in the "composition modulated" buffer layer is also ionized, and the "positive" space charges ($\Sigma Q_{SD2}$) derived from the ionized donor level also exist inside the "composition modulated" buffer layer.

In addition, a surface of the electron supply layer is covered with the gate electrode (metal) and a dielectric film as a passivation film in both sides of the gate electrode (metal). In many cases, in the surface of the electron supply layer which contacts the gate electrode (metal) and the surface of the electron supply layer which contacts the passivation film, comparatively deep surface levels (deep donor levels) exist, and these deep surface levels (deep donor levels) are also ionized. In consequence, in the surface of the electron supply layer which contacts the gate electrode (metal) and the surface of the electron supply layer which contacts the passivation film, "positive" surface charges ($Q_{SS}$) derived from the ionized deep surface levels (deep donor levels) exist.

Electrical neutrality condition is fulfilled by "positive" space charges (or "negative" space charge resulting from the ionized acceptor level) resulting from these ionized donor levels and being immobilized, "positive" surface charges localized in the surface of the electron supply layer which contacts the gate electrode (metal) and the surface of the electron supply layer which contacts the passivation film, and polarized charges which exist in the semiconductor layer region, and the carriers (electrons) accumulated in the channel layer.

Usually, "negative" polarized charges (Q1) which are generated at the interface between the electron supply layer and surface gate electrode (metal) are in the state of being almost compensated by the "positive" surface charges ($Q_{SS}$) which are localized in the surface of the electron supply layer, which contacts the gate electrode (metal) (and the surface of the electron supply layer which contacts the passivation film). That is, it becomes $Q1 \approx Q_{SS}$.

Furthermore, with considering that the "positive" space charges ($\Sigma Q_{SD2}$) derived from the ionized donor level which exists in the "composition modulated" buffer layer are few, the "negative" polarized charges (Q3) generated at the interface between the channel layer and "composition modulated" buffer layer, the "negative" polarized charges continuously distributed over the whole internal area of the "composition modulated" buffer layer ($\Sigma Q_{buffer}$), and the "negative" polarized charges (Q4) generated at the interface of the "composition modulated" buffer layer with an AlN nucleation layer are in a state of being almost compensated by the "positive" polarized charges (Q5) which are generated at the interface in an AlN nucleation layer side. That is, $(Q5+\Sigma Q_{SD2})=(Q3+\Sigma Q_{buffer}+Q4)$ holds.

In addition, a total amount ($\Sigma Q_C$) of the carriers (electrons) accumulated in the channel layer becomes approximately equal to an arithmetic sum $(Q2+\Sigma Q_{SD1})$ of the "positive" polarized charges (Q2) which are generated at the interface between the electron supply layer and channel layer, and the "positive" space charges ($\Sigma Q_{SD1}$) (or "negative" space charge resulting from the ionized acceptor level) resulting from ionized donor levels inside the electron supply layer. That is, $(\Sigma Q_C)=(Q2+\Sigma Q_{SD1})$ holds.

An overall electrical neutrality condition becomes $(Q5+\Sigma Q_{SD2})+(Q2+\Sigma Q_{SD1})=(Q3+\Sigma Q_{buffer}+Q4)+(\Sigma Q_C)$. For example, when the positive polarized charges (Q5) which are generated in an underlying layer (interface in an AlN nucleation layer side) of the buffer layer are compensated with electrons, such as hot carriers injected by a certain cause and Q5 reduces, so as to maintain the above-mentioned electrical neutrality condition, the total amount ($\Sigma Q_C$) of the carriers (electrons) accumulated in the channel layer reduces. When Q5 disappears completely temporarily, the total amount ($\Sigma Q_C$) of the carriers (electrons) accumulated in the channel layer becomes $(\Sigma Q_C)=(\Sigma Q_{SD2})+(Q2+\Sigma Q_{SD1})-(Q3+\Sigma Q_{buffer}+Q4)$. In such a case, with considering that the "positive" space charges ($\Sigma Q_{SD2}$) derived from the ionized donor level which exists in the "composition modulated" buffer layer are few, the total amount ($\Sigma Q_C$) of the carriers (electrons) accumulated in the channel layer is lowered approximately to a level of $(\Sigma Q_C)=(Q2+\Sigma Q_{SD1})-(Q3+\Sigma Q_{buffer}+Q4)$. A sufficient condition that the total amount ($\Sigma Q_C$) of the carriers (electrons) accumulated in the channel layer is not drained also in this phase is expressed as $(Q2+\Sigma Q_{SD1})>(Q3+\Sigma Q_{buffer}+Q4)$. That is, as a general condition, it becomes the sufficient condition that the sum total $(Q2+\Sigma Q_{SD1})$ of the "positive" charges which are generated in the electron supply layer is more than the sum total $(Q3+\Sigma Q_{buffer}+Q4)$ of the "negative" charges which are generated inside the "composition modulated" buffer layer and at the interface with the channel layer.

Regarding this exemplary embodiment, so as to fulfilling the above-mentioned sufficient condition, it is suitable to adopt the following construction.

That is, in the construction of the second AlGaN layer (AlGaN electron supply layer)/GaN layer (GaN channel layer)/first AlGaN layer ("Al composition modulated" AlGaN buffer layer)/AlN nucleation layer/substrate, it is desirable that a sum total of "negative" polarized charges continuously distributed at least in the first AlGaN layer ("Al composition modulated" AlGaN buffer layer) is made to be less than a sum total of "positive" polarized charges at the interface between the AlGaN electron supply layer and GaN channel layer. Since the "negative" polarized charges continuously distributed in the first AlGaN layer ("Al composition modulated" AlGaN buffer layer) depends on a rate of change: $\partial x(z)/\partial z$ of Al composition x(z) in the "Al composition modulated" AlGaN buffer layer, it is not desirable to enlarge the rate of change: $|\partial x(z)/\partial z|$ of Al composition x(z) excessively. As described above, the rate of change: $|\partial x(z)/\partial z|$ of Al composition x(z) is sufficient in the range of fulfilling $|\partial x(z)/\partial z|$ 0.05 μm$^{-1}$, and it is not desirable to enlarge it excessively. Usually, it is preferable to select the rate of change: $|\partial x(z)/\partial z|$ of Al composition x(z) in the range of 0.30 μm$^{-1} \geq |\partial x(z)/\partial z|$ 0.05 μm$^{-1}$.

When the above-mentioned Al composition rate of change is selected, the "Al composition modulated" AlGaN buffer layer becomes in a p-like state because of the "negative" polarized charges continuously distributed in it, and even if Al composition xt at the interface between the "Al composition modulated" AlGaN buffer layer and GaN channel layer is set at xt=0, electron injection from the channel layer to the buffer layer can be suppressed sufficiently, In addition, in order to provide the band barrier as mentioned above at the interface between the "Al composition modulated" AlGaN buffer layer and GaN channel layer, it is preferable to make the Al composition xt of the "Al composition modulated" AlGaN buffer layer at this interface into at least 0.05 or more. For example, when film thickness $t_{buffer}$ of the "Al composition modulated" AlGaN buffer layer is made into 1 μm, when the Al composition xt of an uppermost surface of the "Al composition modulated" AlGaN buffer layer is set at xt=0.05 and the rate of change: $|\partial x(z)/\partial z|$ of Al composition x(z) is selected in the range of 0.30 μm$^{-1} \geq |\partial x(z)/\partial z|$ 0.05 μm$^{-1}$, the Al composition xb of the lowermost surface of the "Al composition modulated" AlGaN buffer layer is selected in the range of $0.35 \geq xb \geq 0.10$.

On the other hand, when the AlGaN electron supply layer is usually formed of AlGaN with constant Al composition, as for the Al composition, in order to provide a band barrier necessary for accumulating carriers (electrons) at the interface between the AlGaN electron supply layer and GaN channel layer, it is preferable the Al composition xs of this AlGaN electron supply layer is at least in the range of 0.15 or more, and more preferably, in the range of $050 \geq xs \geq 0.20$.

Temporarily, even in the case that film thickness $t_{buffer}$ of the "Al composition modulated" AlGaN buffer layer is made into 1 μm, and that Al composition xt of an uppermost surface of the "Al composition modulated" AlGaN buffer layer is set at xt=0.00, when the rate of change: $|\partial x(z)/\partial z|$ of Al composition x(z) is selected in the range of 0.35 μm$^{-1}$≥$|\partial x(z)/\partial z|$ 0.10 μm$^{-1}$, an average value: $x(z)_{av.}$ of Al composition x(z) of the "Al composition modulated" AlGaN buffer layer becomes $x(z)_{av.} \approx \frac{1}{2} \cdot (xt+xb)$, and hence, becomes in the range of $0.175 \geq x(z)_{av.} \geq 0.05$. In addition, for example, when film thickness $t_{buffer}$ of the "Al composition modulated" AlGaN buffer layer is made into 1 μm, Al composition xt of the uppermost surface of the "Al composition modulated" AlGaN buffer layer is set at xt=0.05 or more, and the rate of change: $|\partial x(z)/\partial z|$ of Al composition x(z) is selected in the range of 0.30 μm$^{-1}$≥$|\partial x(z)/\partial z|$ 0.05 μm$^{-1}$, the average value: $x(z)_{av.}$ of Al composition x(z) of the "Al composition modulated" AlGaN buffer layer becomes $x(z)_{av.} \approx \frac{1}{2} \cdot (xt+xb)$, and hence, becomes in the range of 0.20 $x(z)_{av.} \geq 0.075$. Hence, on the above-described conditions, in comparison of an average value: $xs_{av.}$ of Al composition xs of the AlGaN electron supply layer with the average value: $x(z)_{av.}$ of Al composition x(z) of the "Al composition modulated" AlGaN buffer layer, It is preferable to set it as $xs_{av.} \geq x(z)_{av.}$ In addition, with referring to FIG. 8, in the "Al composition modulated" AlGaN buffer layer, when the rate of change: $|\partial x(z)/\partial z|$ of Al composition x(z) is selected in the range of 0.35 μm$^{-1}$≥$|\partial x(z)/\partial z|$ 0.10 μm$^{-1}$, density σ(P)/e of induced negative polarized charges which is made in the "Al composition modulated" AlGaN buffer layer becomes $1.6 \times 10^{17}$ cm$^{-3}$≥$|\sigma(P)/e| \geq 4 \times 10^{16}$ cm$^{-3}$. In other words, by using the "Al composition modulated" AlGaN buffer layer of the present invention in the range that residual carrier (electron) density n in the undoped AlGaN buffer layer does not exceed $1.6 \times 10^{17}$ cm$^{-3}$ described above, and at least in the range of $1.5 \times 10^{17}$ cm$^{-3}$≥n≥$1 \times 10^{14}$ cm$^{-3}$, and preferably, in the range of $1 \times 10^{17}$ cm$^{-3}$≥n≥$1 \times 10^{15}$ cm$^{-3}$. An effect of compensation by the "negative" polarized charges induced continuously is exerted. Hence, it is preferable that the "Al composition modulated" AlGaN buffer layer is grown up by an epitaxial growth method and conditions which are suitable for making it in the range of the above-mentioned residual carrier (electron) density n. For example, when growing the AlGaN in the range of 0.45 or less of Al composition, and preferably, 0.35 or less by applying a MOVPE method, it is possible to make it in the range (e.g., $1 \times 10^{17}$ cm$^{-3}$≥n) of the above-mentioned residual carrier (electron) density n.

The above-mentioned band barrier existing at the interface (z=1 μm) between undoped AlGaN buffer layer 3 and GaN channel layer 4 has a function of increasing a carrier (electron) confinement effect into GaN channel layer 4, and exerts an effect of enhancing a pinch-off characteristic of the AlGaN/GaN-type HJFET obtained. In addition, in the AlGaN/GaN-type HJFET with the construction illustrated in FIG. 2, the active layer thickness (gate-to-channel distance) a is equivalent to a sum of the thickness of AlGaN electron supply layer 5 directly under gate electrode 8, and the thickness of GaN channel layer 4, and when the aspect ratio: Lg/a of gate length Lg to active layer thickness (gate-to-channel distance) a becomes small by shortening gate length Lg, the short channel effect is easy to be caused, but an effect of suppressing this short channel effect is also exerted with improvement in the pinch-off characteristic.

In this embodiment mentioned above, when the film thickness of whole undoped AlGaN buffer layer 3 is made into 1 μm, Al composition x (z=1 μm) xt of the $Al_xGa_{1-x}N$ is selected at xt=0.05 at the interface (z=1 μm) with GaN channel layer 4, and Al composition x (z=0 μm)≡xb of the $Al_xGa_{1-x}N$ is selected at xb=0.30 at the interface (z=0) with AlN nucleation layer 2, respectively, and density $\sigma(P)/e \approx 1.1 \times 10^{17}$ cm$^{-3}$ of negative polarized charges which are induced in this undoped AlGaN buffer layer 3 which is given "Al composition modulation" is obtained. When making density σ(P)/e of negative polarized charges which are induced in undoped AlGaN buffer layer 3 which is given "Al composition modulation" into at least $1 \times 10^{16}$ cm$^{-3}$ or more, undoped AlGaN buffer layer 3 which is given "Al composition modulation" exhibits a function equivalent to a p– layer effectually. When referring to the estimated result shown in FIG. 8, when the film thickness of whole undoped AlGaN buffer layer 3 is made into 1 μm, when Al composition x (z=1 μm) E xt of the $Al_xGa_{1-x}N$ is selected at xt=0.05 at the interface (z=1 μm) with GaN channel layer 4, and Al composition x (z=0 μm) E xb of the $Al_xGa_{1-x}N$ is selected at xb 0.10 at the interface (z=0) with AlN nucleation layer 2, the above-mentioned condition is fulfilled. That is, when the film thickness of whole undoped AlGaN buffer layer 3 is made into 1 μm, when Al composition x (z=1 μm) E xt of the $Al_xGa_{1-x}N$ is selected at xt=0.05 at the interface (z=1 μm) with GaN channel layer 4, and Al composition x (z=0 μm) E xb of the $Al_xGa_{1-x}N$ is selected at xb=0.1 to 0.2 at the interface (z=0) with AlN nucleation layer 2, it becomes in a state that the sufficient effect is exerted.

Figure 10:
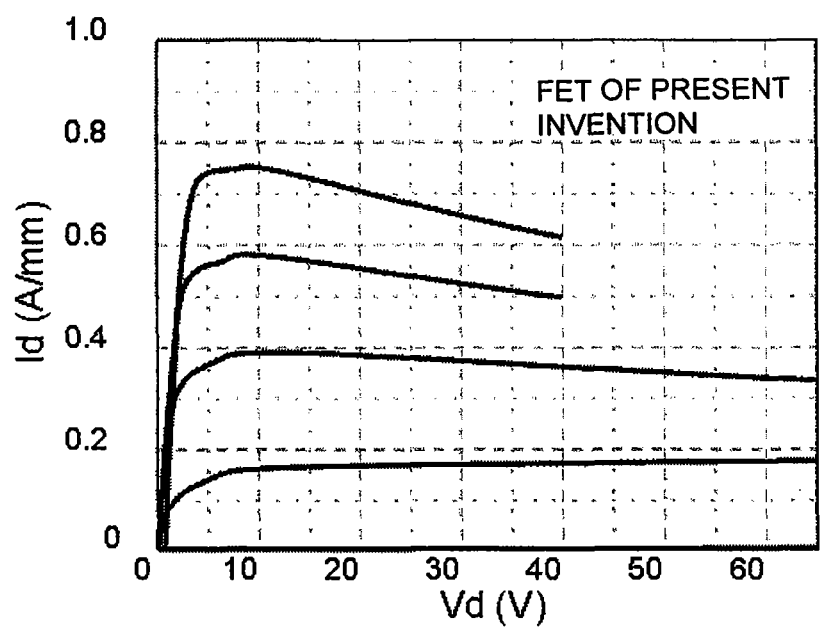
FIG. 10 is a graph illustrating a result of the Id-Vd characteristic measured for an AlGaN/GaN-type HJFET according to the second exemplary embodiment of the present invention, in particular, for the device with a gate length Lg=0.15 μm.

FIG. 10 shows the IV characteristics of a case that, regarding the AlGaN/GaN-type HJFET of this exemplary embodiment, that is, an FET prepared by selecting Al composition x (z=1 μm) E xt of the $Al_xGa_{1-x}N$ at xt=0.05 at the interface (z=1 μm) with GaN channel layer 4, and Al composition x (z=0 μm)≡xb of the $Al_xGa_{1-x}N$ at xb=0.30 at an interface (z=0) with AlN nucleation layer 2, respectively, when the film thickness of whole undoped AlGaN buffer layer 3 is made into 1 μm, gate length Lg is made into 0.15 μm. According to a measurement result of the Id-Vd characteristics shown in FIG. 10, even when gate length Lg is as short as 0.15 μm, good pinch-off characteristics are achieved. In addition, when a buffer layer leakage current was evaluated with an ohmic electrode vs a pattern which were kept apart 8 μms as a gap space, it was enough as low as $5 \times 10^{-10}$ Å/mm under interior illumination in the case of 100V application.

Figure 5:
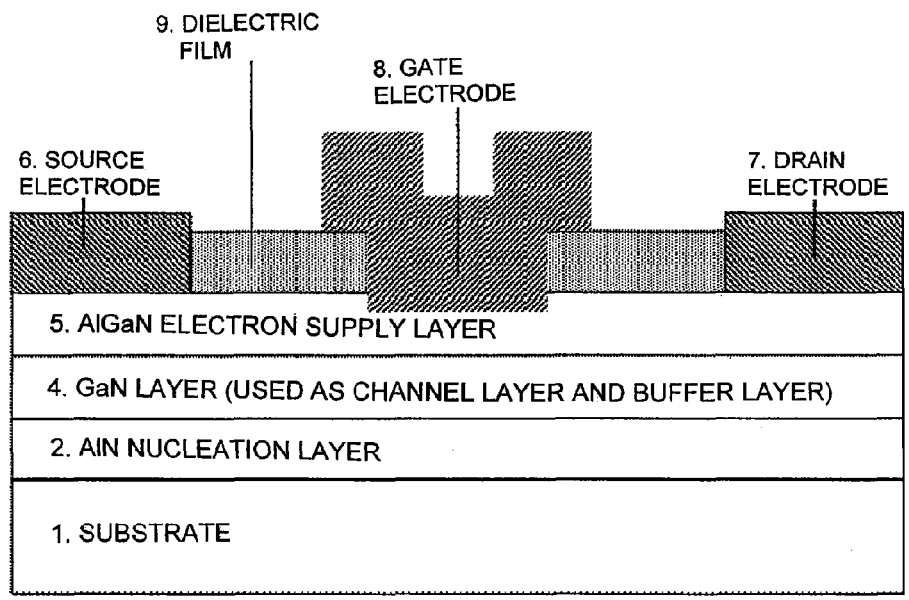
FIG. 5 is a sectional view illustrating schematically an example of structure of a conventional AlGaN/GaN-type HJFET using a GaN buffer layer.
Figure 7:
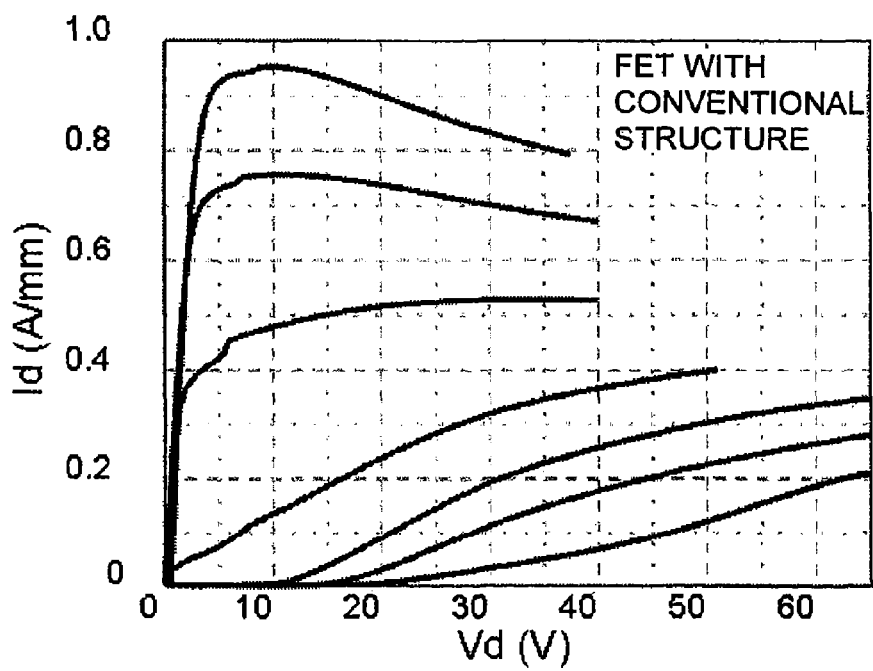
FIG. 7 is a graph illustrating a result of the Id-Vd characteristic measured for a conventional AlGaN/GaN-type HJFET using a GaN buffer layer, in particular, for the device with a gate length Lg=0.15 μm.

On the other hand, the AlGaN/GaN-type HJFET with conventional structure which uses the undoped GaN buffer layer shown in FIG. 5 exerted the Id-Vd characteristics shown in FIG. 7, but pinch-off characteristics were not good. In addition, when the buffer layer leakage current was evaluated by the ohmic electrode versus the pattern which were kept apart 8 μms as the gap space, it was $5 \times 10^{-8}$ Å/mm under the interior illumination in the case of 100-V application, which could not satisfy us in the consideration of an application to a high voltage operation.

When comparing it with the AlGaN/GaN-type HJFET with conventional structure using this GaN buffer layer, the AlGaN/GaN-type HJFET of this exemplary embodiment is greatly improved in the pinch-off characteristics. Simultaneously, buffer break-down voltage is also improved. Hence, in comparison with the AlGaN/GaN-type HJFET with conventional structure using the undoped GaN buffer layer, it is possible that the AlGaN/GaN-type HJFET of this exemplary embodiment improves largely a DC gain and an RF gain in the case of the high voltage operation.

In addition, in this exemplary embodiment, as for the undoped AlGaN buffer layer 3 which is given "Al composition modulation", its Al composition $x(z)$ is set to reduce linearly from the interface ($z=0$) with AlN nucleation layer 2 to the interface ($z=1$ μm) with GaN channel layer 4, and energy $E_c$ of the conduction band edge of the $Al_xGa_{1-x}N$ itself which forms it is also made to reduce linearly from the interface ($z=0$) with AlN nucleation layer 2 to the interface ($z=1$ μm) with GaN channel layer 4. On the other hand, in undoped AlGaN buffer layer 3, when the percentage reduction: $\{\partial x(z)/\partial z\}$ of Al composition $x(z)$ is selected so that $\{\partial x(z)/\partial z\}$ may reduce from the interface ($z=0$) with AlN nucleation layer 2 to the interface ($z=1$ μm) with GaN channel layer 4, the rate of change $\{\partial E_C(x(z))/\partial z\}$ of energy $E_c(x)$ of the conduction band edge of the $Al_xGa_{1-x}N$ itself reduces from the interface ($z=0$) with AlN nucleation layer 2 to the interface ($z=1$ μm) with GaN channel layer 4 (thus, curvilinear $F(z)=\partial E_C(x(z))/\partial z$ which expresses a conduction band edge level when a polarization effect is disregarded becomes a convex shape). In such a case, since an effect of reduction of the rate of change $\{\partial E_C(x(z))/\partial z\}$ of energy $E_C(x)$ of the conduction band edge of the $Al_xGa_{1-x}N$ itself is also added to an action of polarized charges, a gradient of an energy position of the conduction band edge of undoped AlGaN buffer layer 3 becomes larger near the interface ($z=1$ μm) with GaN channel layer 4. Hence, the effect of suppressing the electron injection from GaN channel layer 4 into undoped AlGaN buffer layer 3 further increases.

In addition, although using undoped AlGaN buffer layer 3 which is given "Al composition modulation" and adopting the condition that residual carriers are electrons in this exemplary embodiment, when temporarily changing the epitaxial growth method or the growth conditions and selecting a condition that residual carriers become holes about undoped AlGaN buffer layer 3 itself, undoped AlGaN buffer layer 3 itself becomes a p– layer, and hence, a gradient of the conduction band edge shows a further convex shape. Alternatively, when using a p– type AlGaN buffer layer by intentionally making acceptors low concentration doped instead of the undoped AlGaN buffer layer, the gradient of the conduction band edge shows a still further convex shape.

Similarly to the type of the GaN channel layer/"Al composition-modulated" AlGaN buffer layer described above, also in a generalized type of an $In_yGa_{1-y}N$ channel layer/$In_y(Al_xGa_{1-x})_{1-y}N$ buffer layer, when making In composition y constant and giving "Al composition modulation" which reduces Al composition $(x(1-y))$ from a substrate side to the interface with the channel layer, it is possible to generate "negative" polarized charges continuously distributed in the $In_y(Al_xGa_{1-x})_{1-y}N$ buffer layer.

In addition, in a type of a GaN channel layer/$Al_x(In_yGa_{1-y})_{1-x}N$ buffer layer, when making Al composition x constant and giving "In composition modulation", which increases In composition $(1-x)y$ from the substrate side to the interface with the channel layer, it is possible to generate "negative" polarized charges continuously distributed in the $Al_x(In_yGa_{1-y})_{1-x}N$ buffer layer. For example, when fixing Al composition x at $x=0.3$ and making the film thickness of the whole undoped $Al_x(In_yGa_{1-y})_{1-x}N$ buffer layer into 1 μm, "In composition modulation" which increases In composition linearly is used by making In composition $[(1-x)y](z=0 \mu m)$ into $[(1-x)y]=0$ at the interface ($z=0$) with the nucleation layer and making In composition $[(1-x)y](z=1 \mu m)$ into $[(1-x)y]=0.066$ at the interface ($z=1$ μm) with the GaN channel layer. In such a case, a lattice constant of x)y is almost in agreement with a lattice constant of GaN, and "negative" polarized charges continuously distributed in charge density of $7.18 \times 10^{16}$ ($cm^{-3}$) in the "In composition modulated" $Al_x(In_yGa_{1-y})_{1-x}N$ buffer layer are generated. Hence, it is possible to compensate the estimated residual carrier concentration n the order of $10^{15}$ $cm^{-3}$ in the "In composition modulated" $Al_x(In_yGa_{1-y})_{1-x}N$ buffer layer.

In addition, at the interface between the GaN channel layer and $Al_x(In_yGa_{1-y})_{1-x}N$ buffer layer, discontinuity $\Delta E_C$ of conduction band energy becomes $\Delta EC=424$ meV, and a barrier (step) corresponding to this value is formed.

Furthermore, in a type of an $In_{yc}Ga_{1-yc}N$ channel layer/an $In_{ybuf}(Al_{xbuf}Ga_{1-xbuf})_{1-ybuf}N$ buffer layer, it is also possible to generate "negative" polarized charges continuously distributed in the buffer layer using "(Al composition and In composition) modulation" by changing In composition ybuf and Al composition [xbuf(1–ybuf)] of the buffer layer simultaneously, and reducing gradually Al composition [xbuf(1–ybuf)] and increasing gradually In composition from a substrate side to the interface with the channel layer. That is, it is possible to compensate estimated residual carrier concentration n in the order of $10^{15}$ $cm^{-3}$ in the buffer layer by performing "(Al composition and In composition) modulation" so that lattice constant a $(In_{ybuf}(Al_{xbuf}Ga_{1-xbuf})_{1-ybuf}N)$ of a quaternary system of mixed crystal of $In_{ybuf}(Al_{xbuf}Ga_{1-xbuf})_{1-ybuf}N$ may increase gradually, and, on the other hand, conduction band edge energy $E_C$ may reduce gradually, in a direction of going from the substrate side to the interface with the channel layer, and generating "negative" polarized charges which are derived from a change of spontaneous polarization and piezo polarization and are distributed continuously. Of course, at the interface with the $In_{yc}Ga_{1-yc}N$ channel layer, it is made that the lattice constant a $(In_{ybuf}(Al_{xbuf}Ga_{1-xbuf})_{1-ybuf}N)$ of a quaternary system of mixed crystal of $In_{ybuf}(Al_{xbuf}Ga_{1-xbuf})_{1-ybuf}N$ is almost equal to or is very slightly smaller than the lattice constant of an $In_{yc}Ga_{1-yc}N$ ternary system of mixed crystal $In_{yc}Ga_{1-yc}N$ of the channel layer. In addition, at the interface with the $In_{yc}Ga_{1-yc}N$ channel layer, it can be made that ED $(In_{ybuf}(Al_{xbuf}Ga_{1-xbuf})_{1-ybuf}N)$ of a quaternary system of mixed crystal of $In_{ybuf}(Al_{xbuf}Ga_{1-xbuf})_{1-ybuf}N$ is equal to EC of an $In_{yc}Ga_{1-yc}N$ ternary system of mixed crystal $In_{yc}Ga_{1-yc}N$ of the channel layer, or, preferably, energy discontinuity $\Delta E_C$ of the conduction band edge between both is made at least more than $\Delta E_C=200$ meV, and a barrier (step) corresponding to this value is formed.

In addition, also when selecting either of the construction of the AlGaN electron supply layer/$In_yGa_{1-y}N$ channel layer/buffer layer/AlN nucleation layer/substrate (where, $1>y \geq 0$) where the "Al composition modulated" $In_y(Al_xGa_{1-x})_{1-y}N$ buffer layer is adopted, the construction of the AlGaN electron supply layer/$In_yGa_{1-y}N$ channel layer/buffer layer/AlN nucleation layer/substrate (where, $1>y \geq 0$) where the "In composition modulated" $In_y(Al_xGa_{1-x})_{1-y}N$ buffer layer is adopted, or the construction of the AlGaN electron supply layer/$In_{yc}Ga_{1-yc}N$ channel layer/buffer layer/AlN nucleation layer/substrate (where, $1>yc \geq 0$) where the "(Al composition and In composition) modulated" $In_{ybuf}(Al_{xbuf}Ga_{1-xbuf})_{1-ybuf}N$ buffer layer is adopted which is described in this exemplary embodiment, regarding the AlGaN electron supply layer/InGaN channel layer, "various conditions" which are described in the first exemplary embodiment and are used when selecting the construction of the AlGaN electron supply layer/GaN channel layer/buffer layer/AlN nucleation layer/substrate where the "Al composition modulated" AlGaN layer (buffer layer) is adopted are completely applicable in a similar manner.

Exemplary Embodiment 3

In contrast to the construction of the second AlGaN layer/GaN layer/first AlGaN layer/AlN nucleation layer/substrate which is exemplified in the above-mentioned second exemplary embodiment, this third exemplary embodiment is a multilayered epitaxial film embodiment used as a "barrier layer" which adds an InAlGaN layer which has very thin film thickness to an interface between the GaN layer and first AlGaN layer, and suppresses inflow of carriers from the GaN layer to the first AlGaN layer. FIG. 11 shows the construction of the above-mentioned second AlGaN layer/GaN layer/InAlGaN layer/first AlGaN layer/AlN nucleation layer/substrate, and further, FIG. 12 shows section structure of a group III nitride semiconductor heterojunction FET prepared using it schematically.

The multilayer epitaxial layer which has the construction of the second AlGaN layer/GaN layer/InAlGaN layer/first AlGaN layer/AlN nucleation layer/substrate is prepared using C plane ((0001) plane) of SiC as substrate 1 and performing C plane ((0001) plane) growth of each layer by an MOCVD growth method. For example, an undoped AlN layer at 200 nm of film thickness is formed on a low-temperature growth condition on the C plane of SiC used as substrate 1. AlN nucleation layer 2 itself which is made up of this low-temperature growth undoped AlN film functions as an insulating nucleation layer. Subsequently, on AlN nucleation layer 2, undoped AlGaN buffer layer 3 at 1 μm (1000 nm) of film thickness, undoped InAlGaN channel back barrier layer 10 at 3 nm of film thickness, undoped GaN channel layer 4 at 10 nm of film thickness, and undoped AlGaN electron supply layer 5 at 45 nm of film thickness are successively epitaxially grown on normal high temperature growth conditions, which is construction.

Also in this third exemplary embodiment, undoped AlGaN buffer layer 3 is selected so that Al composition x(z) of the $Al_xGa_{1-x}N$ may reduce monotonically from an interface with AlN nucleation layer 2 to an interface with undoped GaN channel layer 4, that is, toward a film thickness direction (z-axis direction). In the third exemplary embodiment, Al composition x (z=1 μm) xt of the $Al_xGa_{1-x}N$ is selected at xt=0.05 at an interface (z=1 μm) with InAlGaN channel back barrier layer 10, and Al composition x (z=0 μm) E xb of the $Al_xGa_{1-x}N$ is selected at xb=0.30 at an interface (z=0) with AlN nucleation layer 2, respectively. In addition, in undoped AlGaN electron supply layer 5, Al composition x is set constant and Al0.2Ga0.8N with x=0.2 is selected.

On the other hand, in order to form a barrier between undoped GaN channel layer 4 and undoped AlGaN buffer layer 3, undoped InAlGaN channel back barrier layer 10 is selected so that conduction band edge energy difference; $\Delta E_C$ (InAlGaN/GaN) between the InAlGaN and GaN and conduction band edge energy difference; $\Delta EC$ (InAlGaN/$Al_{0.05}Ga_{0.95}N$) between $Al_xGa_{1-x}N$ (x=xt) in a uppermost surface side of AlGaN buffer layer 3, that is, $Al_{0.05}Ga_{0.95}N$ and the InAlGaN may fulfill at least $\Delta E_C$ (InAlGaN/GaN) >$\Delta E_C$ (InAlGaN/$Al_{0.05}Ga_{0.95}N$)>0. In such a case, on the basis of conduction band edge energy difference; $\Delta E_Q$ ($Al_{0.05}Ga_{0.95}N$/GaN) between $Al_{0.05}Ga_{0.95}N$ and GaN, since selection is performed so as to fulfill at least relationship of $\Delta E_C$ (InAlGaN/GaN)>$\Delta E_C$ ($Al_{0.05}Ga_{0.05}N$/GaN), a suppressing effect to electron injection from undoped GaN channel layer 4 to undoped AlGaN buffer layer 3 is improved by adding this InAlGaN channel back barrier layer 10.

In addition, it is desirable to select composition of the InAlGaN so that lattice constant a(InAlGaN) of InAlGaN which forms this InAlGaN channel back barrier layer 10 may fulfill relationship of a(GaN)≥a(InAlGaN)≥a($Al_{0.05}Ga_{0.05}N$) to lattice constant a (GaN) of the GaN and lattice constant a($Al_{0.05}Ga_{0.05}N$) of the $Al_{0.05}Ga_{0.05}N$.

Also in the AlGaN/GaN-type HJFET of this exemplary embodiment with construction shown in FIG. 12, source electrode 6 and drain electrode 7 which are given ohm contact on a surface of undoped AlGaN electron supply layer 5, and gate electrode 8 is formed between them. In addition, a surface of AlGaN electron supply layer 5 between source electrode 6 and gate electrodes 8, and gate electrode 8 and drain electrode 7 is covered with dielectric film 9 by SiN, and is given surface protection. In addition, although not clearly shown in FIG. 1, a position of gate electrode 8 is selected so that an interval between gate electrode 8 and drain electrode 7 may become wider than an interval between source electrode 6 and gate electrode 8.

Specifically, the SiN film which covers the surface of AlGaN electron supply layer 5 between source electrode 6 and drain electrode 7 is formed beforehand, and an opening for formation of gate electrode 8 is formed in a predetermined position on this SiN film. A surface of AlGaN electron supply layer 5 exposed in the opening is etched, and a shallow recess section is formed. Gate electrode 8 is prepared in this shallow recess section, and construction which has a recess type gate is adopted.

A preparation process of the AlGaN/GaN-type HJFET of this exemplary embodiment shown in FIG. 12 will be described simply. In order to achieve inter-device separation between FETs after finishing a series of epitaxial growth, mesa etching which reaches GaN channel layer 4 is given around each device using a mask etching method. That is, in this region, etching removal of undoped AlGaN electron supply layer 5 is performed, and inter-device separation mesas are formed. Subsequently, for example, metals such as Ti/Au are evaporated, and are given patterning into a predetermined form using a lift-off method using a photoresist mask with matching forms of source electrode 6 and drain electrode 7 provided on the surface of AlGaN electron supply layer 5. Ohmic contact is taken by performing annealing treatment of the metal layers, such as Ti/Au (10 nm to 200 nm in thickness), which are given patterning into these predetermined forms in a flow of inert gas at 800° C. for 1 to 3 minutes.

Next, for example, the SiN film at 80 nm of film thickness is formed by applying a vapor phase depositing method, such as a plasma CVD method, so that a whole surface may be covered. Using a resist mask, selective etching is performed and an openings for formation of gate electrode 8 is formed in a predetermined position on the SiN film which covers the surface of AlGaN electron supply layer 5 between source electrode 6 and drain electrode 7. In addition, when forming the resist mask used for formation of the above-mentioned opening, in order to achieve a target width of 0.15 μm, an electron beam lithography method is adopted.

A surface of AlGaN electron supply layer 5 exposed in the opening is slightly etched, and a shallow recess section is formed. In addition, this recess depth d is selected at 25 nm in this exemplary embodiment. Hence, directly under the recess section, a thickness of AlGaN electron supply layer 5 becomes 20 nm after etching.

Subsequently, gate metals, such as Ni/Au (10 nm to 200 nm in thickness), are evaporated and lifted off on the surface of AlGaN electron supply layer 5 which is under the above-mentioned opening and is given recess formation using a resist mask, and are given patterning into a predetermined form. In such a case, gate electrode 9 patterned is used as a gate electrode which has a T-form sectional shape, and a part of which covers an SiN film surface adjacent to the opening (recess section). To an opening (recess section), dimensional accuracy of alignment of this T-form upper face shape and size is 10 nm, and an electron beam lithography method is adopted for exposure of the resist mask used for the lift-off.

When formation of gate electrode 8 is completed, the surface of AlGaN electron supply layer 5 between source electrode 6 and gate electrode 8 and between gate electrode 8 and drain electrode 7 becomes in a state of being covered with the SiN film, and this residual SiN film is used as it is as dielectric film 9.

The prepared AlGaN/GaN-type HJFET becomes a so-called HEMT-type FET using two-dimensional electron gas generated at the interface between AlGaN electron supply layer 5 and GaN channel layer 4. Its gate length Lg is equivalent to 0.15 μm in width of the recess section under the above-mentioned opening. The aspect ratio: Lg/a of gate length Lg to active layer thickness (gate-to-channel distance) a becomes Lg/a≈150/30=5 since active layer thickness a is equivalent to a sum of the thickness of AlGaN electron supply layer 5, which is directly under the recess section and remains after etching, and the thickness of the channel layer, that is, 30 nm.

On the other hand, as for $Al_xGa_{1-x}N$ (0.30≥x≥0.05) which forms AlGaN buffer layer 3 which is given "Al composition modulation", when undoped $Al_xGa_{1-x}N$ layer having corresponding uniform Al composition is prepared temporarily, residual carriers are electrons, the residual carrier concentration n is dependent on growth conditions and Al composition, and dispersion becomes generally in the order of $10^{14}$ to $10^{15}$ cm$^{-3}$ of carriers to some extent. On the other hand, in this third exemplary embodiment, it is set that the Al composition x(z) of $Al_xGa_{1-x}N$ which forms undoped AlGaN layer 3 linearly reduces from an interface (z=0) with AlN nucleation layer 2 to an interface (z=1 μm) with GaN channel back barrier layer 10. That is, a film thickness $t_{buffer}$ of whole AlGaN buffer layer 3 is 1 μm, and Al composition x(z) is expressed as follows, as a function of a thickness (z/μm) in a depth direction (Z axial direction).

$$x(z) = xt \cdot z + xb \cdot (1-z)$$
$$= 0.05z + 0.30(1-z)$$

In the construction of the above-mentioned multilayered epitaxial film, polarized charge density; σ(P)/e cm$^{-3}$ (where, e denotes electronic charge (unit charge) of an electron) which is generated in undoped AlGaN buffer layer 3 which is given this linear "Al composition modulation" is negative polarized charges with σ(P)/e 1.1×10$^{17}$ cm$^{-3}$ to the extent when referring to an estimated result shown in FIG. 8. That is, density σ(P)/e≈1.1×10$^{17}$ cm$^{-3}$ of the negative polarized charge which is induced in undoped AlGaN buffer layer 3 which is given "Al composition modulation" exceeds estimated residual carrier concentration n in the order of $10^{14}$ to $10^{15}$ cm$^{-3}$. Hence, it is possible for this induced negative polarized charge to compensate completely positive space charges corresponding to the above-mentioned residual carrier (electron) density n and resulting from an ionized impurity level (or intentionally doped donor level with comparatively low concentration) which exists in undoped AlGaN buffer layer 3. In consequence, it becomes in a state that the negative space charges in the order of $10^{16}$ cm$^{-3}$ exists by the residual negative polarized charges in undoped AlGaN buffer layer 3 which is given "Al composition modulation". Effectually, undoped AlGaN buffer layer 3 which is given "Al composition modulation" plays the function equivalent to the p– layer in which negative space charges in the order of $10^{16}$ cm$^{-3}$ exist.

Figure 13:
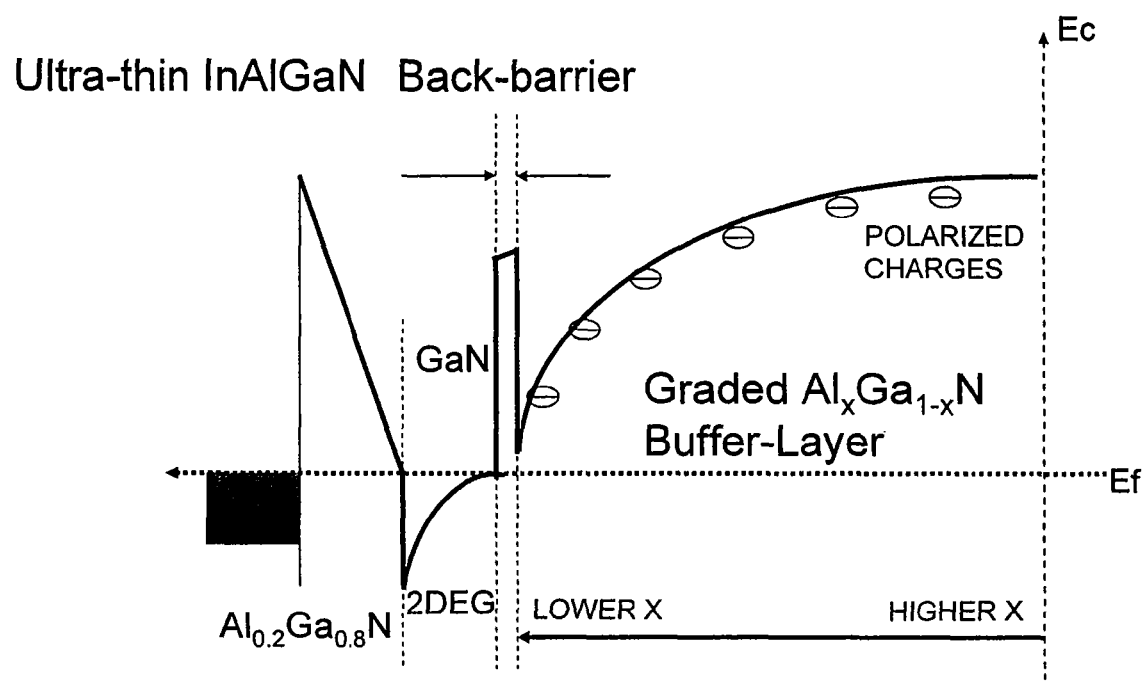
FIG. 13 is a diagram illustrating schematically a band diagram of a conduction band edge in multilayered epitaxial structure under a gate electrode of an AlGaN/GaN-type HJFET according to the third exemplary embodiment of the present invention. Reference symbol x illustrated in the figure denotes Al composition in an AlGaN buffer layer which is given "Al composition modulation"

FIG. 13 illustrates schematically a band diagram of the multilayered epitaxial film directly under gate electrode 9 of the above-described AlGaN/GaN-type HJFET. Since undoped AlGaN buffer layer 3 which is given "Al composition modulation" plays the function equivalent to the p– layer in which negative space charges in the order of $10^{16}$ cm$^{-3}$ exist effectually, an energy position of a conduction band edge of this region decreases with keeping a convex shape from the interface (z=0) with AlN nucleation layer 2 to the interface (z=1 μm) with InAlGaN channel back barrier layer 10. In addition, InAlGaN channel back barrier layer 10 with a very thin film thickness exists between undoped AlGaN buffer layer 3 and GaN channel layer 4, and to the electron injection from GaN channel layer 4 to undoped AlGaN buffer layer 3, a barrier (step) corresponding to conduction band edge energy difference; $\Delta E_C$(InAlGaN/GaN) between the InAlGaN and GaN is formed. In the above-described second exemplary embodiment, what opposes to the electron injection from GaN channel layer 4 to undoped AlGaN buffer layer 3 is the barrier (step) which is equivalent to conduction band edge energy difference; $\Delta E_C(Al_{0.05}Ga_{0.95}N/GaN)$ between the $Al_{0.05}Ga_{0.95}N$ and GaN, and since $\Delta E_C$(InAlGaN/GaN)>$\Delta E_C(Al_{0.05}Ga_{0.95}N/GaN)$ holds, the electron injection from GaN channel layer 4 to undoped AlGaN buffer layer 3 over InAlGaN channel back barrier layer 10 is further suppressed.

In comparison with the AlGaN/GaN-type HJFET of the second exemplary embodiment, the above-mentioned band barrier formed by the InAlGaN channel back barrier layer 10 existing between undoped AlGaN buffer layer 3 and GaN channel layer 4 has a function of further increasing a carrier (electron) confinement effect into GaN channel layer 4, and exerts an effect of enhancing a pinch-off characteristic of the AlGaN/GaN-type HJFET obtained. In addition, in the AlGaN/GaN-type HJFET with the construction illustrated in FIG. 11, the active layer thickness (gate-to-channel distance) a is equivalent to a sum of the thickness of AlGaN electron supply layer 5 directly under gate electrode 8, and the thickness of GaN channel layer 4, and when the aspect ratio: Lg/a of gate length Lg to active layer thickness (gate-to-channel distance) a becomes small by shortening gate length Lg, the short channel effect is easy to be caused, but an effect of suppressing this short channel effect is also exerted with improvement in the pinch-off characteristic.

Hence, in comparison with the AlGaN/GaN-type HJFET of the second exemplary embodiment using the undoped GaN buffer layer which is given "Al composition modulation", the AlGaN/GaN-type HJFET of this exemplary embodiment is more excellent in improvement of the pinch-off characteristics and in an effect of suppression of the short channel effect, and can improve more remarkably a DC gain and an RF gain in the case of the high voltage operation.

In addition, as for an effect caused by utilization of the undoped AlGaN buffer layer which is given "Al composition modulation", the AlGaN/GaN type HJFET of this third exemplary embodiment, and the AlGaN/GaN type HJFET of the second exemplary embodiment mentioned above are essentially equivalent. Hence, the various allowable modification of construction, already described, to the AlGaN/GaN type HJFET of the second exemplary embodiment mentioned above is available to the AlGaN/GaN type HJFET of this third exemplary embodiment, and its effect is also equivalent.

Thus, in this exemplary embodiment mentioned above, when the film thickness of whole undoped AlGaN buffer layer 3 is made into 1 μm, Al composition x (z=1 μm) E xt of the $Al_xGa_{1-x}N$ is selected at xt=0.05 at the interface (z=1 μm) with In AlGaN channel back barrier layer 10, and Al composition x (z=0 μm) E xb of the $Al_xGa_{1-x}N$ is selected at xb=0.30 at the interface (z=0) with AlN nucleation layer 2, respectively, and density $\sigma(P)/e \approx 1.1 \times 10^{17}$ cm$^{-3}$ of negative polarized charges which are induced in this undoped AlGaN buffer layer 3 which is given "Al composition modulation" is obtained. When making density $\sigma(P)/e$ of negative polarized charges which are induced in undoped AlGaN buffer layer 3 which is given "Al composition modulation" into at least $1 \times 10^{16}$ cm$^{-3}$ or more, undoped AlGaN buffer layer 3 which is given "Al composition modulation" exhibits a function equivalent to a p− layer effectually. When referring to the estimated result shown in FIG. 8, when the film thickness of whole undoped AlGaN buffer layer 3 is made into 1 μm, when Al composition x (z=1 μm) E xt of the $Al_xGa_{1-x}N$ is selected at xt=0.05 at the interface (z=1 μm) with InAlGaN channel back barrier layer 10, and Al composition x (z=0 μm) E xb of the $Al_xGa_{1-x}N$ is selected at xb 0.10 at the interface (z=0) with AlN nucleation layer 2, the above-mentioned condition is fulfilled. That is, when the film thickness of whole undoped AlGaN buffer layer 3 is made into 1 μm, when Al composition x (z=1 μm) E xt of the $Al_xGa_{1-x}N$ is selected at xt=0.05 at the interface (z=1 μm) with InAlGaN channel back barrier layer 10, and Al composition x (z=0 μm)≡xb of the $Al_xGa_{1-x}N$ is selected at xb=0.1 to 0.2 at the interface (z=0) with AlN nucleation layer 2, it becomes in a state that the sufficient effect is exerted.

In addition, in this exemplary embodiment, as for the undoped AlGaN buffer layer 3 which is given "Al composition modulation", its Al composition x(z) is set to reduce linearly from the interface (z=0) with AlN nucleation layer 2 to the interface (z=1 μm) with InAlGaN channel back barrier layer 10, and energy $E_c$ of the conduction band edge of the $Al_xGa_{1-x}N$ itself which forms it is also made to reduce linearly from the interface (z=0) with AlN nucleation layer 2 to the interface (z=1 μm) with InAlGaN channel back barrier layer 10. On the other hand, in undoped AlGaN buffer layer 3, when the percentage reduction: $\{\partial x(z)/\partial z\}$ of Al composition x(z) is selected so that $\{\partial x(z)/\partial z\}$ may reduce from the interface (z=0) with AlN nucleation layer 2 to the interface (z=1 μm) with InAlGaN channel back barrier layer 10, the rate of reduction $\{\partial E_C(x(z))/\partial z\}$ of energy $E_c(x)$ of the conduction band edge of the $Al_xGa_{1-x}N$ itself reduces from the interface (z=0) with AlN nucleation layer 2 to the interface (z=1 μm) with InAlGaN channel back barrier layer 10. In such a case, since an effect of reduction of the rate of reduction $\{\partial E_C(x(z))/\partial z\}$ of energy $E_C(x)$ of the conduction band edge of the $Al_xGa_{1-x}N$ itself is also added to an action of polarized charges, a gradient of an energy position of the conduction band edge of undoped AlGaN buffer layer 3 becomes larger near the interface (z=1 μm) with InAlGaN channel back barrier layer 10. Hence, the effect of suppressing the electron injection from GaN channel layer 4 into undoped AlGaN buffer layer 3 further increases.

In addition, although using undoped AlGaN buffer layer 3 which is given "Al composition modulation" and adopting the condition that residual carriers are electrons in this exemplary embodiment, when temporarily changing the epitaxial growth method or the growth conditions and selecting a condition that residual carriers become holes about undoped AlGaN buffer layer 3 itself, undoped AlGaN buffer layer 3 itself becomes a p− layer, and hence, a gradient of the conduction band edge shows a further convex shape. Alternatively, when using a p− type AlGaN buffer layer by intentionally making acceptors low concentration doped instead of the undoped AlGaN buffer layer, the gradient of the conduction band edge shows a still further convex shape.

In addition, the InAlGaN channel back barrier layer 10 at a very thin film thickness exists between undoped AlGaN buffer layer 3 and GaN channel layer 4, and in those two interfaces, polarized charges resulting from difference of polarization P between the $Al_xGa_{1-x}N$ with Al composition x=0.05 and the InAlGaN, and difference of polarization P between the InAlGaN and GaN are generated in a sheet, respectively. In addition, when the polarized charges generated in a sheet in these two approaching interfaces are totaled:

$$\{P(Al_{0.05}Ga_{0.95}N) - P(InAlGaN)\} + \{P(InAlGaN) - P(GaN)\} = \{P(Al_{0.05}Ga_{0.95}N) - P(GaN)\}$$

it is estimated that negative polarized charges in sheet charge density of $2 \times 10^{12}$ (/cm$^2$) at the maximum are generated substantially at an interface region between undoped AlGaN buffer layer 3 and GaN channel layer 4. That is, in the second exemplary embodiment mentioned above, it is estimated that this is substantially the same state as a situation that negative polarized charges are generated in the sheet charge density of $2 \times 10^{12}$ (/cm$^2$) at the maximum at the interface between undoped AlGaN buffer layer 3 and GaN channel layer 4.

In such extent, influences to a band form near the interfaces and channel carrier density stored in the GaN channel layer are not so great. It is because carriers by two-dimensional electron gas induced by the AlGaN/GaN heterojunction in the normal AlGaN/GaN heterojunction HJFET (Al composition of 0.2 etc.) have sheet charge concentration in the order of $10^{13}$ (/cm$^2$), which is about one-digit larger.

Furthermore, also in this exemplary embodiment, the film thickness of GaN channel layer 4 is selected at 10 nm, and an effect that negative polarized charges induced at the interface (z=1 μm) between such undoped AlGaN buffer layer 3 and GaN channel layer 4 reduces a total amount of two-dimensional electron gas generated at the interface between AlGaN electron supply layer 5 and GaN channel layer 4 is limited.

Furthermore, also in the HEMT structure of this exemplary embodiment, similarly to the HEMT structure described in the above-mentioned second exemplary embodiment, sufficient conditions for carriers (electrons) accumulated in the GaN channel layer not to be drained, that is, "suitable conditions" for application to the HEMT are as follows.

That is, also in the field-effect transistor according to this exemplary embodiment, when selecting the construction of making it in the depletion (normally-on) mode, a substrate itself is a material which does not exhibit a polarization effect, and in a state that both of the gate electrode and substrate are grounded, polarized charges which exist in a semiconductor layer region are in a state that "negative" polarized charges (Q1) are usually distributed at the interface between the electron supply layer with constant composition and the gate electrode (metal) on a surface, and "positive" polarized charges (Q2) are usually distributed at the interface between the electron supply layer with constant composition, and the channel layer, and, when composition of an electron supply layer is not constant", positive" or "negative" polarized charges ($\Sigma Q_{supplier}$) distributed in the electron supply layer according to a local composition rate of changes are distributed, "negative" polarized charges (Q3') are distributed at the interface between the channel layer and a "composition-modulated" buffer layer contacting through the InAlGaN channel back barrier layer, "negative" polarized charges continuously distributed over a whole internal area of the "composition-modulated" buffer layer ($\Sigma Q_{buffer}$) are distributed, "negative" polarized charges (Q4) are distributed at the interface of the "composition-modulated" buffer layer with an AlN nucleation layer, and "positive" polarized charges (Q5) are distributed at the interface of the AlN nucleation layer with a substrate surface, respectively.

On the other hand, the electron supply layer itself is depleted and the "positive" space charges ($\Sigma Q_{SD1}$), resulting from the ionized donor level, exist inside this electron supply layer. In addition, the shallow donor level included in the "composition-modulated" buffer layer is also ionized, and the "positive" space charges ($\Sigma Q_{SD2}$) derived from the ionized donor level also exist inside the "composition-modulated" buffer layer.

In addition, a surface of the electron supply layer is covered with the gate electrode (metal) and a dielectric film as a passivation film in both sides of the gate electrode (metal). In many cases, in the surface of the electron supply layer which contacts the gate electrode (metal) and the surface of the electron supply layer which contacts the passivation film, comparatively deep surface levels (deep donor levels) exist, and these deep surface levels (deep donor levels) are also ionized. In consequence, in the surface of the electron supply layer which contacts the gate electrode (metal) and the surface of the electron supply layer which contacts the passivation film, "positive" surface charges ($Q_{SS}$) derived from the ionized deep surface levels (deep donor levels) exist.

Electrical neutrality condition is fulfilled by "positive" space charges (or "negative" space charge resulting from the ionized acceptor level) resulting from these ionized donor levels and being immobilized, "positive" surface charges localized in the surface of the electron supply layer which contacts the gate electrode (metal) and the surface of the electron supply layer which contacts the passivation film, and polarized charges which exist in the semiconductor layer region, and the carriers (electrons) accumulated in the channel layer.

Usually, "negative" polarized charges (Q1) which are generated at the interface between the electron supply layer and surface gate electrode (metal) are in the state of being almost compensated by the "positive" surface charges ($Q_{SS}$) which are localized in the surface of the electron supply layer, which contacts the gate electrode (metal) (and the surface of the electron supply layer which contacts the passivation film). That is, it becomes $Q1 \approx Q_{SS}$.

Furthermore, with considering that the "positive" space charges ($\Sigma Q_{SD2}$) derived from the ionized donor level which exists in the "composition modulated" buffer layer are few, the "negative" polarized charges (Q3') generated at the interface between the channel layer and "composition modulated" buffer layer contacting through the InAlGaN channel back layer, "negative" polarized charges continuously distributed over a whole internal area of the "composition-modulated" buffer layer ($\Sigma Q_{buffer}$), and "negative" polarized charges (Q4) generated at the interface of the "composition modulated" buffer layer and AlN nucleation layer become in a state of being almost compensated by "positive" polarized charges (Q5) generated at the interface in an AlN nucleation layer side. That is, $(Q5+\Sigma Q_{SD2})=(Q3'+\Sigma Q_{buffer}+Q4)$.

In addition, a total amount ($\Sigma Q_C$) of the carriers (electrons) accumulated in the channel layer becomes approximately equal to an arithmetic sum ($Q2+\Sigma Q_{SD1}$) of the "positive" polarized charges (Q2) which are generated at the interface between the electron supply layer and channel layer, and the "positive" space charges ($\Sigma Q_{SD1}$) (or "negative" space charge resulting from the ionized acceptor level) resulting from ionized donor levels inside the electron supply layer. That is, $(\Sigma Q_C)=(Q2+\Sigma Q_{SD1})$ holds.

An overall electrical neutrality condition becomes $(Q5+\Sigma Q_{SD2})+(Q2+\Sigma Q_{SD1})=(Q3'+\Sigma Q_{buffer}+Q4)+(\Sigma Q_C)$. For example, when the positive polarized charges (Q5) which are generated in an underlying layer (interface in an AlN nucleation layer side) of the buffer layer are compensated with electrons, such as hot carriers injected by a certain cause and Q5 reduces, so as to maintain the above-mentioned electrical neutrality condition, the total amount ($\Sigma Q_C$) of the carriers (electrons) accumulated in the channel layer reduces. Temporarily, when Q5 disappears completely, the total amount ($\Sigma Q_C$) of the carriers (electrons) accumulated in the channel layer becomes $(\Sigma Q_C)=(\Sigma Q_{SD2})+(Q2+\Sigma Q_{SD1})-(Q3'+\Sigma Q_{buffer}+Q4)$. In such a case, with considering that the "positive" space charges ($\Sigma Q_{SD2}$) derived from the ionized donor level which exists in the "composition-modulated" buffer layer are few, a total amount ($\Sigma Q_C$) of the carriers (electrons) accumulated in the channel layer decreases to a level of $(\Sigma Q_C) \approx (Q2+\Sigma Q_{SD1})-(Q3'+\Sigma Q_{buffer}+Q4)$ approximately. A sufficient condition that the total amount ($\Sigma Q_C$) of the carriers (electrons) accumulated in the channel layer is not drained also in this phase is expressed as $(Q2+\Sigma Q_{SD1})>(Q3'+\Sigma Q_{buffer}+Q4)$. That is, as a general condition, it becomes the sufficient condition that the sum total $(Q2+\Sigma Q_{SD1})$ of the "positive" charges which are generated in the electron supply layer is more than the sum total $(Q3'+\Sigma Q_{buffer}+Q4)$ of the "negative" charges which are generated inside the "composition modulated" buffer layer and at the interface with the channel layer.

Hence, in the construction of the second AlGaN layer (AlGaN electron supply layer)/GaN layer (GaN channel layer)/InAlGaN layer/first AlGaN layer ("Al composition modulated" AlGaN buffer layer)/AlN nucleation layer/substrate, it is desirable that a sum total of "negative" polarized charges continuously distributed at least in the first AlGaN layer ("Al composition modulated" AlGaN buffer layer) is made to be less than a sum total of "positive" polarized charges at the interface between the AlGaN electron supply layer and GaN channel layer. Since the "negative" polarized charges continuously distributed in the first AlGaN layer ("Al composition modulated" AlGaN buffer layer) depends on a rate of change: $\partial x(z)/\partial z$ of Al composition $x(z)$ in the "Al composition modulated" AlGaN buffer layer, it is not desirable to enlarge it excessively. As described above, the rate of change: $|\partial x(z)/\partial z|$ of the Al composition $x(z)$ is sufficient in the range of fulfilling $|\partial x(z)/\partial z|$ 0.05 µm$^{-1}$, and it is not desirable to enlarge it excessively. Usually, it is preferable to select the rate of change: $|\partial x(z)/\partial z|$ of the Al composition $x(z)$ in the range of 0.30 µm$^{-1} \geq |\partial x(z)/\partial z|$ 0.05 µm$^{-1}$.

When the above-mentioned Al composition rate of change is selected, the "Al composition modulated" AlGaN buffer layer becomes in a p-like state because of the "negative" polarized charges continuously distributed in it, and since the InAlGaN channel barrier layer is provided between the "Al composition modulated" AlGaN buffer layer and GaN channel layer, even if Al composition xt of the "Al composition modulated" AlGaN buffer layer at the interface with this InAlGaN layer is set at xt=0, electron injection from the channel layer to the buffer layer can be suppressed sufficiently, In addition, it is preferable to make the Al composition xt of the "Al composition modulated" AlGaN buffer layer at this interface with the InAlGaN layer into at least 0.02 or more, and more preferably, into 0.05 usually. For example, when film thickness $t_{buffer}$ of the "Al composition modulated" AlGaN buffer layer is made into 1 µm, when the Al composition xt of a uppermost surface of the "Al composition modulated" AlGaN buffer layer is set at xt=0.05 and the rate of change: $|\partial x(z)/\partial z|$ of the Al composition $x(z)$ is selected in the range of 0.30 µm$^{-1} \geq |\partial x(z)/\partial z| \geq 0.05$ µm$^{-1}$, the Al composition xb of the lowermost surface of the "Al composition modulated" AlGaN buffer layer is selected in the range of $0.35 \geq xb \geq 0.10$.

On the other hand, when the AlGaN electron supply layer is usually formed of AlGaN with constant Al composition, as for the Al composition, in order to provide a band barrier necessary for accumulating carriers (electrons) at the interface between the AlGaN electron supply layer and GaN channel layer, it is preferable the Al composition xs of this AlGaN electron supply layer is at least in the range of 0.15 or more, and more preferably, in the range of $050 \geq xs \geq 0.20$.

Temporarily, even in the case that film thickness $t_{buffer}$ of the "Al composition modulated" AlGaN buffer layer is made into 1 μm, and that Al composition xt of an uppermost surface of the "Al composition modulated" AlGaN buffer layer is set at xt=0.00, when the rate of change: $|\partial x(z)/\partial z|$ of Al composition $x(z)$ is selected in the range of $0.35\ \mu m^{-1} \geq |\partial x(z)/\partial z| 0.10\ \mu m^{-1}$, an average value: $x(z)_{av.}$ of the Al composition $x(z)$ of the "Al composition modulated" AlGaN buffer layer becomes $x(z)_{av.} \approx \frac{1}{2}-(xt+xb)$, and hence, becomes in the range of $0.175\ x(z)_{av.} \geq 0.05$. In addition, when film thickness $t_{buffer}$ of the "Al composition modulated" AlGaN buffer layer is made into 1 μm, Al composition xt of the uppermost surface of the "Al composition modulated" AlGaN buffer layer is set at xt=0.05 or more, and the rate of change: $|\partial x(z)/\partial z|$ of Al composition $x(z)$ is selected in the range of $0.30\ \mu m^{-1} \geq |\partial x(z)/\partial z| \geq 0.05\ \mu m^{-1}$, the average value: $x(z)_{av.}$ of Al composition $x(z)$ of the "Al composition modulated" AlGaN buffer layer becomes $x(z)_{av.} \approx \frac{1}{2}-(xt+xb)$, and hence, becomes in the range of $0.20\ x(z)_{av.} \geq 0.075$. Hence, under the above-described conditions, in comparison of an average value: $xs_{av.}$ of Al composition xs of the AlGaN electron supply layer with the average value: $x(z)_{av.}$ of Al composition $x(z)$ of the "Al composition modulated" AlGaN buffer layer, It is preferable to set it as $xs_{av.} \geq x(z)_{av.}$.

The above-described AlGaN/GaN-type HJFET has the construction that, in the $Al_xGa_{1-x}N$ which forms undoped AlGaN layer 3 which is given "Al composition modulation", Al composition $x(z)$ continuously reduces from the interface (z=0) with AlN nucleation layer 2 to the interface (z=1 μm) with InAlGaN channel-back barrier layer 10. The polarization P of $Al_xGa_{1-x}N$ $(x(z))$ forms the situation of changing continuously, using this Al composition gradient $x(z)$, it is the multilayered epitaxial film structure which induces polarized charge density: $\sigma(P)=-\partial\{P(x(z))\}/\partial z \approx -\partial\{P(x)\}/\partial x \cdot \partial x(z)/\partial z$.

When construction that Al composition $x(z)$ stepwise reduces at a narrow thickness step δz instead of the above-described $Al_xGa_{1-x}N$ whose composition changes continuously is selected, it becomes in a state that polarized charge $\sigma(P)=\{P(x(z))-P(x(z+\delta z))\}$ occurs in a sheet at an interface formed every thickness step δz. In such a case, effectual polarized charge density becomes $\sigma(P)/\delta z=\{P(x(z))-P(x(z+\delta z))\}/\delta z=-\{P(x(z+\delta z))-P(x(z))\}/\delta x(z) \cdot \delta x(z)/\delta z$, and when thickness step δz is small enough, it becomes substantially within difference from a value in the above-mentioned differentiation notation.

Similarly to the type of the GaN channel layer/"Al composition modulated" InAlGaN channel back barrier layer described above, also in a generalized type of an $In_yGa_{1-y}N$ channel layer/InAlGaN channel back barrier layer/$In_y(Al_xGa_{1-x})_{1-y}N$ buffer layer, when making In composition y constant and giving "Al composition modulation" which reduces Al composition (x(1-y)) from a substrate side to the interface with the channel layer, it is possible to generate "negative" polarized charges continuously distributed in the $In_y(Al_xGa_{1-x})_{1-y}N$ buffer layer. In such a case, when the rate of change of Al composition (x(1-y)) is selected in the range corresponding to the above-described embodiment, it becomes possible to compensate the n-type residual carriers, which exist in the $In_y(Al_xGa_{1-x})_{1-y}N$ buffer layer by the "negative" polarized charges generated.

In addition, in a type of a GaN channel layer/InAlGaN channel back barrier layer/$Al_x(In_yGa_{1-y})_{1-x}N$ buffer layer, when making Al composition x constant and giving "In composition modulation", which increases In composition ((1-x)y) from the substrate side to the interface with the channel layer, it is possible to generate "negative" polarized charges continuously distributed in the $Al_x(In_yGa_{1-y})_{1-x}N$ buffer layer. For example, when fixing Al composition x at x=0.3 and making the film thickness of the whole undoped $Al_x(In_yGa_{1-y})_{1-x}N$ buffer layer into 1 μm, "In composition modulation" which increases In composition linearly is used by making In composition $[(1-x)y](z=0\ \mu m)$ into $[(1-x)y]=0$ at the interface (z=0) with the nucleation layer and making In composition $[(1-x)y](z=1\ \mu m)$ into $[(1-x)y]=0.066$ at the interface (z=1 μm) with the GaN channel layer. In such a case, a lattice constant of x)y is almost in agreement with a lattice constant of GaN, and "negative" polarized charges continuously distributed in charge density of $7.18\times10^{16}$ (cm$^{-3}$) in the "In composition modulated" $Al_x(In_yGa_{1-y})_{1-x}N$ buffer layer are generated. Hence, it is possible to compensate the estimated residual carrier concentration n the order of $10^{15}$ cm$^{-3}$ in the "In composition modulated" $Al_x(In_yGa_{1-y})_{1-x}N$ buffer layer.

Furthermore, in a type of an $In_{yc}Ga_{1-yc}N$ channel layer/an InAlGaN channel back barrier layer/an $In_{ybuf}(Al_{xbuf}Ga_{1-xbuf})_{1-ybuf}N$ buffer layer, it is also possible to generate "negative" polarized charges continuously distributed in the buffer layer using "(Al composition and In composition) modulation" which changes In composition $y_{buf}$ and Al composition $[x_{buf}(1-y_{buf})]$ of the buffer layer simultaneously, and in which Al composition $[x_{buf}(1-y_{buf})]$ reduces gradually from the substrate side to the interface with the InAlGaN channel back barrier layer, and the In composition increases gradually. That is, it is possible to compensate residual carrier concentration n, which is estimated to be in the order of $10^{15}$ cm$^{-3}$, in the buffer layer by performing "(Al composition and In composition) modulation" so that lattice constant a $(In_{ybuf}(Al_{xbuf}Ga_{1-xbuf})_{1-ybuf}N)$ of a quaternary system of mixed crystal of $In_{ybuf}(Al_{xbuf}Ga_{1-xbuf})_{1-ybuf}N$ may increase gradually from the substrate side to the interface with the InAlGaN channel back barrier layer, and, on the other hand, conduction band edge energy $E_C$ may reduce gradually, and generating "negative" polarized charges which are derived from a change of spontaneous polarization and piezo polarization. Of course, at the interface with the InAlGaN channel back barrier layer, it is made that the lattice constant a $(In_{ybuf}(Al_{xbuf}Ga_{1-xbuf})_{1-ybuf}N)$ of a quaternary system of mixed crystal of $In_{ybuf}(Al_{xbuf}Ga_{1-xbuf})_{1-ybuf}N$ is almost equal to or is very slightly smaller than the lattice constant a of an $In_{yc}Ga_{1-yc}N$ ternary system of mixed crystal $In_{yc}Ga_{1-yc}N$ of the channel layer. In addition, at the interface with the InAlGaN channel back barrier layer, it can be made that $E_C$ $(In_{ybuf}(Al_{xbuf}Ga_{1-xbuf})_{1-ybuf}N)$ of a quaternary system of mixed crystal of $In_{ybuf}(Al_{xbuf}Ga_{1-xbuf})_{1-ybuf}N$ is equal to $E_C$ of an $In_{yc}Ga_{1-yc}N$ ternary system of mixed crystal $In_{yc}Ga_{1-yc}N$ of the channel layer, or, preferably, energy discontinuity $\Delta E_C$ of the conduction band edge between both is made at least more than $\Delta E_C=200$ meV, and a barrier (step) corresponding to this value is formed.

In addition, also when selecting the construction of the AlGaN electron supply layer/$In_yGa_{1-y}N$ channel layer/InAlGaN channel back barrier layer/buffer layer/AlN nucleation layer/substrate (where, $1>y\geq0$) where the InAlGaN channel back barrier layer described in this exemplary embodiment is provided, regarding the AlGaN electron supply layer/ $In_yGa_{1-y}N$ channel layer, "various conditions" used when selecting the construction of the AlGaN electron supply layer/

GaN channel layer/buffer layer/AlN nucleation layer/substrate where the "Al composition-modulated" AlGaN layer (buffer layer) described previously is adopted are completely applicable in a similar manner.

Exemplary Embodiment 4

In this fourth exemplary embodiment, instead of the construction that Al composition x(z) reduces stepwise at the above-mentioned narrow thickness step δz, periodic potential structure with a film thickness period Lp (=δz+δB) which is given "Al composition modulation" that $Al_xGa_{1-x}N$ with a very thin film thickness of thickness δz and an InAlGaN barrier layer with a very thin film thickness of thickness δB are stacked by turns and Al composition of $Al_xGa_{1-x}N$ reduces monotonically as a whole is used.

Figure 14:
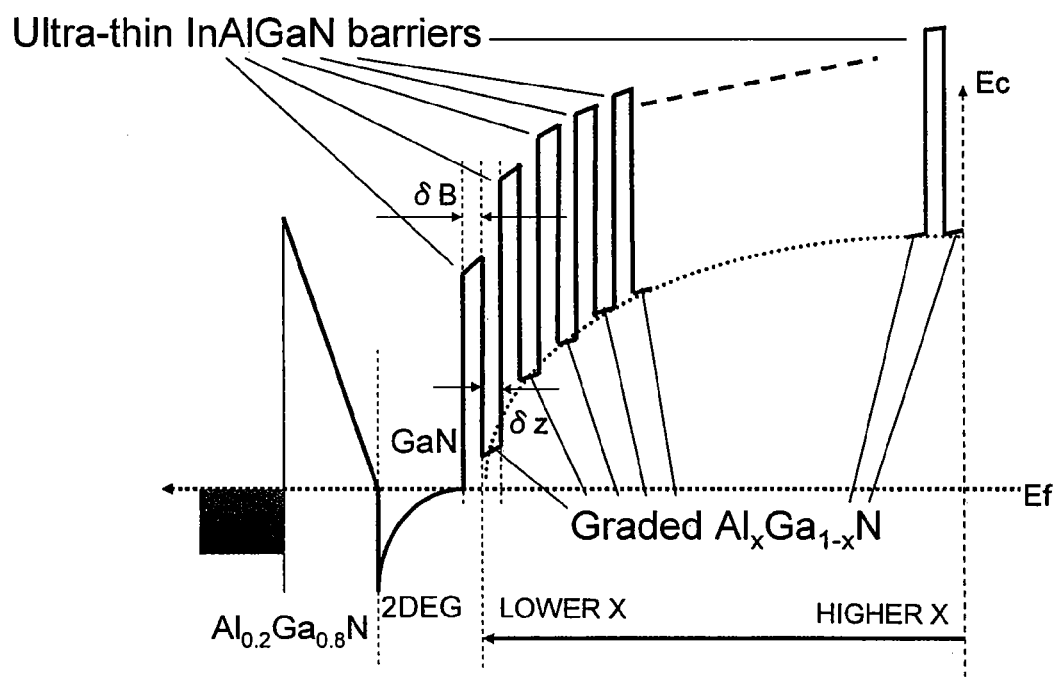
FIG. 14 is a diagram illustrating schematically a band diagram of a conduction band edge in multilayered epitaxial structure under a gate electrode of an AlGaN/GaN-type HJFET according to the fourth exemplary embodiment of the present invention. In a buffer layer, very thin InAlGaN barrier layers are inserted between respective layers of very thin AlGaN buffer layers which are given "Al composition modulation" step-wise, whereby periodic potential structure is formed therein. In the drawing, $\Delta z$ denotes a film thickness of the very thin AlGaN buffer layer which is given "Al composition modulation", and, $\Delta B$ denotes a film thickness of the very thin InAlGaN barrier layer. In addition, reference symbol x illustrated in the drawing denotes Al composition in an AlGaN buffer layer which is given "Al composition modulation".

FIG. 14 illustrates schematically a band diagram of a multilayered epitaxial film directly under gate electrode 9 of an AlGaN/GaN-type HJFET according to the fourth exemplary embodiment. In construction of a second AlGaN layer/a GaN layer/an InAlGaN layer (InAlGaN channel back barrier layer)/an "Al composition modulated" buffer layer/an AlN nucleation layer/a substrate, the multilayered epitaxial film adopts structure that this $Al_xGa_{1-x}N$ layer and the InAlGaN barrier layer are stacked by turns as the "Al composition modulated" buffer layer.

In the structure that this $Al_xGa_{1-x}N$ layer and the InAlGaN barrier layer are stacked by turns, when thicknesses Δz and ΔB of respective layers are made smaller than a de Broglie wavelength λ=h/p (where, h: Planck's constant and p: momentum of electron) of an electron, the above-mentioned periodic potential structure becomes one similar to so-called superstructure. That is, since the InAlGaN barrier layer provided between each $Al_xGa_{1-x}N$ layers is thinner than the de Broglie wavelength λ (about 10 nm) of an electron, wave functions of electrons overlap each other between adjacent $Al_xGa_{1-x}N$ layers, and in consequence, it becomes a form that a united electronic state exists in the whole stacked structure.

When, for example, a very thin film thickness of InAlGaN layer is used as this barrier layer, as described above, sheet-like polarized charges are induced in interfaces of the very thin film thickness of InAlGaN layer and $Al_xGa_{1-x}N$ layer, that is, two interfaces, but when the two are totaled, polarized charges are in a sheet in a state corresponding to:

$$\sigma(P) = \{P(x(z)) - P(InAlGaN)\} + \{P(InAlGaN) - P(x(z+\delta z))\} = \{P(x(z)) - P(x(z+\delta z))\}$$

In such a case, effectual polarized charge density becomes $\sigma(P)/\delta z = \{P(x(z)) - P(x(z+\delta z))\}/\delta z = -\{P(x(z+\delta z)) - P(x(z))\}/\delta x(z) \cdot \delta x(z)/\delta z$, and when thickness step Δz is small enough, it becomes substantially within difference from a value in the above-mentioned differentiation notation.

That is, as $Al_xGa_{1-x}N$ which forms it as the undoped AlGaN buffer layer 3, instead of a form that Al composition x(z) reduces continuously, for example, like $Al_xGa_{1-x}N$/InAlGaN, it is also possible to use the periodic potential structure in which conduction band edge energy difference; $\Delta E_C(InAlGaN/Al_xGa_{1-x}N)$ between both interfaces of the InAlGaN and $Al_xGa_{1-x}N$ becomes $\Delta E_C(InAlGaN/Al_xGa_{1-x}N) > 0$, and which has a potential barrier. In such a case, suppose that interval Lp (=δz+δB) of the period of the periodic potential structure is a sufficiently narrow film thickness.

When adopting this periodic potential structure, among InAlGaN which can grow epitaxially with an $Al_xGa_{1-x}N$ layer mutually, it is desirable to select a material ($M_{barrier}$) of the barrier layer combined with the $Al_xGa_{1-x}N$ layer so that conduction band edge energy difference; $\Delta E_C(InAlGaN/Al_xGa_{1-x}N)$ between both interfaces of the InAlGaN and $Al_xGa_{1-x}N$ may become $\Delta E_C(InAlGaN/Al_xGa_{1-x}N) > 0$ and, in addition, is the lattice constant a of InAlGaN (InAlGaN) and lattice constant a(InAlGaN) of the InAlGaN may become a(AlGaN(x(z+δz)))>a(InAlGaN)>a(AlGaN(x(z))) with lattice constants a(AlGaN(x(z))) and a(AlGaN (x(z+δz))) of the $Al_xGa_{1-x}N$ layer. That is, it is desirable that strain caused by an increase of a lattice constant with a change of Al composition x(z) of the $Al_xGa_{1-x}N$ layer is made to be substantially no difference from the form that Al composition x(z) reduces continuously.

When the buffer structure which forms this periodic potential structure (or superstructure) is adopted, many barrier layers function as barriers to the electron injection from GaN channel layer 4 to the buffer layer, and a higher suppressing effect is obtained. In addition, an extremely high buffer layer break-down voltage can be expected because of a strong carrier fixing effect by many barrier layers.

In addition, also when selecting the construction of the AlGaN electron supply layer/$In_yGa_{1-y}N$ channel layer/InAlGaN channel back barrier layer/buffer layer/AlN nucleation layer/substrate (where, 1>y≥0) which adopts the structure where the $Al_xGa_{1-x}N$ layer and InAlGaN channel back barrier layer are stacked by turns as the "Al composition modulated" buffer layer described in this exemplary embodiment, regarding the AlGaN electron supply layer/$In_yGa_{1-y}N$ channel layer, "various conditions" used when selecting the construction of the AlGaN electron supply layer/GaN channel layer/buffer layer/AlN nucleation layer/substrate which adopts the "Al composition modulated" AlGaN layer (buffer layer) described in the above first exemplary embodiment are completely applicable in a similar manner.

INDUSTRIAL APPLICABILITY

The construction of the multilayered epitaxial film and the field effect transistor according to the present invention enables to suppress the device performance degradation due to the short gate effect when applied to a high frequency FET operable at a high voltage, such as a GaN-type FET for millimeter wave or submillimeter wave band, which requires good high frequency performance.

The invention claimed is:
1. A multilayered epitaxial film epitaxial grown on a substrate, which is usable in fabrication of a field-effect transistor, characterized in that
   the multilayered epitaxial film is formed out of compound semiconductors which exhibit spontaneous polarization and piezo polarization effects, or semiconductor alloys thereof, and comprises layered structure in which a heterojunction that is made up of an electron supply layer and a channel layer is formed on a buffer layer;
   the multilayered epitaxial film optionally comprises a barrier layer between the channel layer and the buffer layer;
   said buffer layer comprises a region made up of a semiconductor material whose composition monotonically changes along a direction from a substrate surface to the channel layer, wherein the composition of the semiconductor material is selected so that energy of a conduction band edge of the semiconductor material in the region reduces monotonically;
   the composition of the semiconductor material in the region is selected so that the energy of the conduction band edge of the semiconductor material in the region is higher in comparison with the energy of the conduction band edge of the semiconductor material which makes up of the channel layer at an interface between the region and the channel layer or between the barrier layer and the channel layer; and the energy of the conduction band edge in the region exhibits a shape convex toward a side where electronic energy is higher, along a direction from the substrate surface to the channel layer, wherein the substrate has high resistance, the substrate is selected from the group consisting of C plane of 6H—SiC substrate, C plane of 4H—SiC substrate and a (111) plane of 3C—SiC substrate, the compound semiconductors which exhibit spontaneous polarization and piezo polarization effects, or semiconductor alloys thereof are group III nitride-type compound semiconductors or semiconductor alloys thereof that are grown in the C axis on the substrate, the multilayered epitaxial film further comprises an AlN nucleation layer between the buffer layer and the substrate, the AlN nucleation layer is an insulating AlN layer, the AlN nucleation layer is grown in the C axis on the substrate, the channel layer, the buffer layer and the barrier layer are un-doped, and discontinuity $\Delta E_C$ of conduction band energy at the interface between the channel layer and the buffer layer or between the channel layer and the barrier layer is selected at least $\Delta E_c > 2$ kT, where k denotes a Boltzmann's constant and T denotes temperature of about 300K.

2. The multilayered epitaxial film according to claim 1, wherein the channel layer is formed of GaN, InGaN, or $(In_v Al_{1-v})_w Ga_{1-w}N$ (where, $1 \geq v \geq 0$ and $1 \geq w \geq 0$), the electron supply layer is formed of AlGaN, InAlN, or $In_y Al_x Ga_{1-x-y}N$ (where, x and y are 0 or positive values, and $1 \geq x+y \geq 0$), the buffer layer is formed of AlGaN, InAlN, or $In_y Al_x Ga_{1-x-y}N$ (where, x and y are 0 or positive values, and $1 \geq x+y \geq 0$), and a composition change of semiconductor material in the region is set such that Al composition is monotonically reduced or In composition is monotonically increased along a direction from the substrate surface to the channel layer.

3. The multilayered epitaxial film according to claim 2, wherein the multilayered epitaxial film comprises the barrier layer between the channel layer and the buffer layer, wherein the barrier layer is formed of InAlGaN, or $(In_v Al_{1-v})_w Ga_{1-w}N$ (where, $1 \geq v \geq 0$ and $1 \geq w \geq 0$), and energy of a conduction band edge of the group III nitride-type semiconductor material which forms the barrier layer is higher than energy of a conduction band edge of the III group nitride-type semiconductor material which forms the channel layer in contact with the barrier layer, and higher than energy of a conduction band edge of the group III nitride-type semiconductor material which forms the buffer layer at an interface between the buffer layer and the barrier layer.

4. The multilayered epitaxial film according to claim 2, wherein a composition change of the semiconductor material in the region is formed in such a shape that the composition changes continuously or changes step-wise.

5. The multilayered epitaxial film according to claim 1, wherein a total amount of positive space charges generated in the electron supply layer is equal to or more than a total amount of negative space charges generated in the buffer layer and at an interface between the buffer layer and the channel layer or between the barrier layer and the channel layer.

6. A field-effect transistor fabricated using a multilayered epitaxial film epitaxial grown on a substrate, characterized in that the multilayered epitaxial film is formed out of compound semiconductors which exhibit spontaneous polarization and piezo polarization effects, or semiconductor alloys thereof, and comprises layered structure in which a heterojunction which is made up of an electron supply layer and a channel layer is formed on a buffer layer;

the multilayered epitaxial film optionally comprises a barrier layer between the channel layer and the buffer layer;

the buffer layer comprises a region made up of a semiconductor material whose composition monotonically changes along a direction from a substrate surface to the channel layer, wherein the composition of the semiconductor material is selected so that energy of a conduction band edge of the semiconductor material in the region reduces monotonically;

composition of the semiconductor material in the region is selected so that energy of the conduction band edge of the semiconductor material in the region is higher in comparison with the energy of the conduction band edge of the semiconductor material which makes up of the channel layer at an interface between the region and the channel layer or between the barrier layer and the channel layer; and the energy of the conduction band edge in the region exhibits a shape convex toward a side where electronic energy is higher, along a direction from the substrate surface to the channel layer, wherein the substrate has high resistance, the substrate is selected from the group consisting of C plane of 6H—SiC substrate, C plane of 4H—SiC substrate and a (111) plane of 3C—SiC substrate, the compound semiconductors which exhibit spontaneous polarization and piezo polarization effects, or semiconductor alloys thereof are group III nitride-type compound semiconductors or semiconductor alloys thereof that are grown in the C axis on the substrate, the multilayered epitaxial film further comprises an AlN nucleation layer between the buffer layer and the substrate, the AlN nucleation layer is an insulating AlN layer, the AlN nucleation layer is grown in the C axis on the substrate, the channel layer, the buffer layer and the barrier layer are un-doped, and discontinuity $\Delta E_C$ of conduction band energy at the interface between the channel layer and the buffer layer or between the channel layer and the barrier layer is selected at least $\Delta E_c > 2$ kT, where k denotes a Boltzmann's constant and T denotes temperature of about 300K.

7. The field-effect transistor according to claim 6, wherein a gate electrode is provided on the electron supply layer, and an aspect ratio Lg/a of an active layer thickness a which is defined as a total of a film thickness of the electron supply layer and a film thickness of the channel layer under the gate electrode, to a gate length Lg fulfills $Lg/a \geq 5$.

8. The field-effect transistor according to claim 6, wherein the channel layer is formed of GaN, InGaN, or $(In_v Al_{1-v})_w Ga_{1-w}N$ (where, $1 \geq v \geq 0$ and $1 \geq w \geq 0$), the electron supply layer is formed of AlGaN, InAlN, or In$_y$Al$_x$Ga$_{1-x-y}$N (where, x and y are 0 or positive values, and 1≥x+y≥0), the buffer layer is formed of AlGaN, InAlN, or In$_y$Al$_x$Ga$_{1-x-y}$N (where, x and y are 0 or positive values, and 1≥x+y≥0), and a composition change of semiconductor material in the region is set such that Al composition is monotonically reduced or In composition is monotonically increased along a direction from the substrate surface to the channel layer.

9. The field-effect transistor according to claim 8, wherein the multilayered epitaxial film comprises the barrier layer between the channel layer and the buffer layer, wherein the barrier layer is formed of InAlGaN, or (In$_v$Al$_{1-v}$)$_w$Ga$_{1-w}$N (where, 1≥v≥0 and 1≥w≥0), and energy of a conduction band edge of the group III nitride-type semiconductor material which forms the barrier layer is higher than energy of a conduction band edge of the III group nitride-type semiconductor material which forms the channel layer in contact with the barrier layer, and higher than energy of a conduction band edge of the group III nitride-type semiconductor material which forms the buffer layer at an interface between the buffer layer and the barrier layer.

10. The multilayered epitaxial film according to claim 2, wherein the buffer layer is formed of Al$_x$Ga$_{1-x}$N (where, x is 1≥x≥0), and Al composition x is monotonically reduced along a direction from the substrate surface to the channel layer, and a rate of change: $|\partial x(z)/\partial z|$ of the Al composition x in a direction from the substrate surface to the channel layer (Z direction) is selected within a range of 0.30 μm$^{-1}$≥$|\partial x(z)/\partial z|$≥0.05 μm$^{-1}$; and the Al composition xb of Al$_x$Ga$_{1-x}$N (where, x is 1≥x≥0) at an interface between the AlN nucleation layer and the buffer layer is selected in the range of 0.35≥xb≥0.05.

11. The field-effect transistor according to claim 8, wherein the buffer layer is formed of Al$_x$Ga$_{1-x}$N (where, x is 1≥x≥0), and Al composition x is monotonically reduced along a direction from the substrate surface to the channel layer, and a rate of change: $|\partial x(z)/\partial z|$ of the Al composition x in a direction from the substrate surface to the channel layer (Z direction) is selected within a range of 0.30 μm$^{-1}$≥$|\partial x(z)/\partial z|$ 0.05 μm$^{-1}$; and the Al composition xb of Al$_x$Ga$_{1-x}$N (where, x is 1≥x≥0) at an interface between the AlN nucleation layer and the buffer layer is selected in the range of 0.35≥xb≥0.05.

12. A multilayered epitaxial film epitaxial grown on a substrate, which is usable in fabrication of a field-effect transistor, characterized in that the multilayered epitaxial film is formed out of compound semiconductors which exhibit spontaneous polarization and piezo polarization effects, or semiconductor alloys thereof;

the spontaneous polarization and piezo polarization effects exhibited in the compound semiconductors or the semiconductor alloy thereof continuously changes in magnitude with composition change of the semiconductor material;

the multilayered epitaxial film comprises layered structure in which a heterojunction which is made up of an electron supply layer and a channel layer is formed on a buffer layer, and electrons are accumulated two-dimensionally at a heterojunction interface of the electron supply layer and the channel layer;

the multilayered epitaxial film optionally comprises a barrier layer between the channel layer and the buffer layer;

the buffer layer is made up of semiconductor material whose composition monotonically changes from a substrate surface along a direction from the substrate surface to the channel layer;

in the semiconductor material whose composition monotonically changes, which forms the buffer layer, the composition change is set such that it changes continuously or changes step-wise by fine film thickness steps;

in the semiconductor material whose composition monotonically changes, which forms the buffer layer, composition of the semiconductor material which is used to form the buffer layer at an interface between the buffer layer and the channel layer or between the buffer layer and the barrier layer is selected so that energy of a conduction band edge of the semiconductor material having said composition is higher in comparison with energy of a conduction band edge of the semiconductor material which forms the channel layer;

in the semiconductor material whose composition monotonically changes, which forms the buffer layer, the monotonic composition change of the semiconductor material which is used to form the buffer layer along a direction from the substrate surface to the channel layer is selected so that energy of a conduction band edge of the semiconductor material whose composition monotonically changes is monotonically reduced along a direction from the substrate surface to the channel layer;

as a result of the selected composition change along the direction from the substrate surface to the channel layer, polarization obtained by totaling spontaneous polarization and piezo polarization exhibited in the semiconductor material whose composition monotonically changes, which forms the buffer layer, monotonically changes along a direction from the substrate surface to the channel layer, and the resulted change of the polarization causes negative polarized charges to be generated in the semiconductor material whose composition monotonically changes, which forms the buffer layer;

as a result of the generated negative polarized charges, in the semiconductor material whose composition monotonically changes, which forms the buffer layer, energy of a conduction band edge of such region monotonically reduces while exhibiting a shape convex toward a side where electronic energy is higher, along a direction from the substrate surface to the channel layer; and a film thickness of the channel layer is selected to be five or less times of a de Broglie wavelength of electrons accumulated two-dimensionally in the channel layer, wherein the substrate has high resistance, the substrate is selected from the group consisting of C plane of 6H—SiC substrate, C plane of 4H—SiC substrate and a (111) plane of 3C—SiC substrate, the compound semiconductors which exhibit spontaneous polarization and piezo polarization effects, or semiconductor alloys thereof are group III nitride-type compound semiconductors or semiconductor alloys thereof that are grown in the C axis on the substrate, the multilayered epitaxial film further comprises an AlN nucleation layer between the buffer layer and the substrate, the AlN nucleation layer is an insulating AlN layer, the AlN nucleation layer is grown in the C axis on the substrate, the channel layer, the buffer layer and the barrier layer are un-doped, and discontinuity $\Delta E_C$ of conduction band energy at the interface between the channel layer and the buffer layer or between the channel layer and the barrier layer is selected at least $\Delta E_c > 2$ kT, where k denotes a Boltzmann's constant and T denotes temperature of about 300K.

13. The multilayered epitaxial film according to claim 12, wherein in the multilayered epitaxial film, as to a heterojunction which is made up of the electron supply layer and the channel layer, the channel layer is formed of GaN, InGaN, or a group III nitride-type semiconductor material expressed in $(In_vAl_{1-v})_wGa_{1-w}N$ (where, $1 \geq v \geq 0$ and $1 \geq w \geq 0$), and the electron supply layer is made up of AlGaN, an InAlN layer, or a group III nitride-type semiconductor material expressed as $In_yAl_xGa_{1-x-y}N$ (where, x and y are 0 or positive values, and are $1 \geq x+y \geq 0$), and is selected so that energy of a conduction band edge of the group III nitride-type semiconductor material which forms the electron supply layer is higher than energy of a conduction band edge of the group III nitride-type semiconductor material which forms the channel layer, at an interface between the buffer layer and the channel layer, to form the heterojunction which has an energy barrier resulting from difference in the energy of the conduction band edge at the interface;

the buffer layer is formed of AlGaN, InAlN, or a group III nitride-type semiconductor material expressed as $In_yAl_xGa_{1-x-y}N$ (where, x and y are 0 or positive values, and $1 \geq x+y \geq 0$), and, at an interface between the buffer layer and the channel layer, composition of the group III nitride-type semiconductor material which forms the buffer layer is selected so that energy of a conduction band edge of the group III nitride-type semiconductor material of the composition is higher than energy of a conduction band edge of the group III nitride-type semiconductor material which forms the channel layer, to form a heterojunction which has an energy barrier resulting from difference in the energy of the conduction band edge at the interface; and in the group III nitride-type semiconductor material whose composition monotonically changes, which forms the buffer layer, the monotonic composition change of the group III nitride-type semiconductor material which is used to form the buffer layer along a direction from the substrate surface to the channel layer is provided by any of a composition change of Al composition being monotonically reduced along the direction from the substrate surface to the channel layer, and a composition change of In composition being monotonically increased along the direction from the substrate surface to the channel layer.

14. The multilayered epitaxial film according to claim 12, wherein the multilayered epitaxial film comprises layered structure in which a heterojunction, which is made up of the electron supply layer and the channel layer, is formed on the buffer layer with the barrier layer intervening therebeween, and electrons are accumulated two-dimensionally at the heterojunction interface of the electron supply layer and the channel layer;

in the multilayered epitaxial film, as to the heterojunction which is made up of the electron supply layer and the channel layer, the channel layer is formed of GaN, InGaN, or a group III nitride-type semiconductor material expressed in $(In_vAl_{1-v})_wGa_{1-w}N$ (where, $1 \geq v \geq 0$ and $1 \geq w \geq 0$), and the electron supply layer is made up of AlGaN, an InAlN layer, or a group III nitride-type semiconductor material expressed as $In_yAl_xGa_{1-x-y}N$ (where, x and y are 0 or positive values, and are $1 \geq x+y \geq 0$), and is selected so that energy of a conduction band edge of the group III nitride-type semiconductor material which forms the electron supply layer is higher than energy of a conduction band edge of the group III nitride-type semiconductor material which forms the channel layer, at an interface between the electron supply layer and the channel layer, to form the heterojunction which has an energy barrier resulting from difference in the energy of the conduction band edge at the interface;

the barrier layer intervenes between the channel layer and buffer layer, and is formed of InAlGaN, or a group III nitride-type semiconductor material expressed by $(In_vAl_{1-v})_wGa_{1-w}N$ (where, $1 \geq v \geq 0$ and $1 \geq w \geq 0$), and is selected so that energy of a conduction band edge of the group III nitride-type semiconductor material which forms the barrier layer is higher than energy of a conduction band edge of the group III nitride-type semiconductor material which forms the channel layer in contact with the barrier layer, and energy of a conduction band edge of the group III nitride-type semiconductor material which forms the barrier layer is higher than energy of a conduction band edge of the group III nitride-type semiconductor material which forms the buffer layer at an interface between the buffer layer and the barrier layer, to form a heterojunction which has an energy barrier resulting from difference in the energy of the conduction band edge at the interface;

the buffer layer is formed of AlGaN, InAlN, or a group III nitride-type semiconductor material expressed as $In_yAl_xGa_{1-x-y}N$ (where, x and y are 0 or positive values, and $1 \geq x+y \geq 0$), and, at an interface between the buffer layer and the channel layer, composition of the group III nitride-type semiconductor material which forms the buffer layer is selected so that energy of a conduction band edge of the group III nitride-type semiconductor material of the composition is higher than energy of a conduction band edge of the group III nitride-type semiconductor material which forms the channel layer; and in the group III nitride-type semiconductor material whose composition monotonically changes, which forms the buffer layer, the monotonic composition change of the group III nitride-type semiconductor material which is used to form the buffer layer along a direction from the substrate surface to the channel layer is provided by any of a composition change of Al composition being monotonically reduced along the direction from the substrate surface to the channel layer, and a composition change of In composition being monotonically increased along the direction from the substrate surface to the channel layer.

15. A field-effect transistor fabricated using a multilayered epitaxial film epitaxial grown on a substrate, characterized in that the multilayered epitaxial film is formed out of compound semiconductors which exhibit spontaneous polarization and piezo polarization effects, or semiconductor alloys thereof, the spontaneous polarization and piezo polarization effects exhibited in the compound semiconductors or semiconductor alloys thereof continuously change in magnitude with composition change of the semiconductor material, the multilayered epitaxial film comprises layered structure in which a heterojunction which is made up of an electron supply layer and a channel layer is formed on the buffer layer, and thereby electrons are accumulated two-dimensionally at a heterojunction interface of the electron supply layer and the channel layer;

the multilayered epitaxial film optionally comprises a barrier layer between the channel layer and the buffer layer;

the buffer layer is made up of semiconductor material whose composition monotonically changes from a substrate surface along a direction from the substrate surface to the channel layer;

in the semiconductor material whose composition monotonically changes, which forms the buffer layer, the composition change is set such that it changes continuously or changes step-wise by fine film thickness steps;

in the semiconductor material whose composition monotonically changes, which forms the buffer layer, the composition of the semiconductor material which is used to form the buffer layer at an interface between the buffer layer and the channel layer or between the buffer layer and the barrier layer is selected so that energy of a conduction band edge of the semiconductor material which comprises the composition is higher in comparison with energy of a conduction band edge of the semiconductor material which forms the channel layer;

in the semiconductor material whose composition monotonically changes, which forms the buffer layer, the monotonic composition change of the semiconductor material which is used to form the buffer layer along a direction from the substrate surface to the channel layer is selected so that energy of a conduction band edge of the semiconductor material whose composition monotonically changes is monotonically reduced along a direction from the substrate surface to the channel layer;

as a result of the selected composition change along the direction from the substrate surface to the channel layer, polarization obtained by totaling spontaneous polarization and piezo polarization exhibited in the semiconductor material, which forms the buffer layer and whose composition monotonically changes, monotonically changes along a direction from the substrate surface to the channel layer, the change of the polarization causes negative polarized charges to be generated in the semiconductor material which forms the buffer layer and whose composition monotonically changes;

as a result of the generated negative polarized charges, in the semiconductor material whose composition monotonically changes, which forms the buffer layer, energy of a conduction band edge of such region monotonically reduces while exhibiting a shape convex toward a side where electronic energy is higher, along a direction from the substrate surface to the channel layer;

a gate electrode of the field-effect transistor is provided on the electron supply layer, and an aspect ratio Lg/a of an active layer thickness a which is defined as a total of a film thickness of the electron supply layer and a film thickness of the channel layer under the gate electrode, to a gate length Lg fulfills Lg/a≥5; and a film thickness of the channel layer is selected to be five or less times of a de Broglie wavelength of electrons accumulated two-dimensionally in the channel layer, wherein the substrate has high resistance, the substrate is selected from the group consisting of C plane of 6H—SiC substrate, C plane of 4H—SiC substrate and a (111) plane of 3C—SiC substrate, the compound semiconductors which exhibit spontaneous polarization and piezo polarization effects, or semiconductor alloys thereof are group III nitride-type compound semiconductors or semiconductor alloys thereof that are grown in the C axis on the substrate, the multilayered epitaxial film further comprises an AlN nucleation layer between the buffer layer and the substrate, the AlN nucleation layer is an insulating AlN layer, the AlN nucleation layer is grown in the C axis on the substrate, the channel layer, the buffer layer and the barrier layer are un-doped, and discontinuity $\Delta E_C$ of conduction band energy at the interface between the channel layer and the buffer layer or between the channel layer and the barrier layer is selected at least $\Delta E_c > 2$ kT, where k denotes a Boltzmann's constant and T denotes temperature of about 300K.

16. The field-effect transistor according to claim 15, wherein in the multilayered epitaxial film, as to the heterojunction which is made up of the electron supply and the channel layer, the channel layer is formed of GaN, InGaN, or a group III nitride-type semiconductor material expressed in $(In_vAl_{1-v})_wGa_{1-w}N$ (where, 1≥v≥0 and 1≥w≥0), and the electron supply layer is made up of AlGaN, an InAlN layer, or a group III nitride-type semiconductor material expressed as $In_yAl_xGa_{1-x-y}N$ (where, x and y are 0 or positive values, and are 1≥x+y≥0), and is selected so that energy of a conduction band edge of the group III nitride-type semiconductor material which forms the electron supply layer is higher than energy of a conduction band edge of the group III nitride-type semiconductor material which forms the channel layer, at an interface with the channel layer, to form the heterojunction which has an energy barrier resulting from difference in the energy of the conduction band edge at the interface;

the buffer layer is formed of AlGaN, InAlN, or a group III nitride-type semiconductor material expressed as $In_yAl_xGa_{1-x-y}N$ (where, x and y are 0 or positive values, and 1≥x+y≥0), and, at an interface between the buffer layer and the channel layer, composition of the group III nitride-type semiconductor material which forms the buffer layer is selected so that energy of a conduction band edge of the group III nitride-type semiconductor material of the composition is higher than energy of a conduction band edge of the group III nitride-type semiconductor material which forms the channel layer, to form a heterojunction which has an energy barrier resulting from difference in the energy of the conduction band edge at the interface; and in the group III nitride-type semiconductor material whose composition monotonically changes, which forms the buffer layer, its composition change along a direction from the substrate surface to the channel layer is provided by any of a composition change of Al composition being monotonically reduced along the direction from the substrate surface to the channel layer, and a composition change of In composition being monotonically increased along the direction from the substrate surface to the channel layer.

17. The field-effect transistor according to claim 15, wherein
the multilayered epitaxial film comprises layered structure in which a heterojunction which is made up of the electron supply layer and the channel layer formed on the buffer layer with the barrier layer intervening therebetween, and thereby electrons are accumulated two-dimensionally at a heterojunction interface of the electron supply layer and the channel layer;
in the multilayered epitaxial film,
as to the heterojunction which is made up of the electron supply layer and the channel layer,
the channel layer is formed of GaN, InGaN, or a group III nitride-type semiconductor material expressed in $(In_vAl_{1-v})_wGa_{1-w}N$ (where, $1 \geq v \geq 0$ and $1 \geq w \geq 0$), and the electron supply layer is made up of AlGaN, an InAlN layer, or a group III nitride-type semiconductor material expressed as $In_yAl_xGa_{1-x-y}N$ (where, x and y are 0 or positive values, and are $1 \geq x+y \geq 0$), and is selected so that energy of a conduction band edge of the group III nitride-type semiconductor material which forms the electron supply layer is higher than energy of a conduction band edge of the group III nitride-type semiconductor material which forms the channel layer, at an interface with the channel layer, to form the heterojunction which has an energy barrier resulting from difference in the energy of the conduction band edge at the interface;
the barrier layer intervenes between the channel layer and buffer layer, and is formed of In AlGaN, or a group III nitride-type semiconductor material expressed by $(In_vAl_{1-v})_wGa_{1-w}N$ (where, $1 \geq v \geq 0$ and $1 \geq w \geq 0$), and is selected so that energy of a conduction band edge of the group III nitride-type semiconductor material which forms the barrier layer is higher than energy of a conduction band edge of the group III nitride-type semiconductor material which forms the channel layer in contact with the barrier layer, and energy of a conduction band edge of the group III nitride-type semiconductor material which forms the barrier layer is higher than energy of a conduction band edge of the group III nitride-type semiconductor material which forms the buffer layer at an interface with the barrier layer, to form a heterojunction which has an energy barrier resulting from difference in the energy of the conduction band edge at the interface;
the buffer layer is formed of AlGaN, InAlN, or a group III nitride-type semiconductor material expressed as $In_yAl_xGa_{1-x-y}N$ (where, x and y are 0 or positive values, and $1 \geq x+y \geq 0$), and, at an interface with the barrier layer, composition of the group III nitride-type semiconductor material which forms the buffer layer is selected so that energy of a conduction band edge of the group III nitride-type semiconductor material of the composition is higher than energy of a conduction band edge of the group III nitride-type semiconductor material which forms the channel layer; and
in the group III nitride-type semiconductor material whose composition monotonically changes, which forms the buffer layer, the monotonic composition change of the group III nitride-type semiconductor material which is used to form the buffer layer along a direction from the substrate surface to the channel layer is provided by any of a composition change of Al composition being monotonically reduced along the direction from the substrate surface to the channel layer, and a composition change of In composition being monotonically increased along the direction from the substrate surface to the channel layer.

18. The multilayered epitaxial film according to claim 13, wherein
the group III nitride-type semiconductor material whose composition monotonically changes, which forms the buffer layer, is formed of a group III nitride-type semiconductor material expressed as $Al_xGa_{1-x}N$ (where, x is $1 \geq x \geq 0$);
the composition change along the direction from the substrate surface to the channel layer exhibited in the group III nitride-type semiconductor material, whose composition monotonically changes, is provided by a composition change of Al composition x being monotonically reduced along the direction from the substrate surface to the channel layer,
a rate of change: $|\partial x(z)/\partial z|$ of the Al composition x in a direction from the substrate surface to the channel layer (Z direction) is selected within a range of $0.30\ \mu m^{-1} \geq |\partial x(z)/\partial z|\ 0.05\ \mu m^{-1}$; and
the Al composition xb of $Al_xGa_{1-x}N$ (where, x is $1 \geq x \geq 0$) at an interface between the AlN nucleation layer and the buffer layer is selected in the range of $0.35 \geq xb \geq 0.05$.

19. The multilayered epitaxial film according claim 14, wherein
the group III nitride-type semiconductor material whose composition monotonically changes, which forms the buffer layer, is formed of a group III nitride-type semiconductor material expressed as $Al_xGa_{1-x}N$ (where, x is $1 \geq x \geq 0$),
the composition change along the direction from the substrate surface to the channel layer exhibited in the group III nitride-type semiconductor material, whose composition monotonically changes, is provided by a composition change of Al composition x being monotonically reduced along the direction from the substrate surface to the channel layer,
a rate of change: $|\partial x(z)/\partial z|$ of the Al composition x in a direction from the substrate surface to the channel layer (Z direction) is selected within a range of $0.30\ \mu m^{-1} \geq |\partial x(z)/\partial z|\ 0.05\ \mu m^{-1}$; and
the Al composition xb of $Al_xGa_{1-x}N$ (where, x is $1 \geq x \geq 0$) at an interface between the AlN nucleation layer and the buffer layer is selected in the range of $0.35 \geq xb \geq 0.05$.

20. The multilayered epitaxial film according to claim 16, wherein
the group III nitride-type semiconductor material whose composition monotonically changes, which forms the buffer layer, is formed of a group III nitride-type semiconductor material expressed as $Al_xGa_{1-x}N$ (where, x is $1 \geq x \geq 0$),
the composition change along the direction from the substrate surface to the channel layer exhibited in the group III nitride-type semiconductor material, whose composition monotonically changes, is provided by a composition change of Al composition x being monotonically reduced along the direction from the substrate surface to the channel layer,
a rate of change: $|\partial x(z)/\partial z|$ of the Al composition x in a direction from the substrate surface to the channel layer (Z direction) is selected within a range of $0.30\ \mu m^{-1} \geq |\partial x(z)/\partial z|\ 0.05\ \mu m^{-1}$; and
the Al composition xb of $Al_xGa_{1-x}N$ (where, x is $1 \geq x \geq 0$) at an interface between the AlN nucleation layer and the buffer layer is selected in the range of $0.35 \geq xb \geq 0.05$.

21. The multilayered epitaxial film according claim 17, wherein
- the group III nitride-type semiconductor material whose composition monotonically changes, which forms the buffer layer, is formed of a group III nitride-type semiconductor material expressed as $Al_xGa_{1-x}N$ (where, x is $1 \geq x \geq 0$),
- the composition change along the direction from the substrate surface to the channel layer exhibited in the group III nitride-type semiconductor material, whose composition monotonically changes, is provided by a composition change of Al composition x being monotonically reduced along the direction from the substrate surface to the channel layer,
- a rate of change: $|\partial x(z)/\partial z|$ of the Al composition x in a direction from the substrate surface to the channel layer (Z direction) is selected within a range of $0.30\ \mu m^{-1} \geq |\partial x(z)/\partial z|\ 0.05\ \mu m^{-1}$; and
- the Al composition xb of $Al_xGa_{1-x}N$ (where, x is $1 \geq x \geq 0$) at an interface between the AlN nucleation layer and the buffer layer is selected in the range of $0.35 \geq xb \geq 0.05$.

* * * * *